(12) United States Patent
Jiang et al.

(10) Patent No.: US 12,302,562 B2
(45) Date of Patent: May 13, 2025

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Yu-Wei Jiang, Hsinchu (TW); Sheng-Chih Lai, Hsinchu County (TW); Kuo-Chang Chiang, Hsinchu (TW); Hung-Chang Sun, Kaohsiung (TW); Tsuching Yang, Taipei (TW); Feng-Cheng Yang, Hsinchu County (TW); Chung-Te Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 154 days.

(21) Appl. No.: 17/460,100

(22) Filed: Aug. 27, 2021

(65) Prior Publication Data

US 2023/0066393 A1    Mar. 2, 2023

(51) Int. Cl.
*H10B 43/27*    (2023.01)

(52) U.S. Cl.
CPC .................................. *H10B 43/27* (2023.02)

(58) Field of Classification Search
CPC ......... H01L 27/11556; H01L 27/11582; H01L 29/66833; H01L 29/4234
See application file for complete search history.

(56) References Cited

U.S. PATENT DOCUMENTS

| 2014/0291752 | A1* | 10/2014 | Liu | H01L 29/66825 |
| | | | | 438/287 |
| 2016/0071861 | A1* | 3/2016 | Serov | H10B 43/10 |
| | | | | 438/257 |
| 2021/0175253 | A1* | 6/2021 | Han | H01L 29/40111 |
| 2023/0026774 | A1* | 1/2023 | Hwang | H10B 43/27 |
| 2023/0033311 | A1* | 2/2023 | Yang | H01L 23/562 |

FOREIGN PATENT DOCUMENTS

KR    101362219 B1 *    2/2014    ......... H01L 27/0688

\* cited by examiner

*Primary Examiner* — Vu A Vu
*Assistant Examiner* — Valerie N Newton
(74) *Attorney, Agent, or Firm* — WPAT LAW; Anthony King

(57) ABSTRACT

A method includes forming a plurality of memory cells, which includes a plurality of first conductive lines over a substrate, charge-trapping layers coupled to the conductive lines, channel layers arranged adjacent to the charge-trapping layers, and a plurality of first filling regions arranged between the channel layers; etching the first filling regions to form first trenches; depositing a liner over upper surfaces of the charge-trapping layers and the channel layers and sidewalls of the first trenches; forming second filling regions in the first trenches; patterning the second filling regions to form second trenches; depositing a partition region in each of the second trenches; and removing the liner to expose the charge-trapping layers and the channel layers.

20 Claims, 59 Drawing Sheets

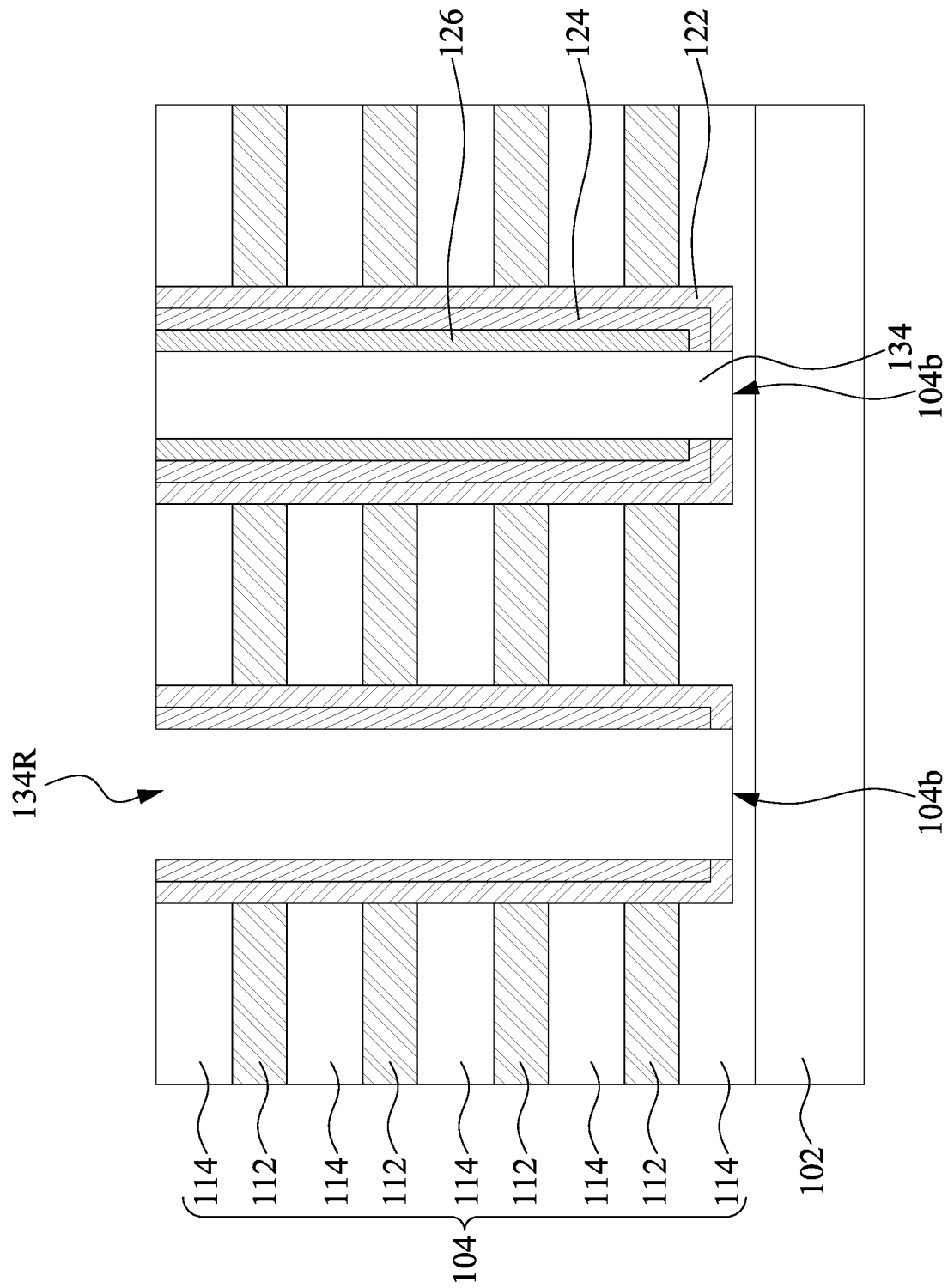

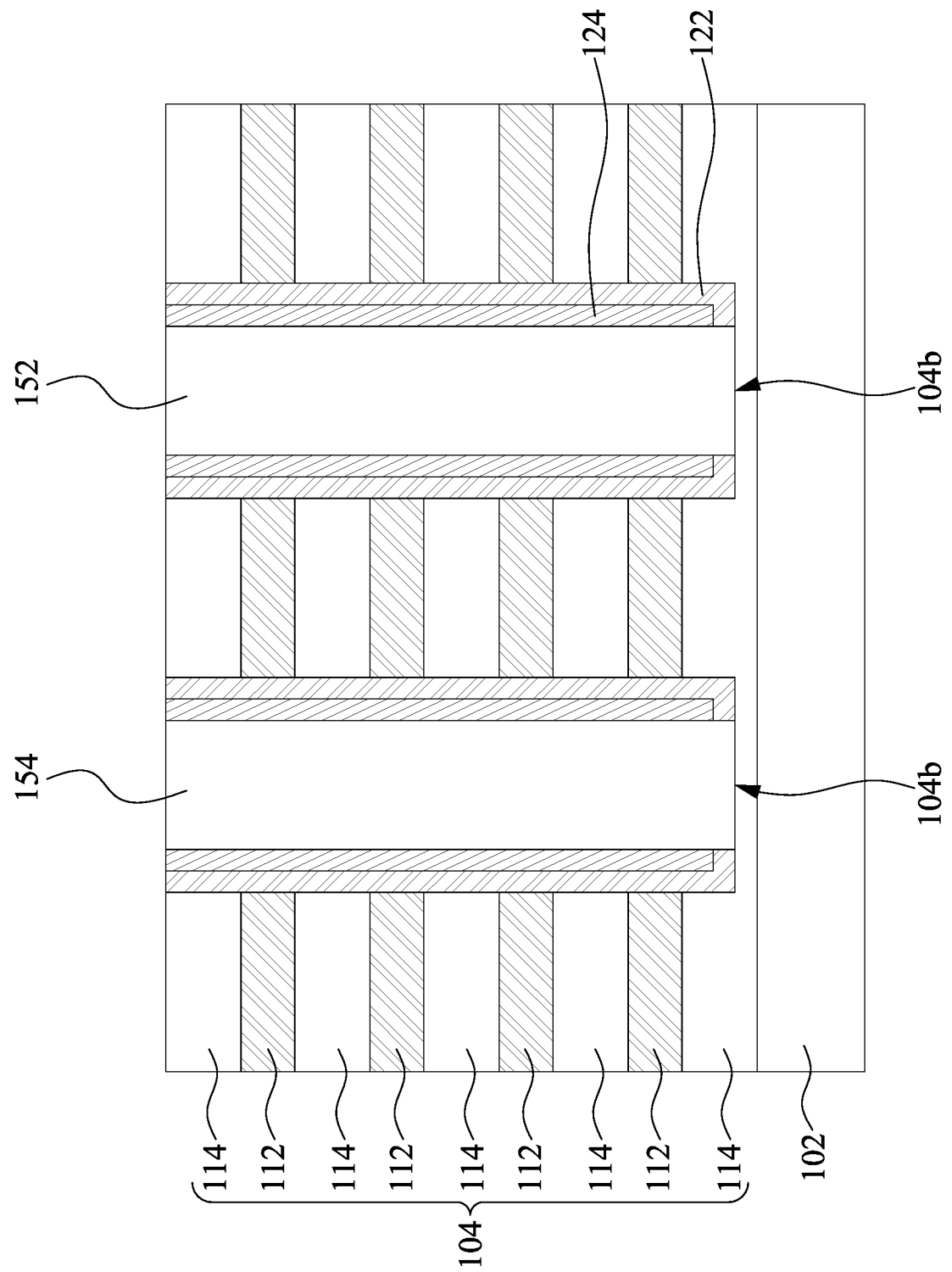

SEMICONDUCTOR STRUCTURE AND METHOD OF FORMING THE SAME

BACKGROUND

Non-volatile memory (NVM) is often used in various devices, such as consumer electronic devices and portable devices. NVM is a type of memory storage that can retain data even while it is not powered on. NVM may be electrically addressed or mechanically addressed. Examples of electrically addressed NVM include flash memory, EPROMs, and EEPROMs. Functionality of NVM includes having information programmed into it, having information read from it, and/or having information erased from it. Charges are tunneled into or released from a charge-storage layer of the NVM during a write operation. Different characteristics of the charge-storage layer according to the charges may be read out as different logic states during a read operation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 9A, 9B and 9C are a perspective view, a top view and a cross-sectional view, respectively, of an intermediate stage of a method of manufacturing a semiconductor structure, in accordance with some embodiments.

FIGS. 18A, 18B, 18C and 18D are a perspective view, a top view and two cross-sectional views, respectively, of an intermediate stage of a method of manufacturing a semiconductor structure, in accordance with some embodiments.

DETAILED DESCRIPTION

Figure 1:
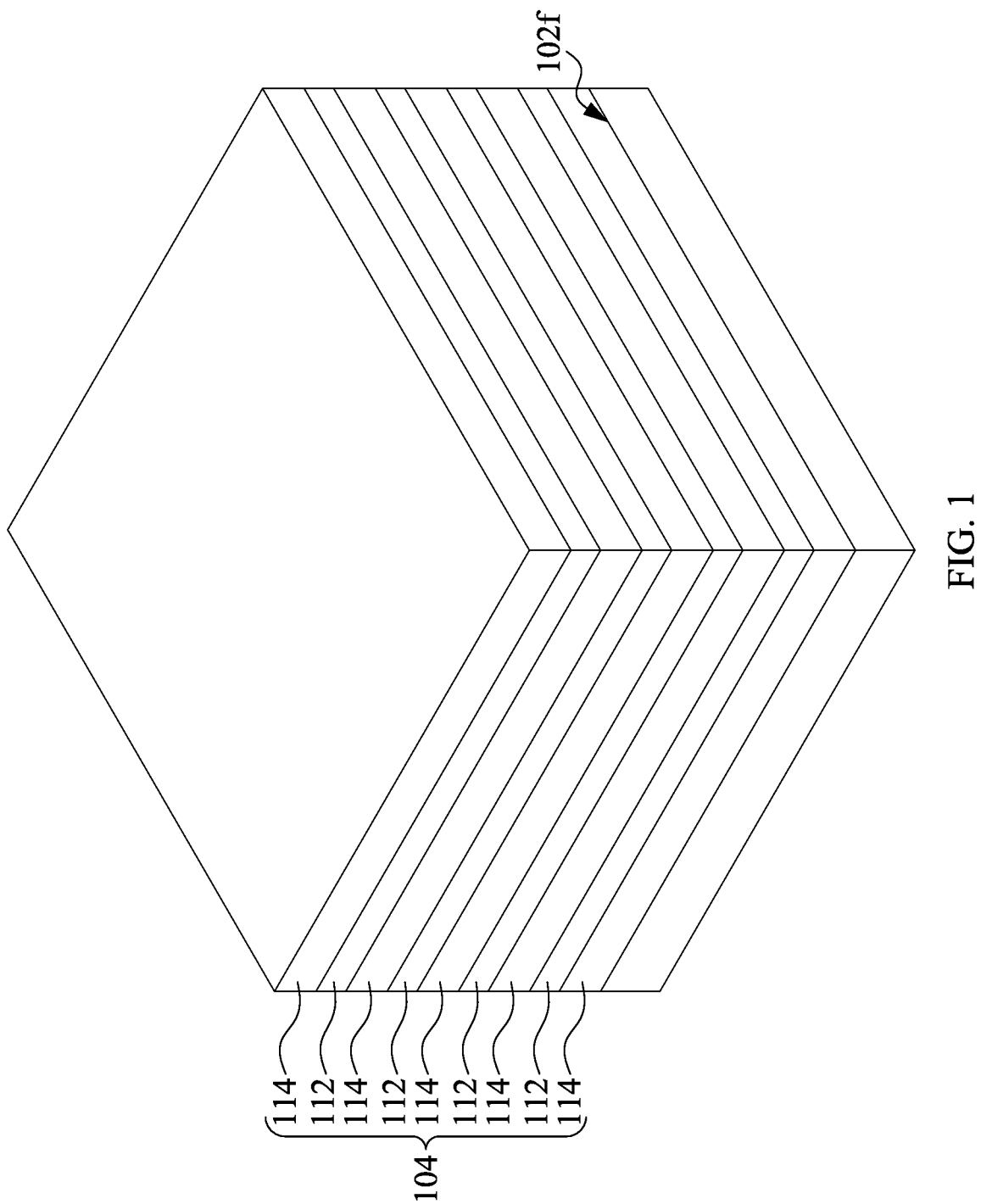
FIGS. 1-7 are perspective views of intermediate stages of a method of manufacturing a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As will be appreciated by those skilled in the art, the embodiments of the present disclosure may be implemented as a system, method, or computer program product. Accordingly, the embodiments of the present disclosure may take the form of an entirely hardware embodiment, an entirely software embodiment (including firmware, resident software, micro-code, etc.) or an embodiment combining software and hardware aspects that may all generally be referred to herein as a "circuit," "block," "module" or "system." Furthermore, the embodiments of the present disclosure may take the form of a computer program product embodied in any tangible medium of expression having program codes embodied in the medium and executable by a computer.

In the present disclosure, a memory array and a method for manufacturing a memory array are provided. During the method of manufacturing a memory array, multiple lithography operations may be used in deposition and etching of various target layers, e.g., component layers or sacrificial layers of the memory array. When an etching operation is performed on a target layer in a memory array, a suitable etchant is selected as having sufficient etching selectivity between the target layer and its adjacent layers. However, in some embodiments, one or more component layers, e.g., the charge-trapping layer or channel layer of the memory cell, may be inevitably etched or damaged by an etching operation performed on its adjacent layer due to limitations of the existing etchants and/or etching tools. As such, the present disclosure discusses an additional etching stop layer for providing enhanced etching protection on the charge-trapping layer and the channel layer. The resultant memory cell can be formed with less defects and the production yield can be increased accordingly.

FIGS. 1 to 10 are perspective views of intermediate stages of a method 100 of manufacturing a semiconductor structure, in accordance with some embodiments. It should be understood that additional steps can be provided before, during, and after the steps shown in these figures, and some of the steps described below can be replaced or eliminated in other embodiments of the method 100. The order of the steps may be interchangeable.

Referring to FIG. 1, a substrate 102 is provided or formed. The substrate 102 includes a semiconductor material such as silicon, and may include polysilicon. In some embodiments, the substrate 102 may include other semiconductor materials, such as silicon germanium, silicon carbide, gallium arsenide, or the like. In some embodiments, the substrate 102 is a p-type semiconductive substrate (acceptor type) or an n-type semiconductive substrate (donor type). Alternatively, the substrate 102 includes another elementary semiconductor, such as germanium; a compound semiconductor including gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) substrate. In some embodiments, the substrate 102 may include a doped epitaxial layer, a gradient semiconductor layer, and/or a semiconductor layer overlaying another semiconductor layer of a different type, such as a silicon layer on a silicon germanium layer.

In some embodiments, one or more semiconductor devices (not separately shown) are formed on an upper surface 102f of the substrate 102. The semiconductor devices may include active devices, such as transistors, diode or the like, or passive devices, such as resistors, capacitors, inductors, fuses or the like. In some embodiments, these semiconductor devices are formed to construct field-effect transistors (FETs), and can be a planar FET, a fin-type FET (FinFET), a gate-all-around (GAA) FET, a nanosheet FET, a nanowire FET, a fully-depleted silicon-on-isolator (FDSOI) FET, or the like.

Figure 20A:
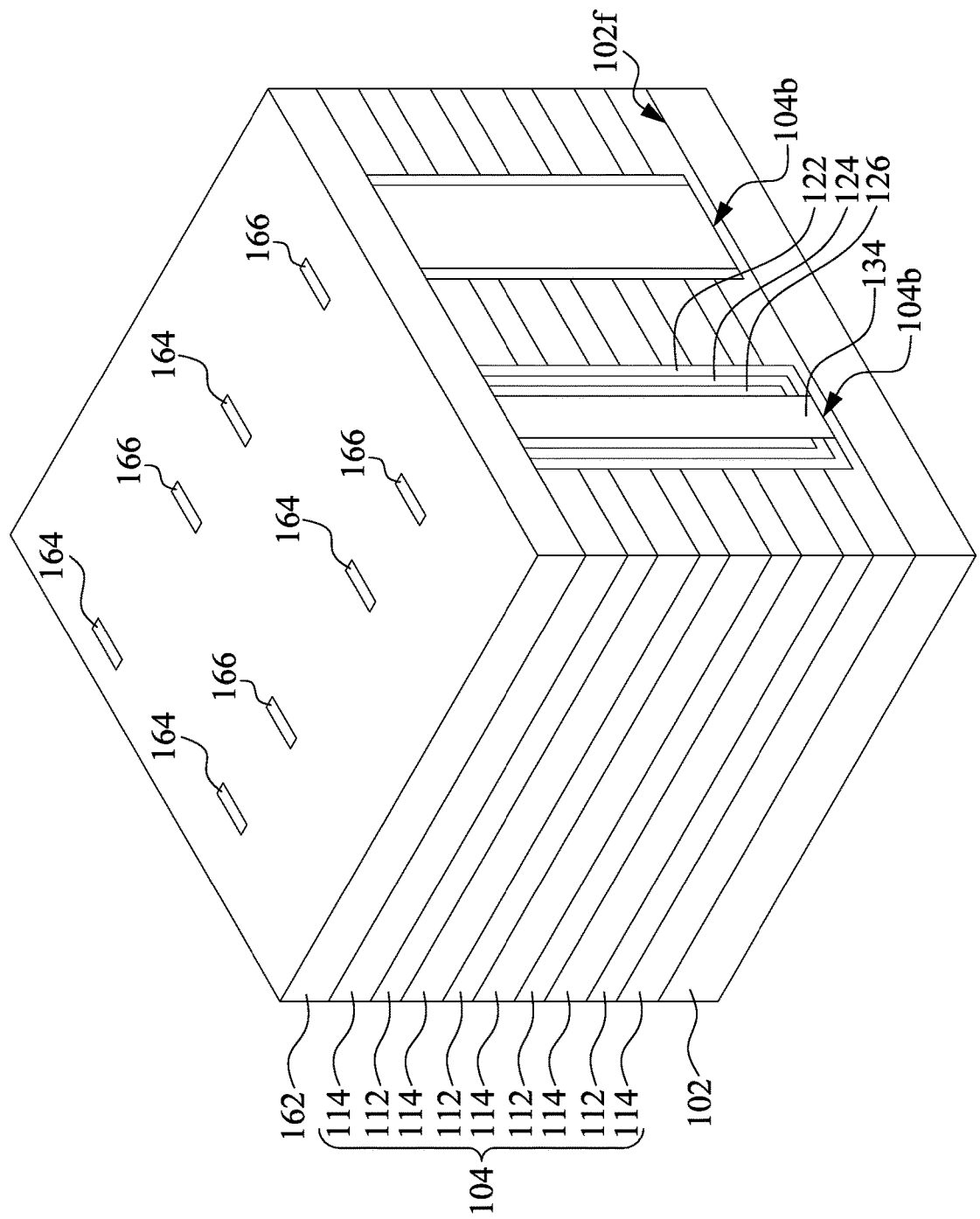
FIGS. 20A, 20B, 20C and 20D are a perspective view, a top view and two cross-sectional views, respectively, of an intermediate stage of a method of manufacturing a semiconductor structure, in accordance with some embodiments.
Figure 20B:
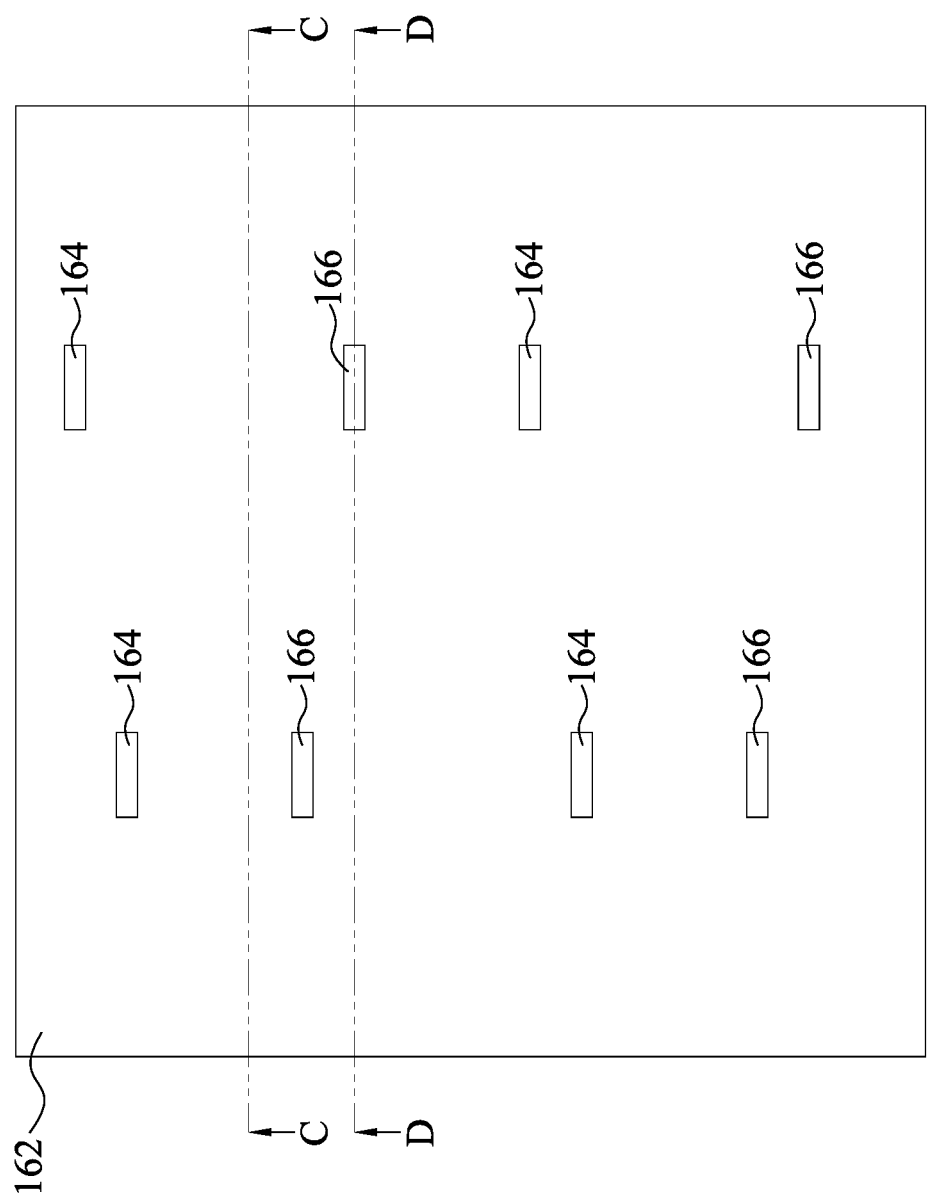
Figure 20C:
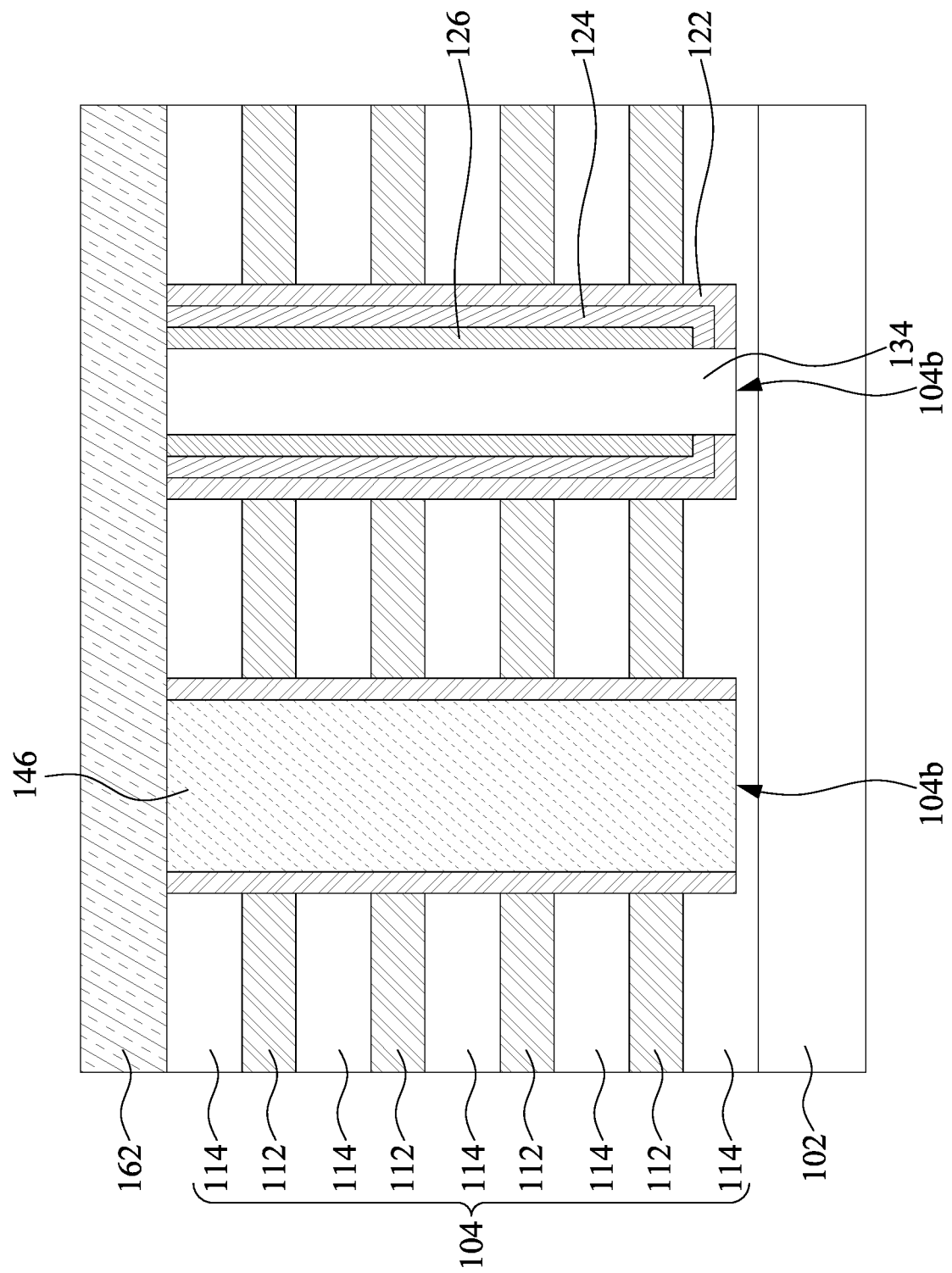
Figure 20D:
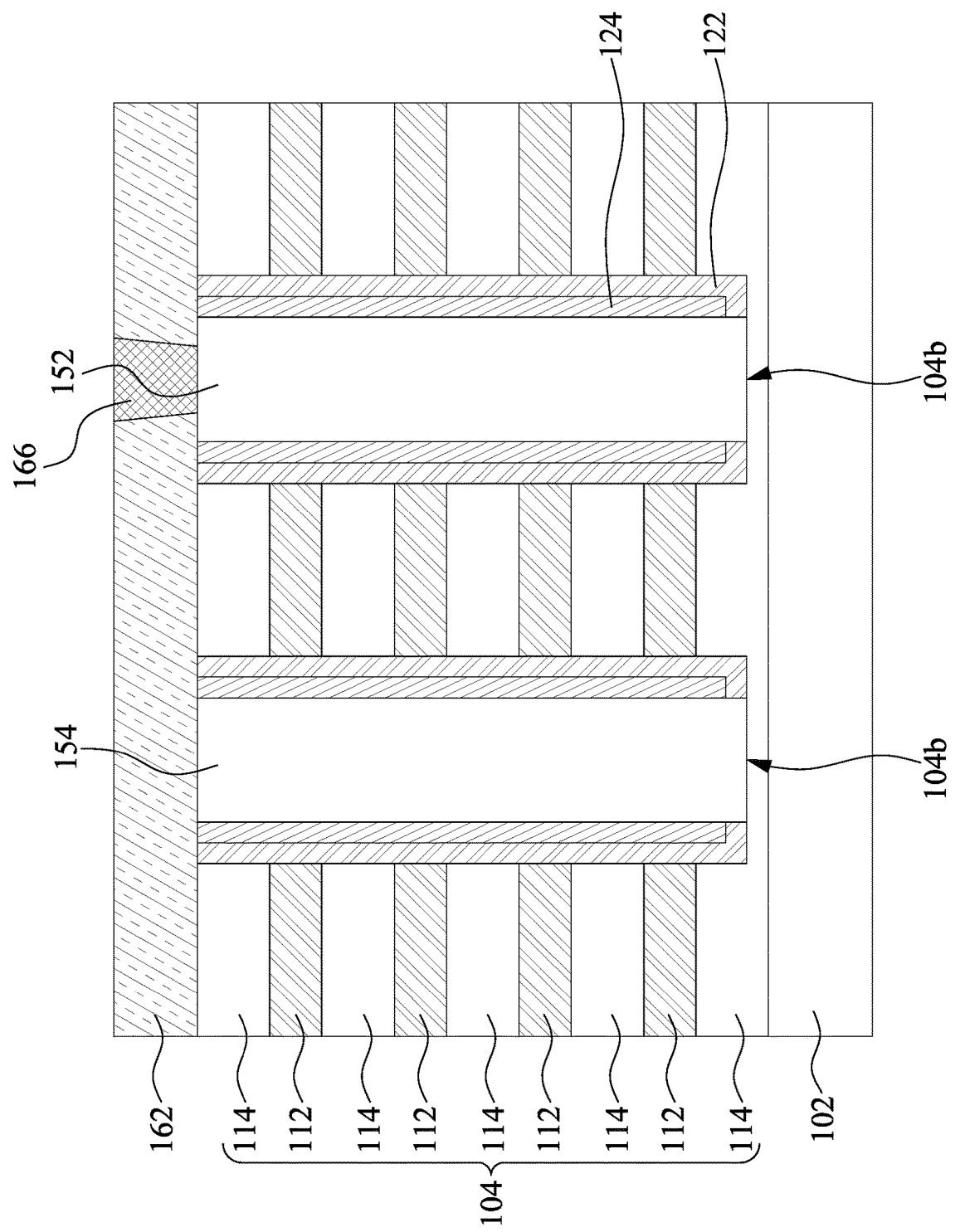
Figure 21A:
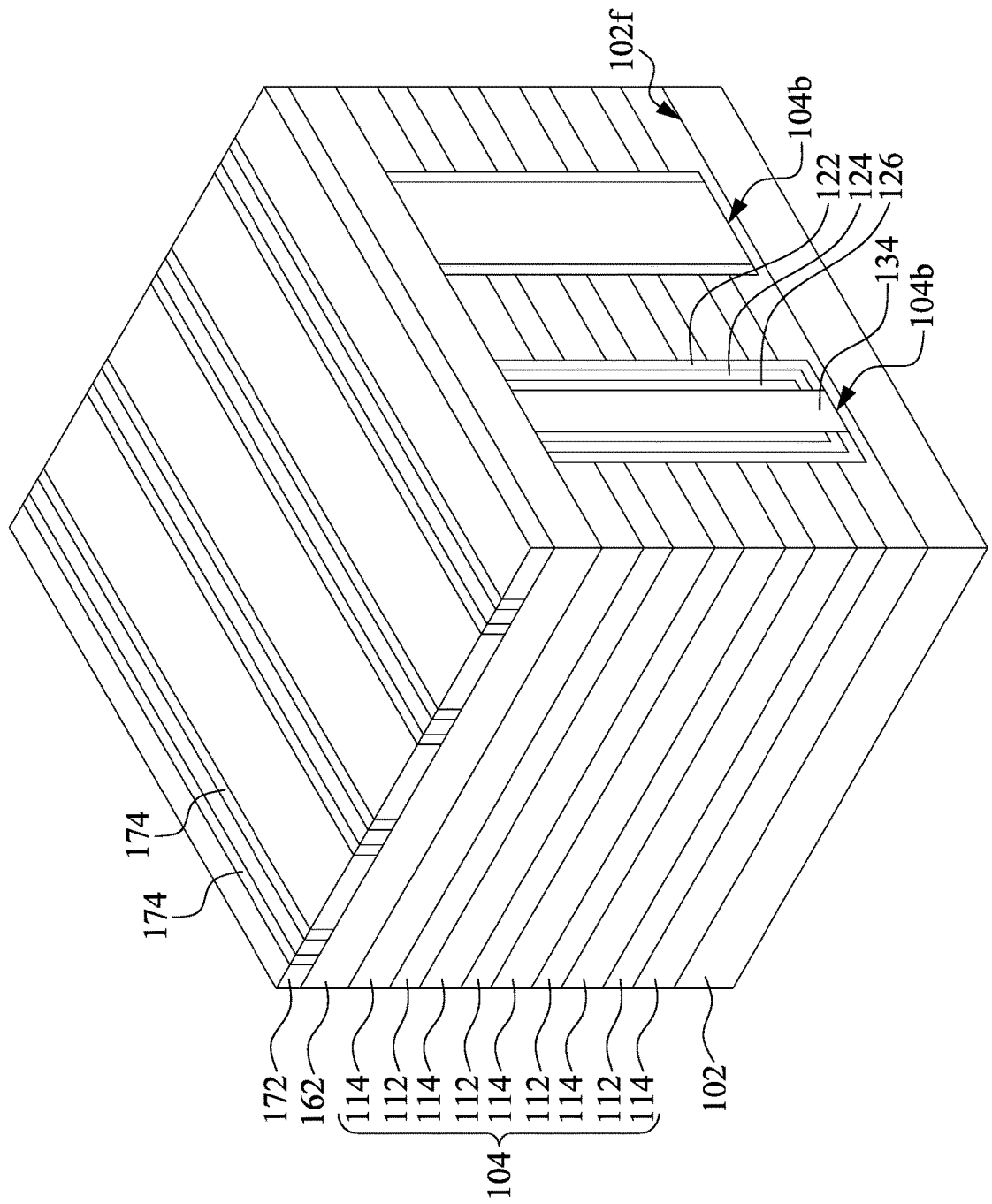
FIGS. 21A, 21B, 21C and 21D are a perspective view, a top view and two cross-sectional views, respectively, of an intermediate stage of a method of manufacturing a semiconductor structure, in accordance with some embodiments.
Figure 21B:
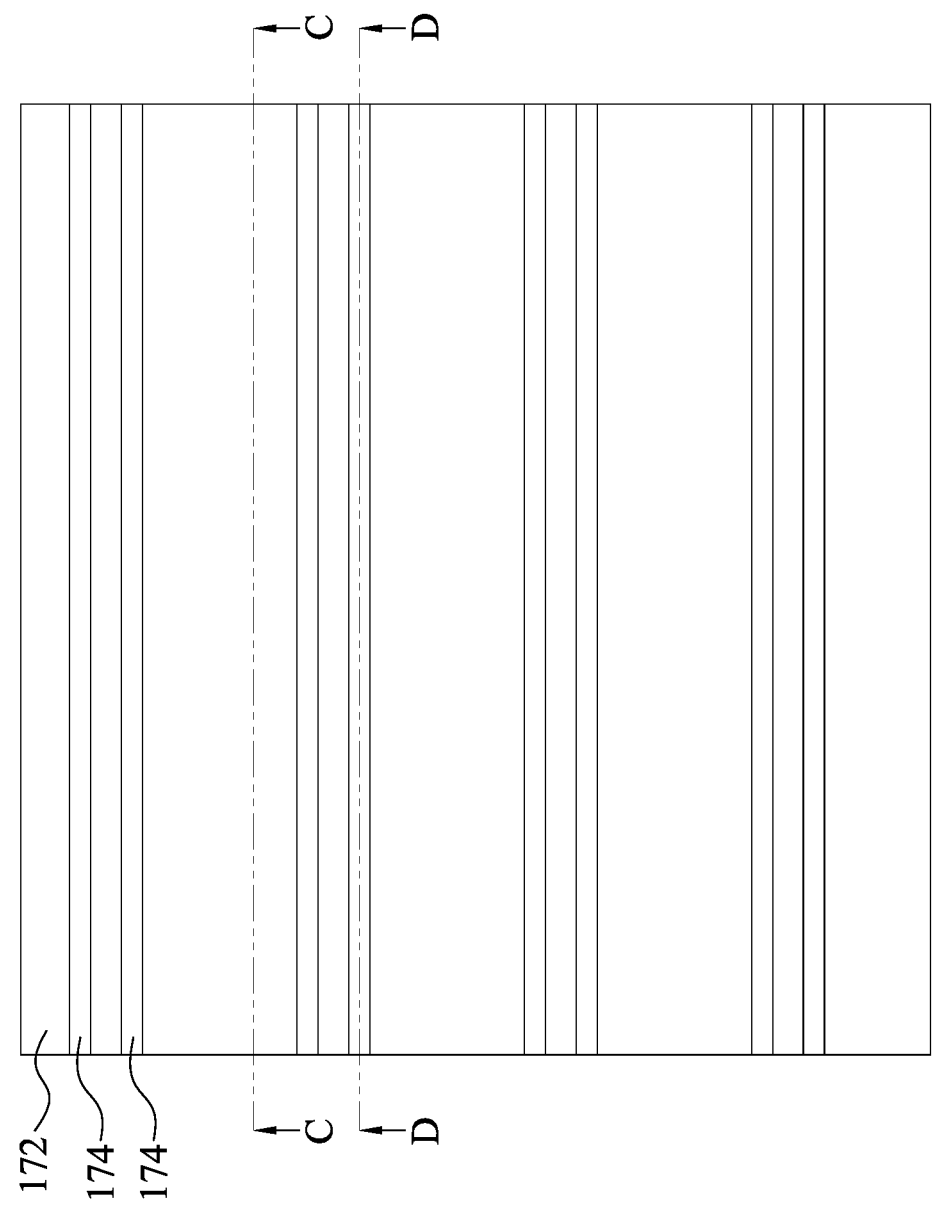
Figure 21C:
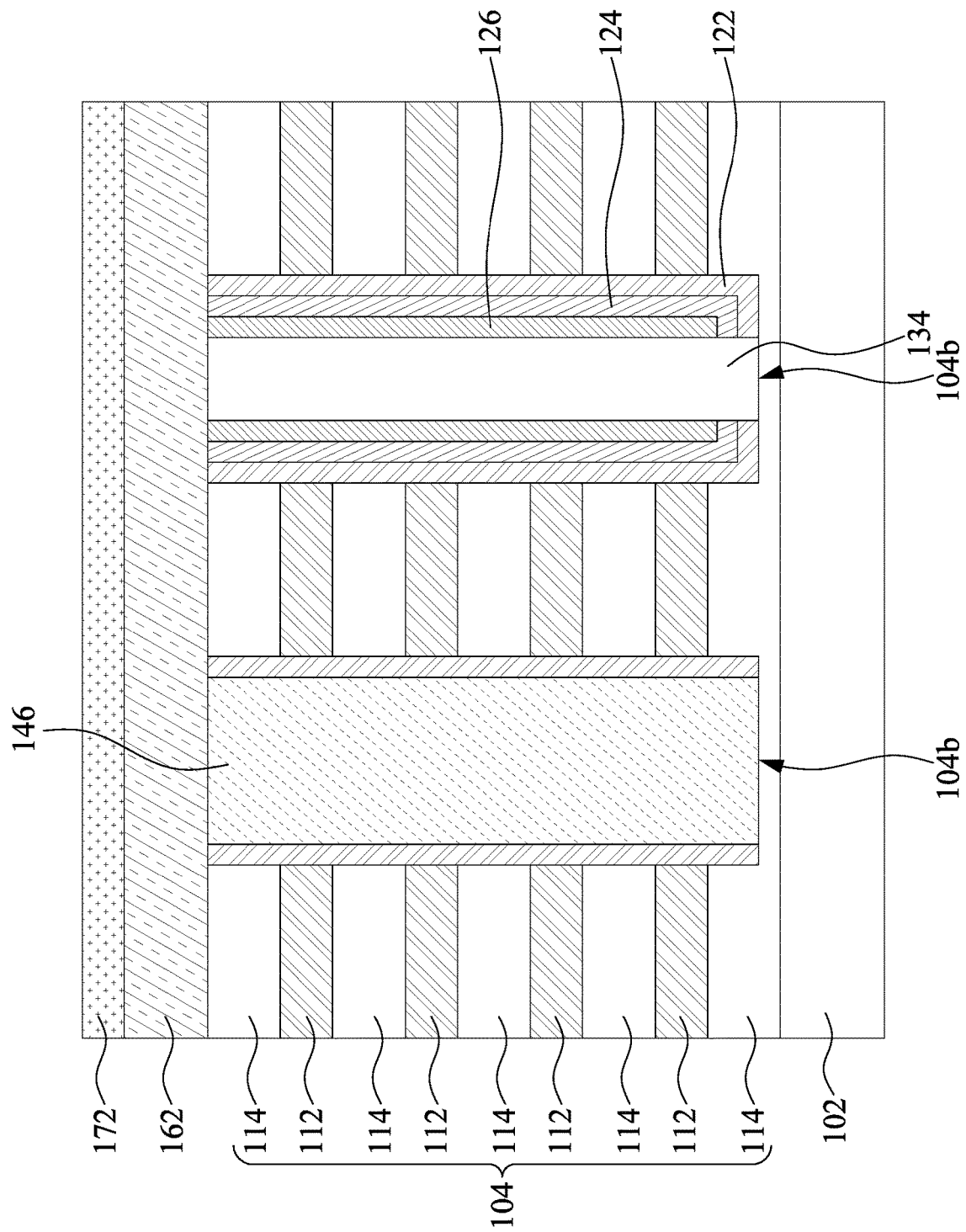
Figure 21D:
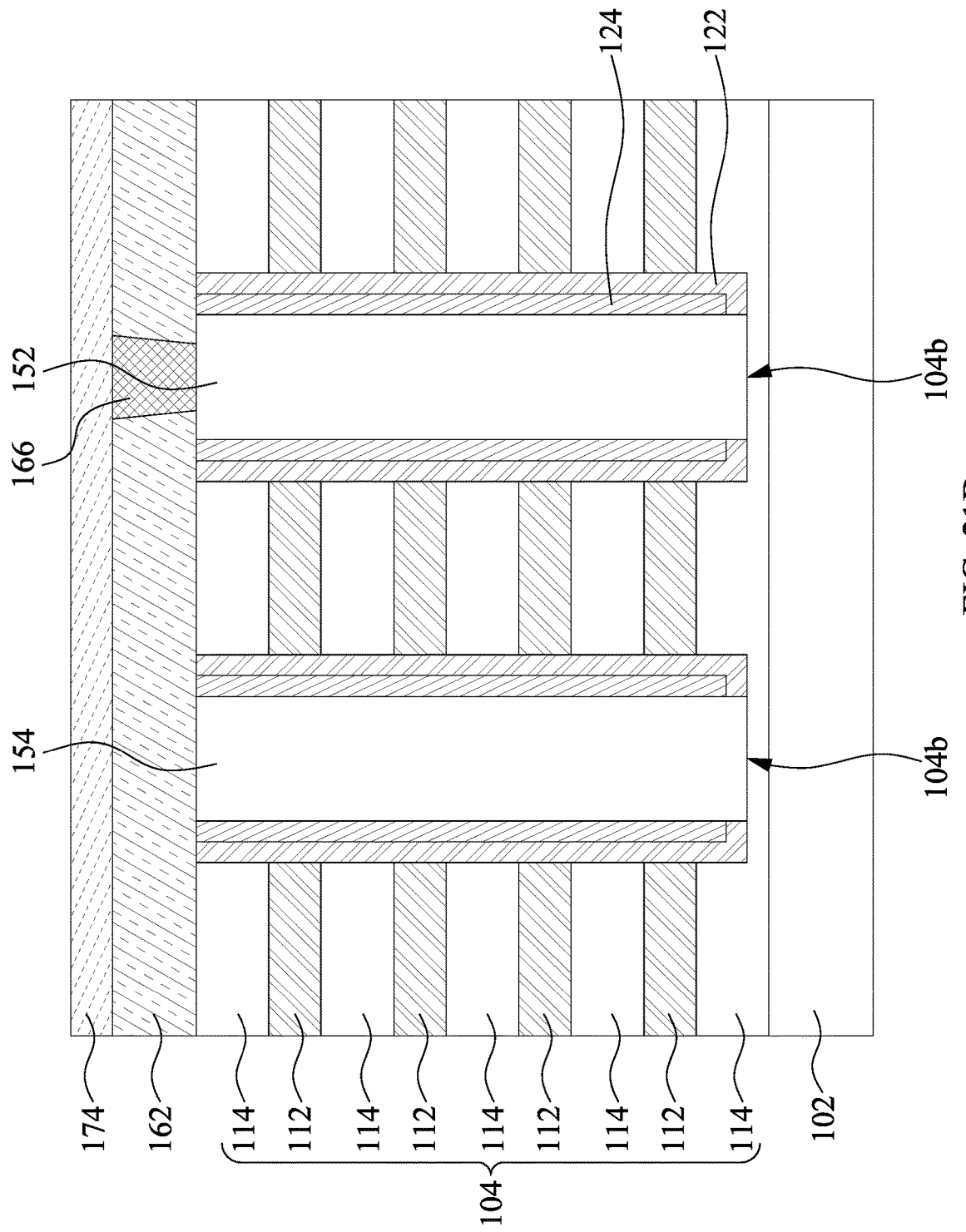

In some embodiments, an interconnect structure 104 is formed over the substrate 102. In some embodiments, the interconnect structure 104 is deposited over the upper surface 102f of the substrate 102. The interconnect structure 104, also known as a redistribution layer (RDL), is widely applied in semiconductor circuits in order to provide rerouted interconnections between components on one side of the interconnect structure 104. The interconnect structure 104 is fabricated in a back-end-of-line (BEOL) stage. In some embodiments, the interconnect structure 104 is configured to electrically couple components on different sides of the interconnect structure 104. The interconnect structure 104 generally includes stacked metallization layers comprised of conductive features connected with each other to establish interconnection routes, e.g., an exemplary metallization layer 112 or 114 of the interconnect structure 104. Each of the metallization layers may include conductive lines or vias (see also FIGS. 20D and 21D) in which the conductive lines are electrically coupled to an adjacent overlaying or underlying conductive line through intervening conductive vias. In some embodiments, the conductive lines and the conductive vias are formed of conductive material such as gold, silver, copper, nickel, tungsten, aluminum, tin, titanium, tantalum, polysilicon, an alloy thereof, or the like.

As shown in FIG. 1, the metallization layers 112 include conductive lines across the metallization layers 112, and hence the label 112 also refers to herein the conductive lines of the metallization layers 112. The conductive vias are included in the metallization layers 114 and not shown explicitly in FIG. 1. The conductive vias in the metallization layer 114 are electrically insulated by an insulating material, and hence the label 114 also refers to herein the insulating material 114. The insulating material 114 is sometimes referred to as an inter-metal dielectric (IMD) layer. In some embodiments, the different layers of IMD 114 may have different thicknesses. For example, as illustrated in FIG. 1, the bottom IMD layer 114 may be thicker than other overlying IMD layer 114. In some embodiments, the insulating material of the IMD layer 114 comprises silicon oxide, silicon nitride, silicon oxynitride, silicon carbide, or the like. In some embodiments, the insulating material 114 comprises oxide, such as un-doped silicate glass (USG), fluorinated silicate glass (FSG), borophosphosilicate glass (BPSG), tetraethoxysilane (TEOS), spin-on glass (SOG), high-density plasma (HDP) oxide, plasma-enhanced TEOS (PE-TEOS), or the like.

In some embodiments, the insulating material 114 may be formed by CVD, PVD, ALD, spin-on coating, or other suitable operations. The conductive lines 112 and the conductive vias may be formed by lithography and etching operations known in the art. In some embodiments, the etching operations include a dry etch, a wet etch, or a combination thereof, e.g., a reactive ion etch (RIE).

Figure 18A:
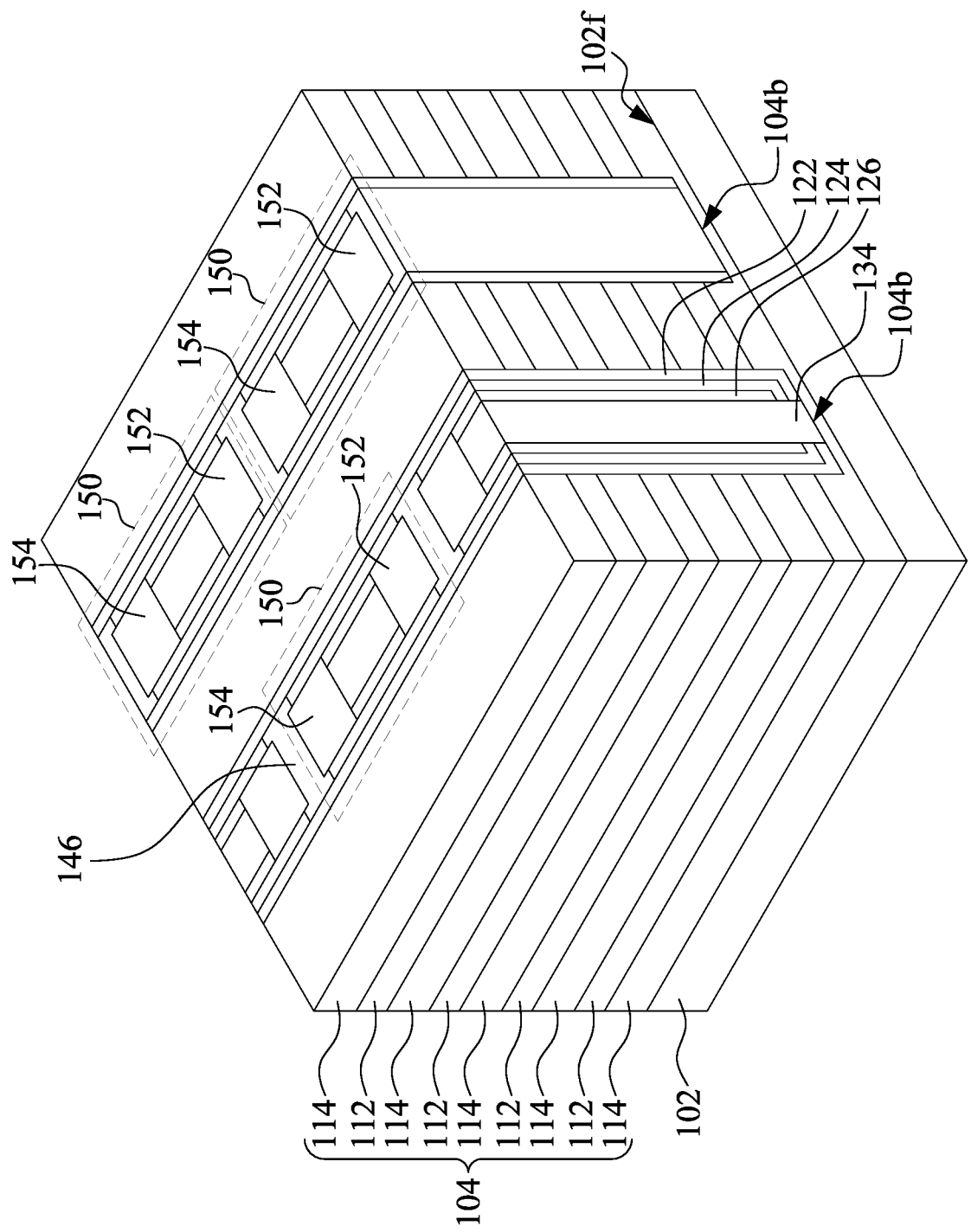
Figure 18B:
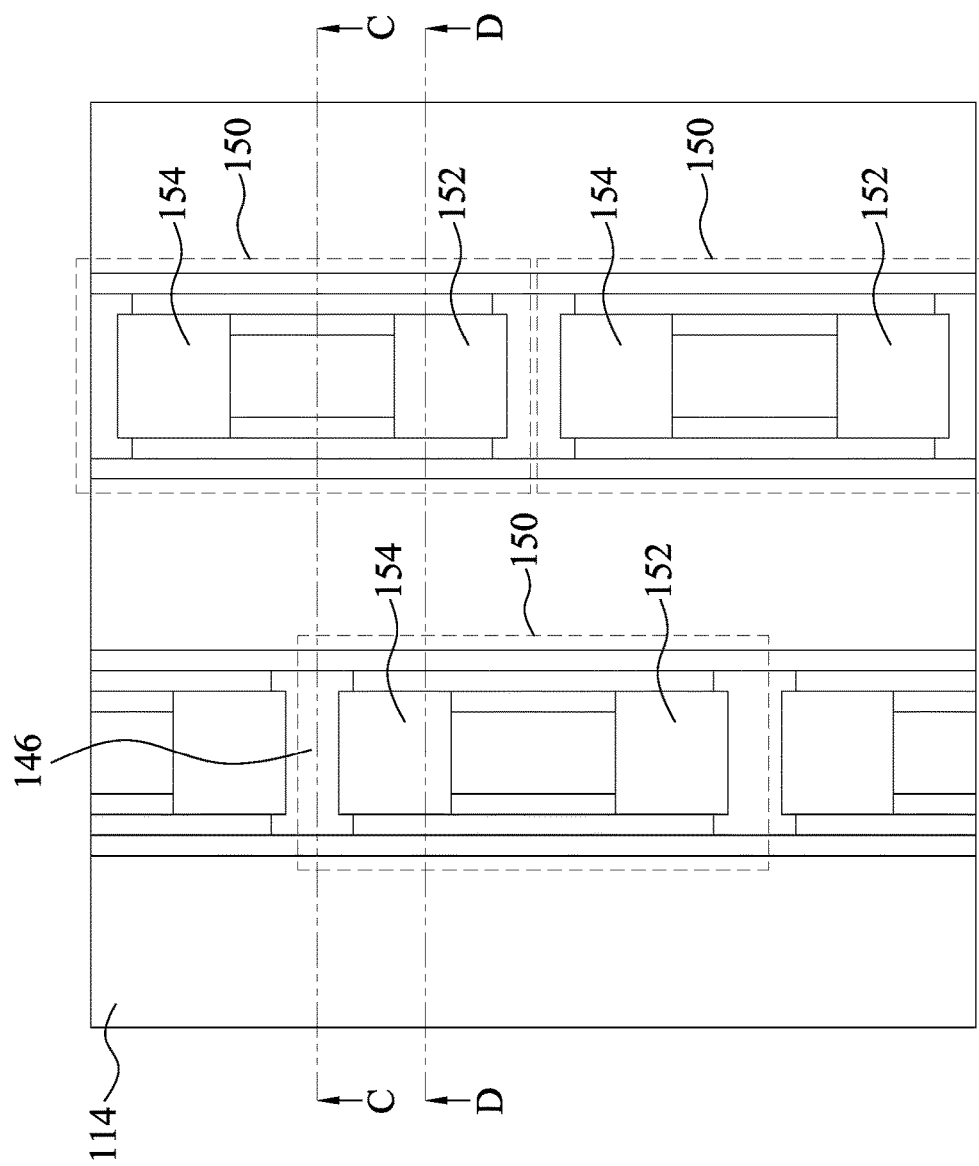
Figure 18C:
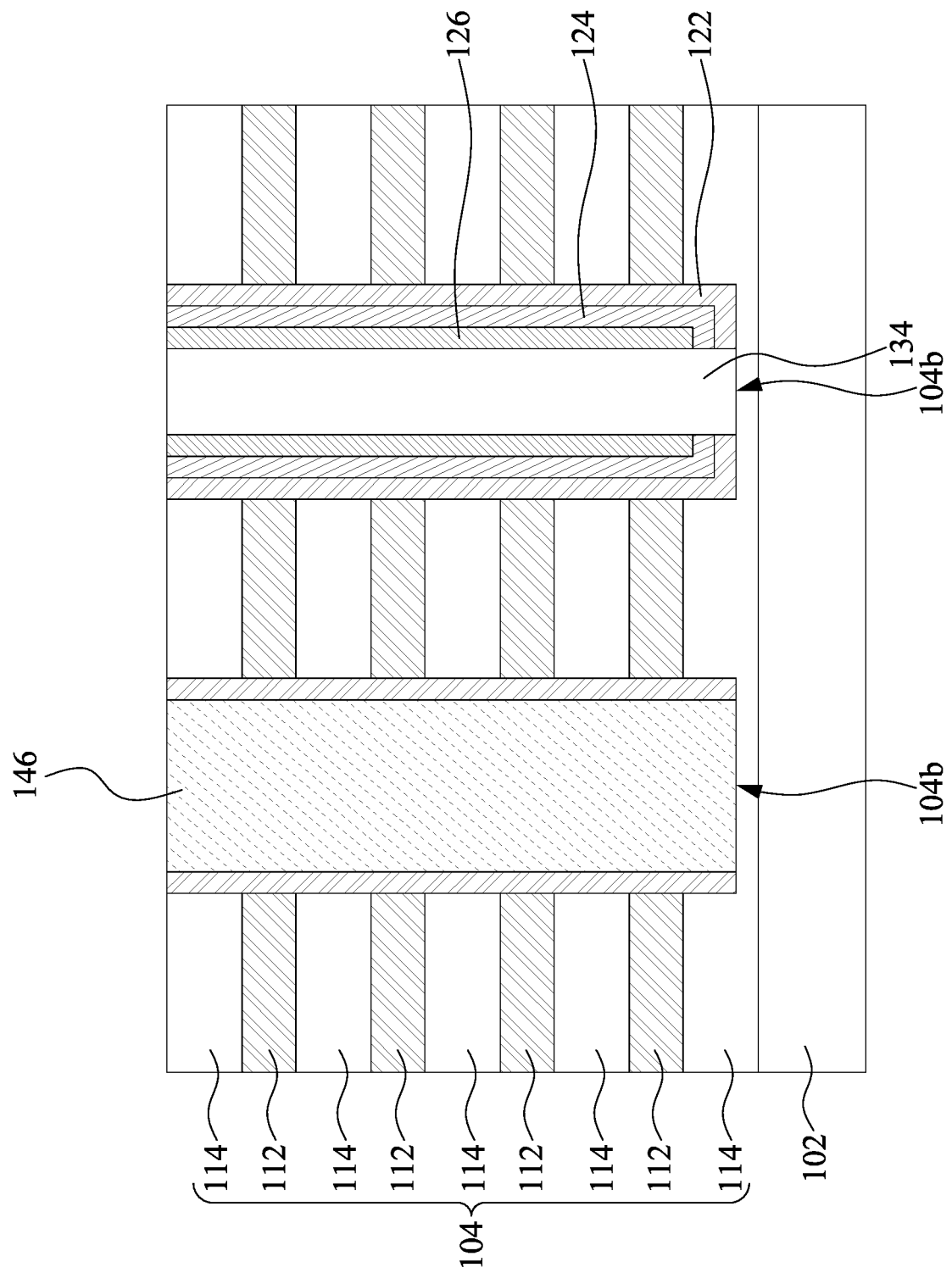
Figure 19A:
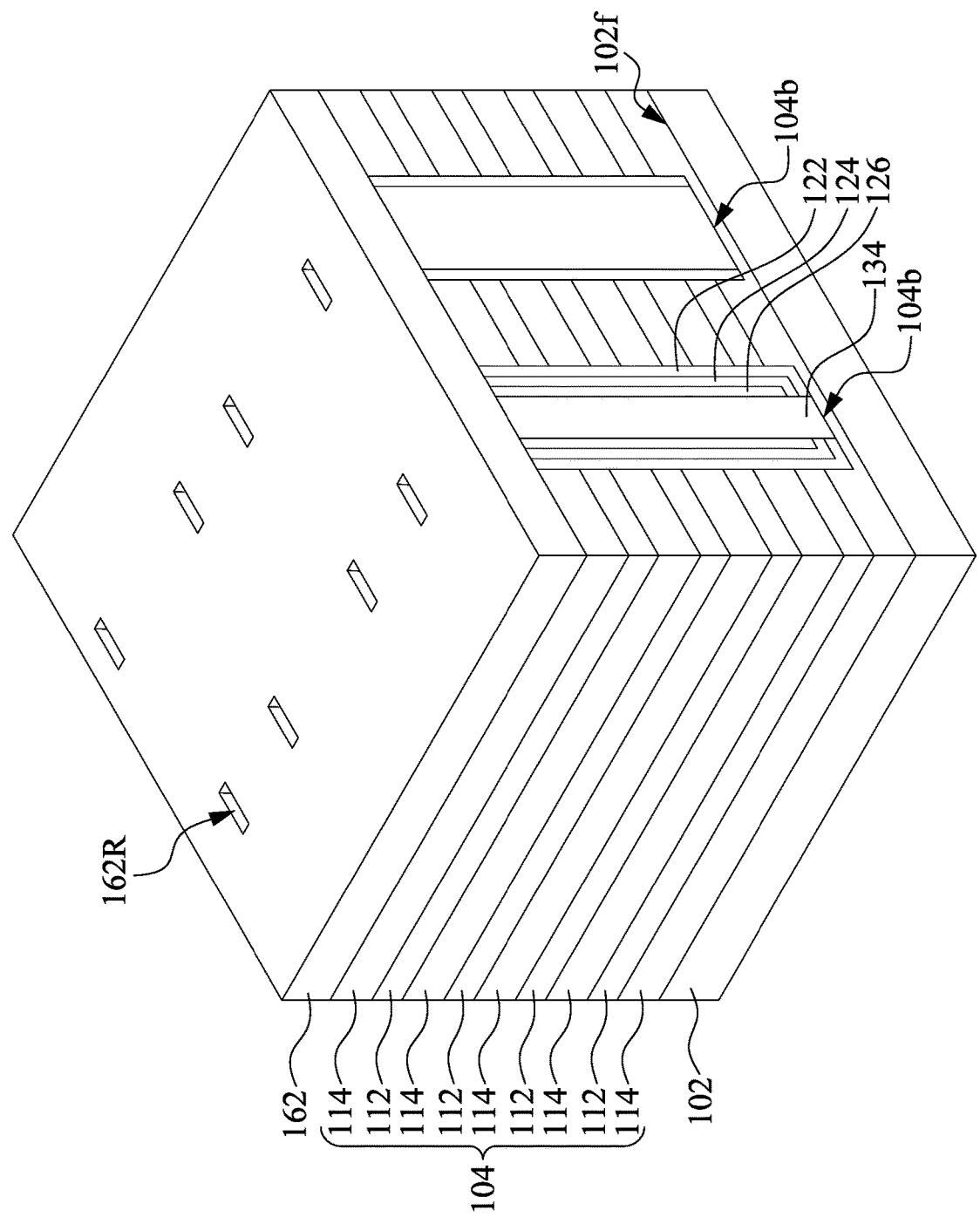
FIGS. 19A, 19B, 19C and 19D are a perspective view, a top view and two cross-sectional views, respectively, of an intermediate stage of a method of manufacturing a semiconductor structure, in accordance with some embodiments.
Figure 19B:
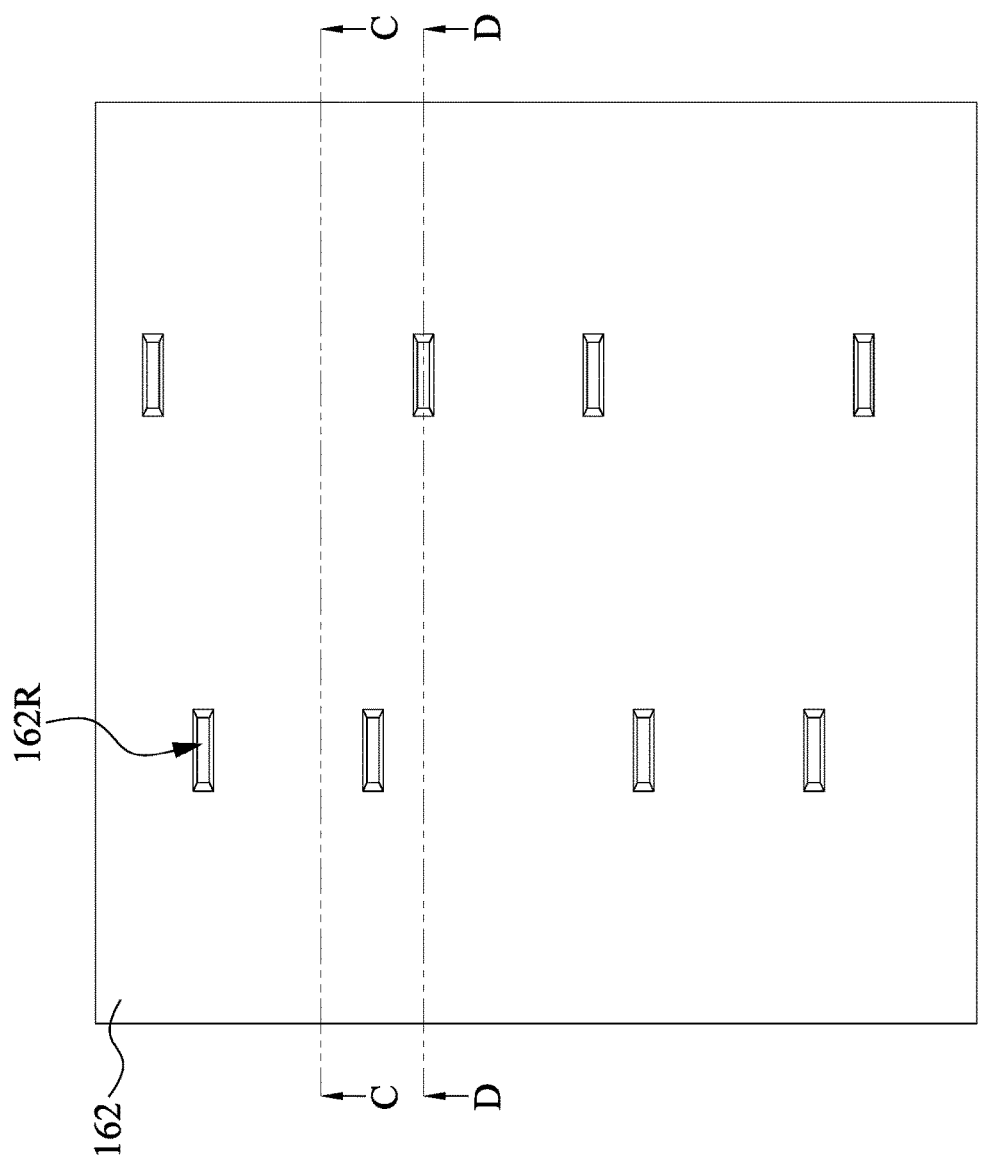
Figure 19C:
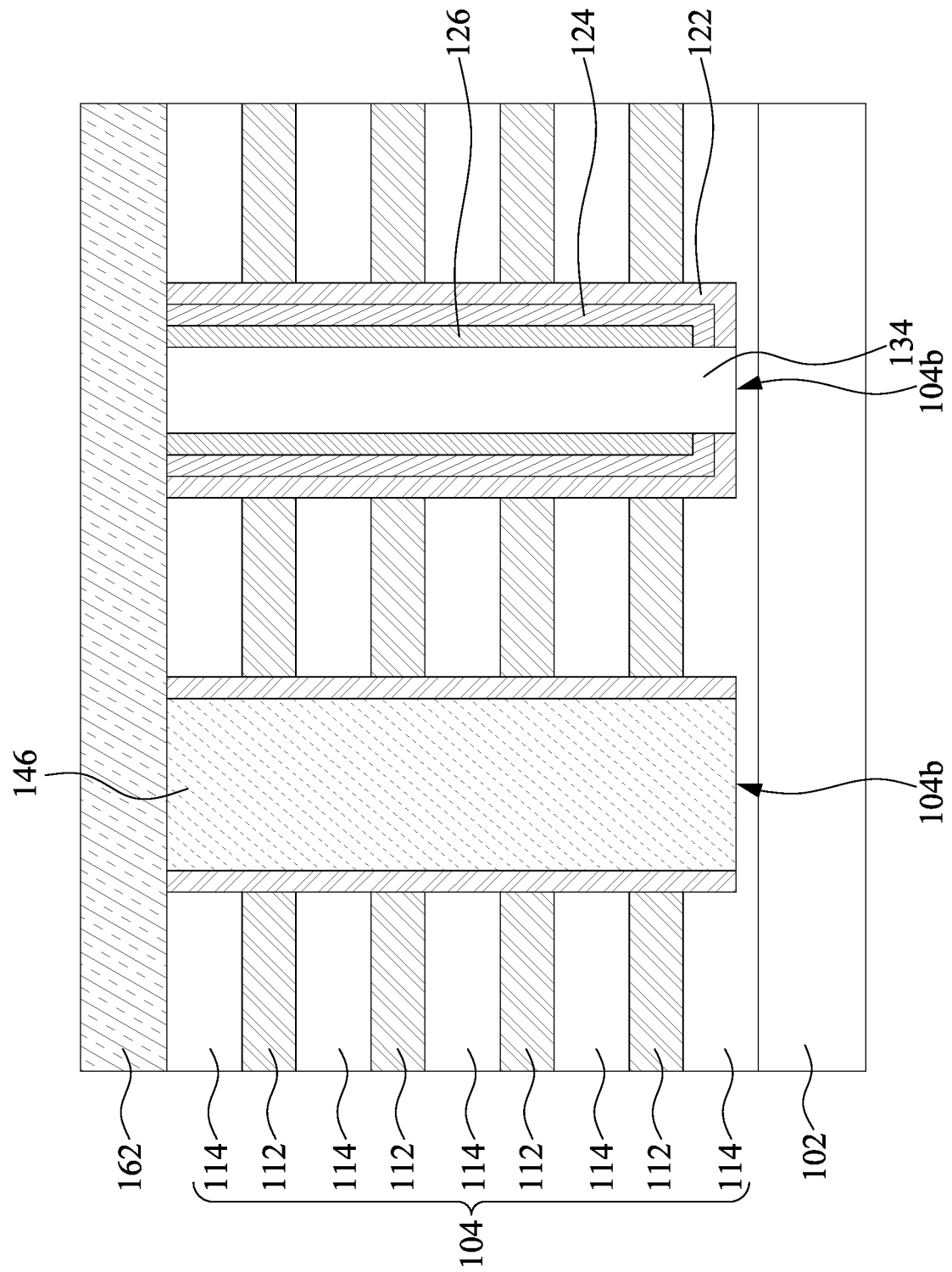
Figure 19D:
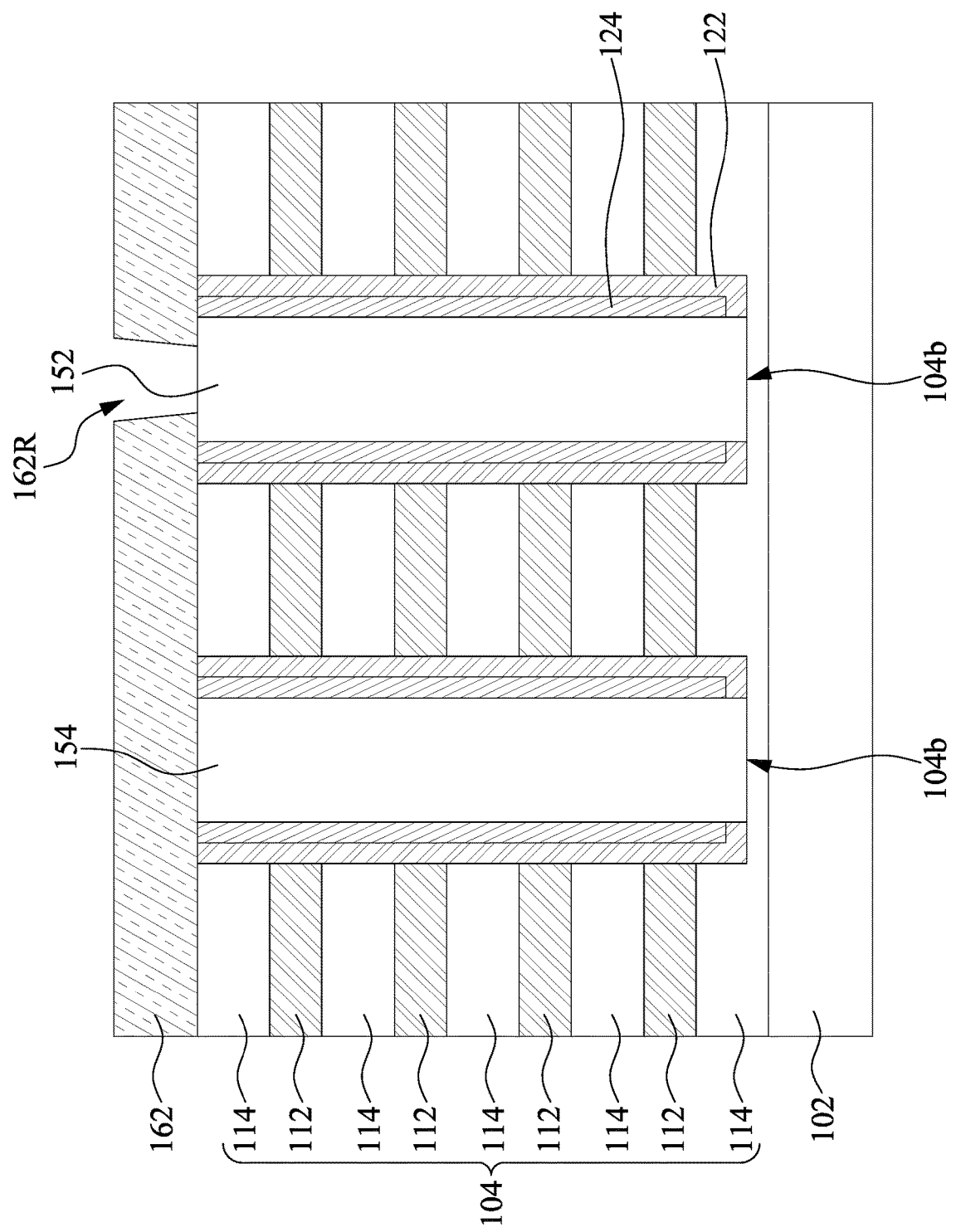

In the present embodiments, a plurality of conductive lines 112 are formed in the metallization layers in an alternative manner. The conductive lines 112 may have a shape of plate, strip or line from a top-view perspective. In some embodiments, each of the memory cells (as represented as individual memory cells 150 of a memory array in FIG. 18B) in the memory array manufactured by the method 100 is formed in a similar way of forming a transistor, which includes a gate electrode, two source/drain regions, a channel region and a gate dielectric layer. Each of the conductive lines 112 may be configured as a gate electrode or gate layer of a transistor associated with a respective memory cell. In some embodiments, the interconnect structure 104 include additional conductive lines (not separately shown) for performing electrical connections of the semiconductor devices in the substrate 102.

Figure 2:
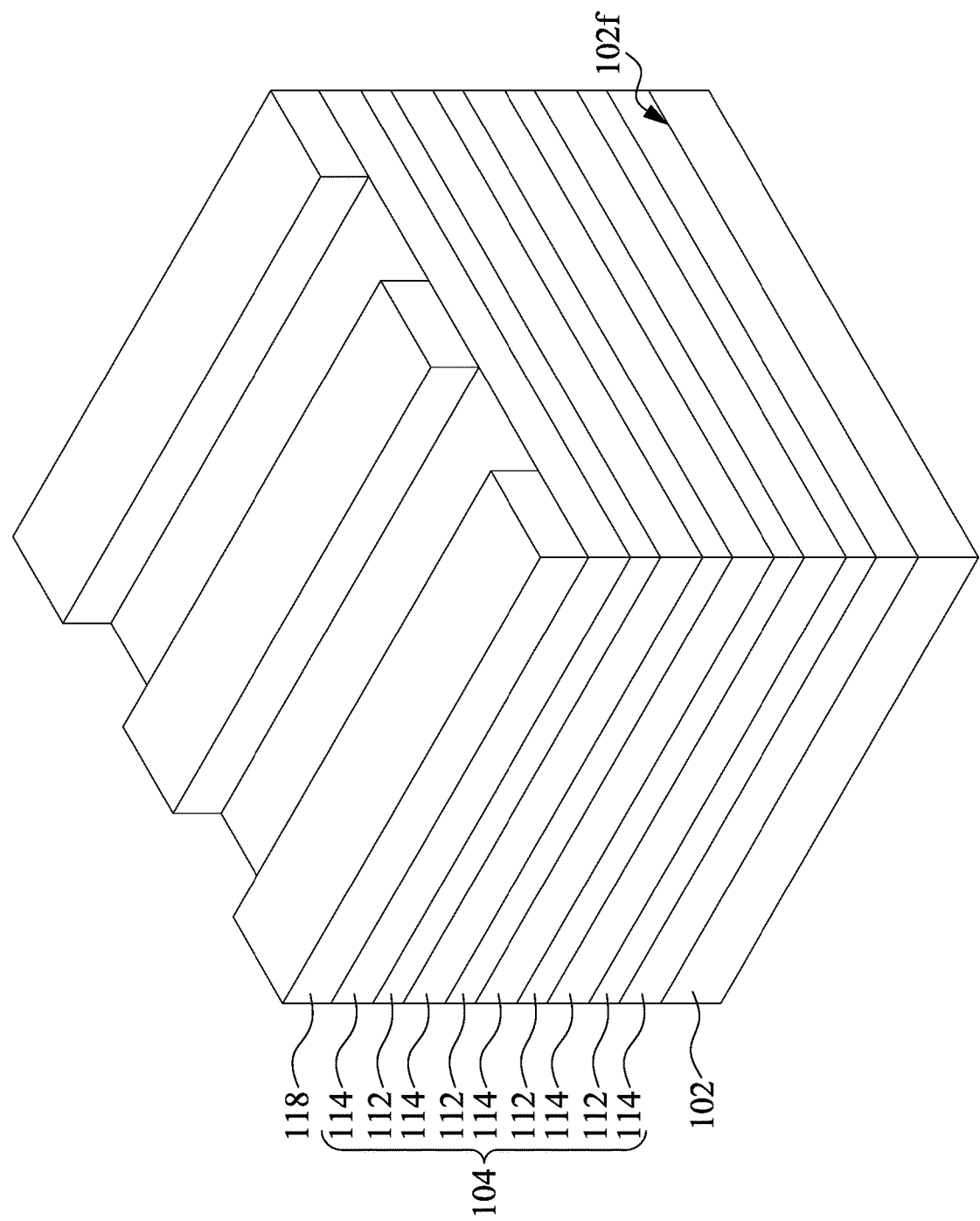

Referring to FIG. 2, a mask layer 118 is formed over the interconnect structure 104. The mask layer 118 may be formed of a photosensitive material, such as photoresist, or a hard mask layer, such as formed of oxide, nitride, oxynitride, or the like. The mask layer 118 is patterned to include a plurality of recesses.

Figure 3:
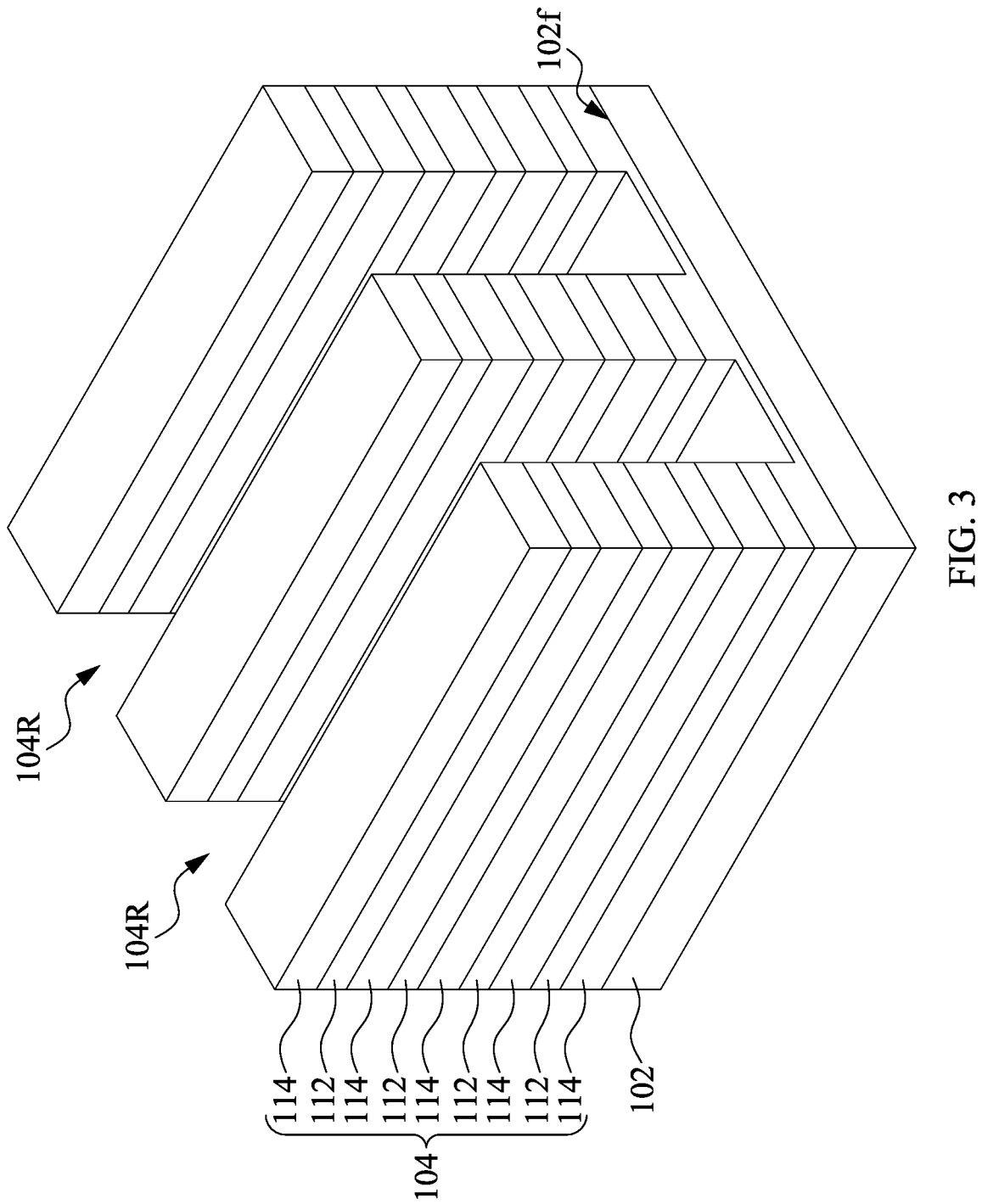

Referring to FIG. 3, the interconnect structure 104 is patterned to form a plurality of trenches 104R. The trenches 104R extend through the conductive lines 112 and stop at a depth in the bottom IMD layer 114. A thickness of the bottom IMD layer 114 is left during the patterning operation to cover the upper surface 102f of the substrate 102 to provide electrical insulation during the subsequent operations. Through the patterning operation, sidewalls of the conductive lines 112 are exposed to the trenches 104R. In some embodiments, the patterning of the interconnect structure 104 is performed by etching the trenches 104R with the patterned mask layer 118 serving as the etching mask. In some embodiments, the trenches 104R extend in parallel from a top-view perspective. In some embodiments, the etching operation includes a dry etch, a wet etch, an RIE, or the like. The mask layer 118 may be removed of stripped after the trenches 104R are formed.

Figure 4:
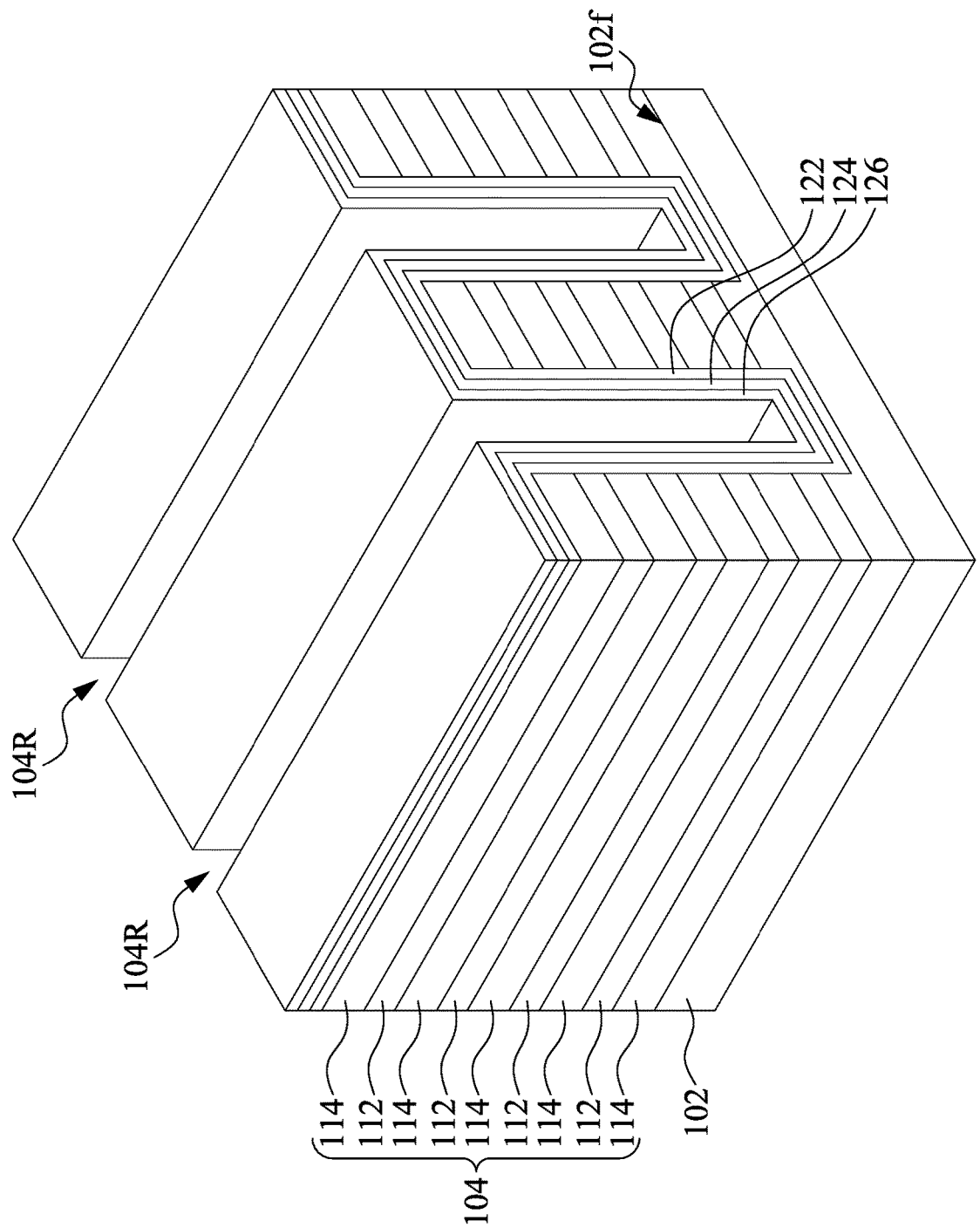

Referring to FIG. 4, a charge-trapping layer 122 is deposited over the interconnect structure 104 and in the trenches 104R. In some embodiments, the charge-trapping layer 122 is deposited on the sidewall and the bottom surface of the trenches 104R in a conformal manner. The charge-trapping layer 122 is capable of retaining charges as logic-representing data and thus configured as a data storage element of a memory cell. Since the charge-trapping layer 122 can aid in retaining programmed charges when power is shut off, the memory cell using the charge-trapping layer 122 is referred to herein as non-volatile memory (NVM). The charge-trapping layer 122 may serve as a gate dielectric layer coupled to the gate electrode, i.e., the conductive line 112, of a transistor in the memory cell. In some embodiments, the charge-trapping layer 122 is formed of a dielectric material, such as silicon oxide, silicon nitride, silicon oxynitride, or the like. In some embodiments, the charge-trapping layer 122 includes a multilayer structure, e.g., the charge-trapping layer 122 includes a layer stack of oxide-nitride-oxide (ONO), or other forms of layer stacks.

In some embodiments, the charge-trapping layer 122 is formed of a high-k (high dielectric constant) dielectric material, such as zirconium dioxide ($ZrO_2$), aluminum oxide ($Al_2O_3$), hafnium oxide (HfOx), Hafnium silicate (HfSiOx), zirconium titanate (ZrTiOx), tantalum oxide (TaOx), or the like. In some embodiments, the charge-trapping layer 122 is formed of a ferroelectric material, such as HfSiOx, HfZrOx, $Al_2O_3$, $TiO_2$, LaOx, BaSrTiOx (BST), PbZrxTiyOz (PZT), or the like.

In some embodiments, the charge-trapping layer 122 has a thickness in a range between about 5 nm and about 10 nm. The charge-trapping layer 122 may be deposited using chemical vapor deposition (CVD), physical vapor deposition (PVD), atomic layer deposition (ALD), thermal oxidation/nitridation, or other suitable deposition methods.

A channel layer 124 is deposited over the interconnect structure 104 and in the trenches 104R over the charge-trapping layer 122. In some embodiments, the channel layer 124 is deposited on the sidewall and the lower portions of the charge-trapping layer 122 in a conformal manner. The channel layer 124 may be configured as a data-reading element of a memory cell, in which the channel layer 124 serves as a composite source/drain regions and channel region of the transistor and is configured to conduct current according to biasing voltages of the gate electrode and the source/drain contacts of the respective memory cell.

In some embodiments, the channel layer 124 is formed of a semiconductor material. The semiconductor materials can include Si-based materials, oxide semiconductor (OS) materials, or 2D materials. For example, the Si-based materials can include polysilicon, amorphous silicon, and the like. In other examples, the oxide semiconductor materials can include zinc oxide, cadmium oxide, indium oxide, or the like. In still another example, the 2D materials can include graphene, but the disclosure is not limited thereto. In some embodiments, the channel layer 124 includes a metal oxide, e.g., IGZO, ZnO, SnO, or the like.

In some embodiments, the channel layer 124 has a thickness in a range between about 1 nm and about 30 nm, or between about 5 nm and about 10 nm. The channel layer 124 may be deposited using CVD, PVD, ALD or other suitable deposition methods.

A buffer layer 126 is deposited over the interconnect structure 104 and in the trenches 104R over the channel layer 124. In some embodiments, the buffer layer 126 is deposited on the sidewall and the lower portions of the channel layer 124 in a conformal manner. In some embodiments, the buffer layer 126 is formed for providing greater process windows in subsequent operations. In some embodiments, the forming of the buffer layer 126 is absent from the method 100. In some embodiments, the buffer layer 126 is formed of a dielectric material, such as silicon oxide, silicon nitride, silicon oxynitride, or the like. In some embodiments, the buffer layer 126 includes a multilayer structure.

In some embodiments, the buffer layer 126 is formed of a high-k (high dielectric constant) dielectric material, such as zirconium dioxide ($ZrO_2$), aluminum oxide ($Al_2O_3$), hafnium oxide (HfOx), Hafnium silicate (HfSiOx), zirconium titanate (ZrTiOx), tantalum oxide (TaOx), or the like.

In some embodiments, the buffer layer 126 has a thickness in a range between about 1 nm and about 30 nm, or between about 5 nm and about 10 nm. The buffer layer 126 may be deposited using CVD, PVD, ALD, oxidation, nitridation, or other suitable deposition methods.

Figure 5:
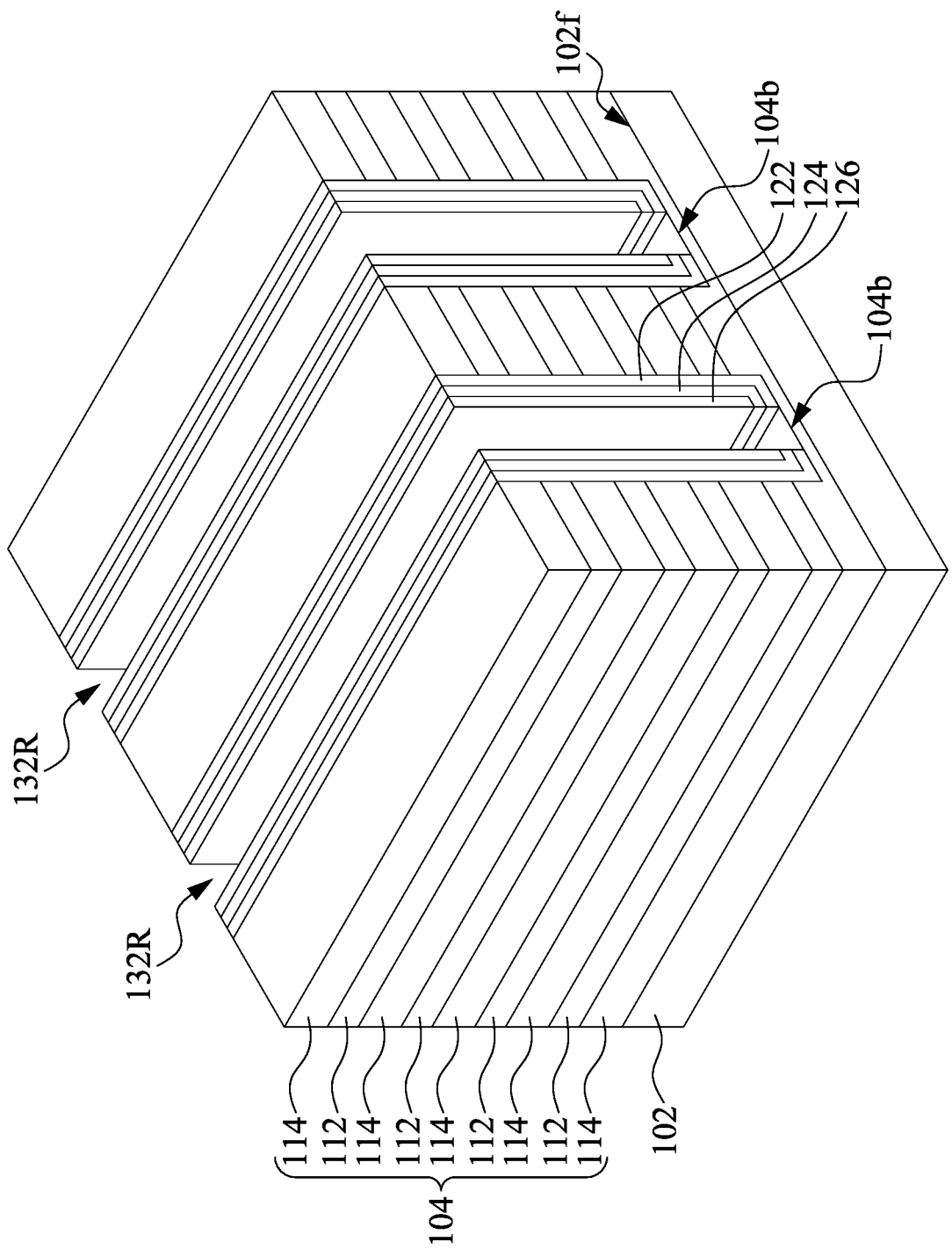

FIG. 5 shows a patterning operation on the stack of the buffer layer 126, channel layer 124 and charge-trapping layer 122. An etching operation is performed on the channel layer 124 and the charge-trapping layer 122. As a result, the horizontal portions of the buffer layer 126, the channel layer 124 and the charge-trapping layer 122 are removed during the etching operation while the vertical portions of the buffer layer 126, the channel layer 124 and the charge-trapping layer 122 are left. The etching operation is performed by a dry etch; however, other types of etching operations such as a wet etch or an RIE may be possible. The etching operation may be performed without using a patterned mask layer, and is sometimes referred to as a blank etch. In some embodiments, the etch stops at a depth of the bottom IMD layer 114 while covering the upper surface 102f of the substrate 102.

Figure 6:
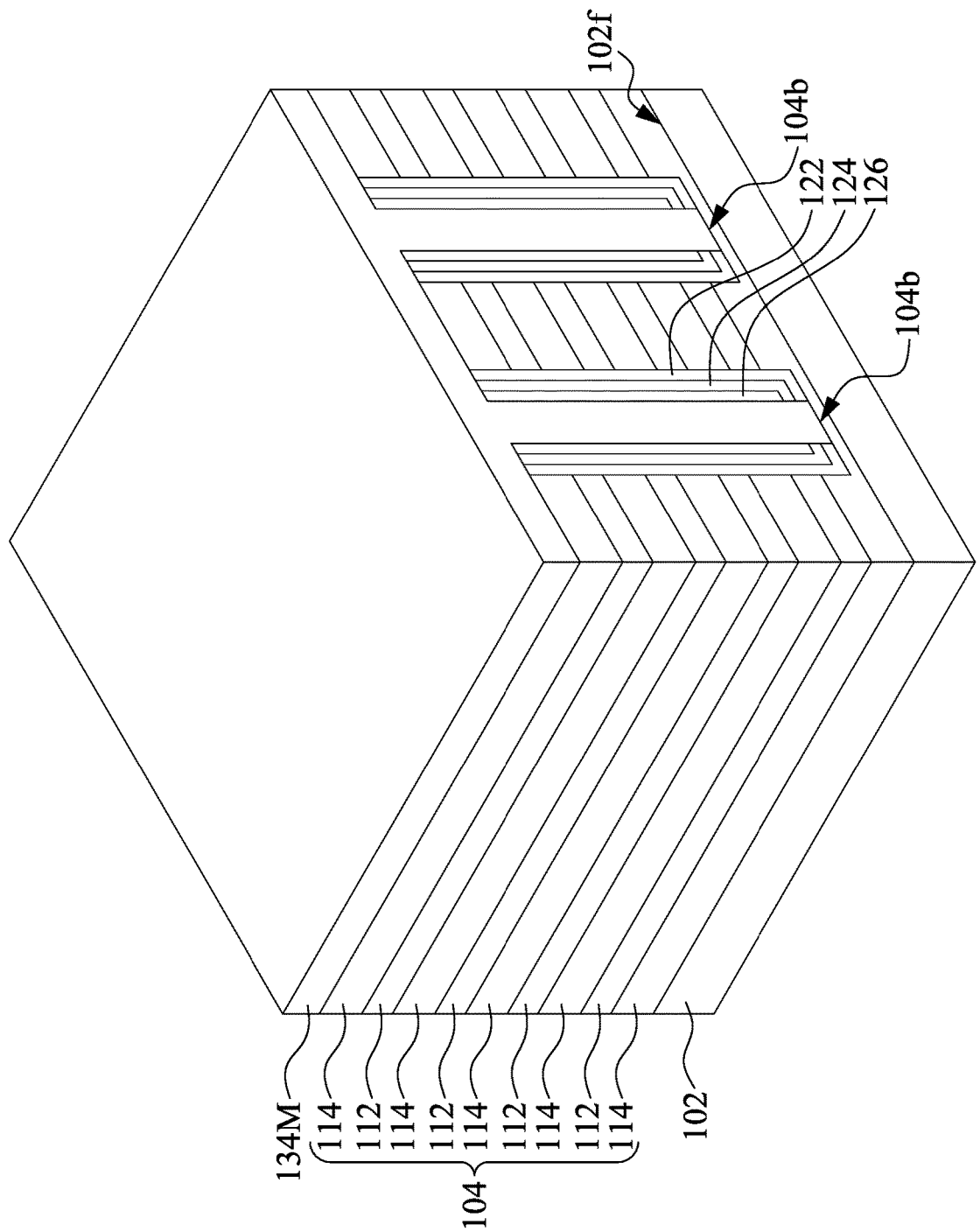
Figure 7:
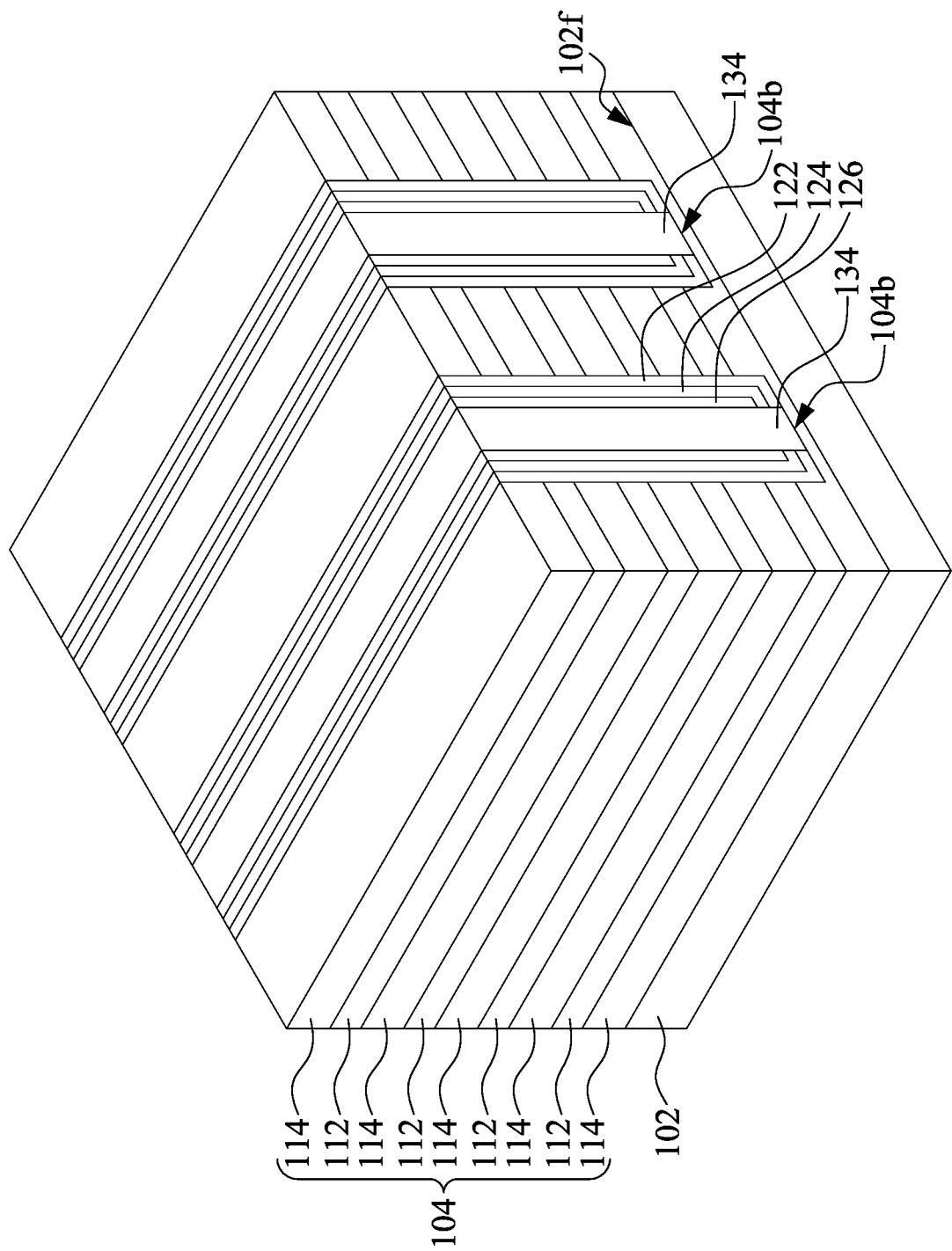

One of more filling layers (filling regions) 134 are formed to fill the trenches 104R, as shown in FIGS. 6 and 7. Initially, a filling material 134M of the filling layers 134 is deposited into the trenches 104R and over the upper surface of the interconnect structure 104. The filling material 134M may be formed of a dielectric material, such as oxide, nitride, oxynitride, or the like. In some embodiments, the filling material 134M comprises oxide, such as USG, FSG, BPSG, TEOS, SOG, HDP oxide, PETEOS, or the like. In some embodiments, the filing material 134M is formed of a same material as the insulating material 114, such as silicon oxide. The filling material 134M may be deposited using CVD, PVD, ALD, spin-on coating, or other suitable deposition methods.

Referring to FIG. 7, a planarization operation is performed to remove the excess portions of the filling material 134M. The filling layers 134 are formed within the respective trenches 104R accordingly. The planarization operation may also generate an upper surface of the filling layers 134 level with the upper surface of the interconnect structure 104. The planarization operation may be performed by mechanical grinding, CMP, chemical etch, plasma etch, or the like.

FIGS. 8 to 21 with postfixes 'A', 'B', 'C' and 'D' are perspective views, top views, and cross-sectional views of an intermediate stage of the method 100 subsequent to the step shown in FIG. 7, in accordance with some embodiments. In some embodiments, the figures with the postfix 'A' denote perspective views, the figures with the postfix 'B' denotes top views, and the figures with postfixes 'C' and 'D' denote first and second cross-sectional views of the perspective views of the same figure along respective sectional lines CC and DD, respectively.

Figure 8A:
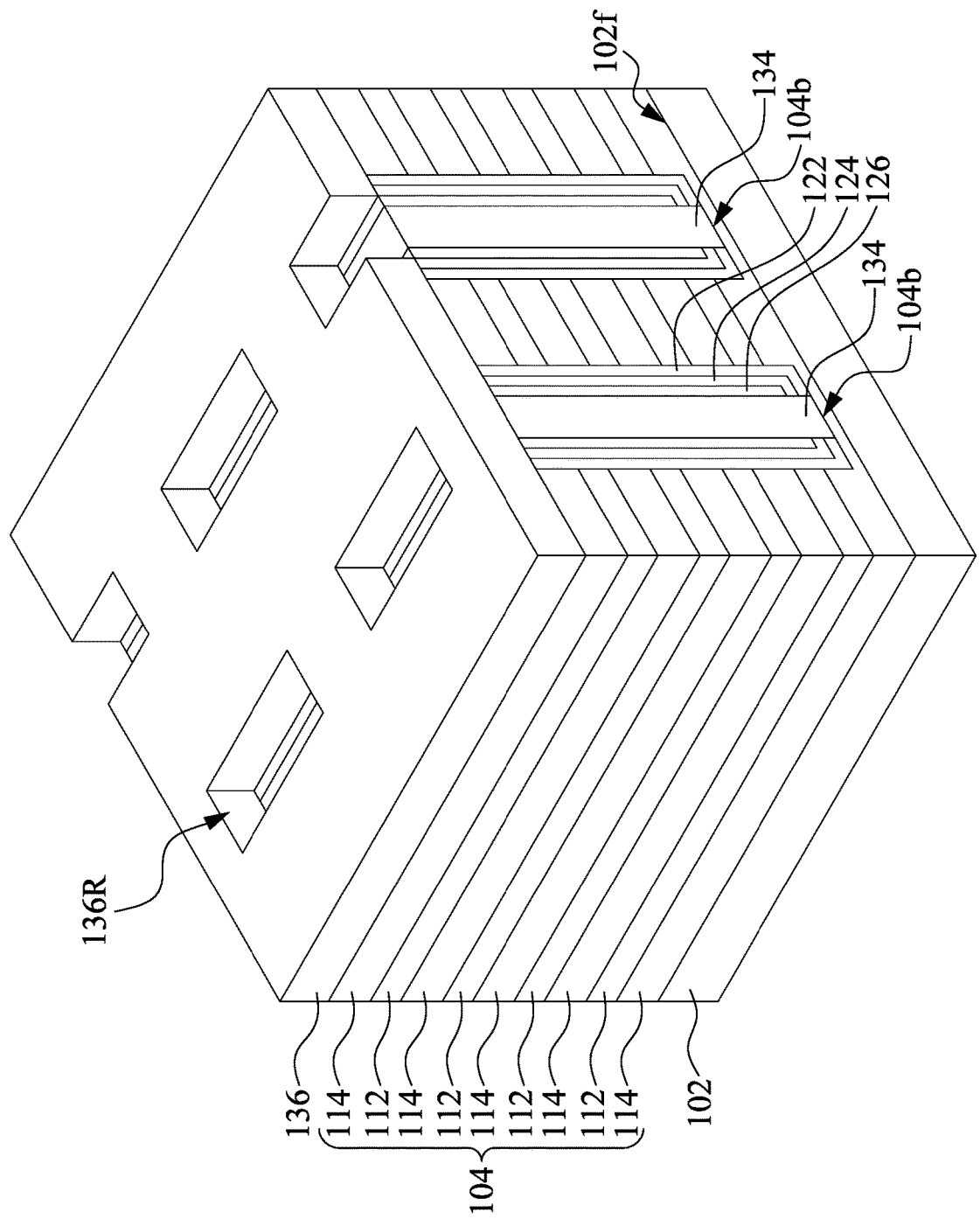
FIGS. 8A, 8B and 8C are a perspective view, a top view and a cross-sectional view, respectively, of an intermediate stage of a method of manufacturing a semiconductor structure, in accordance with some embodiments.
Figure 8B:
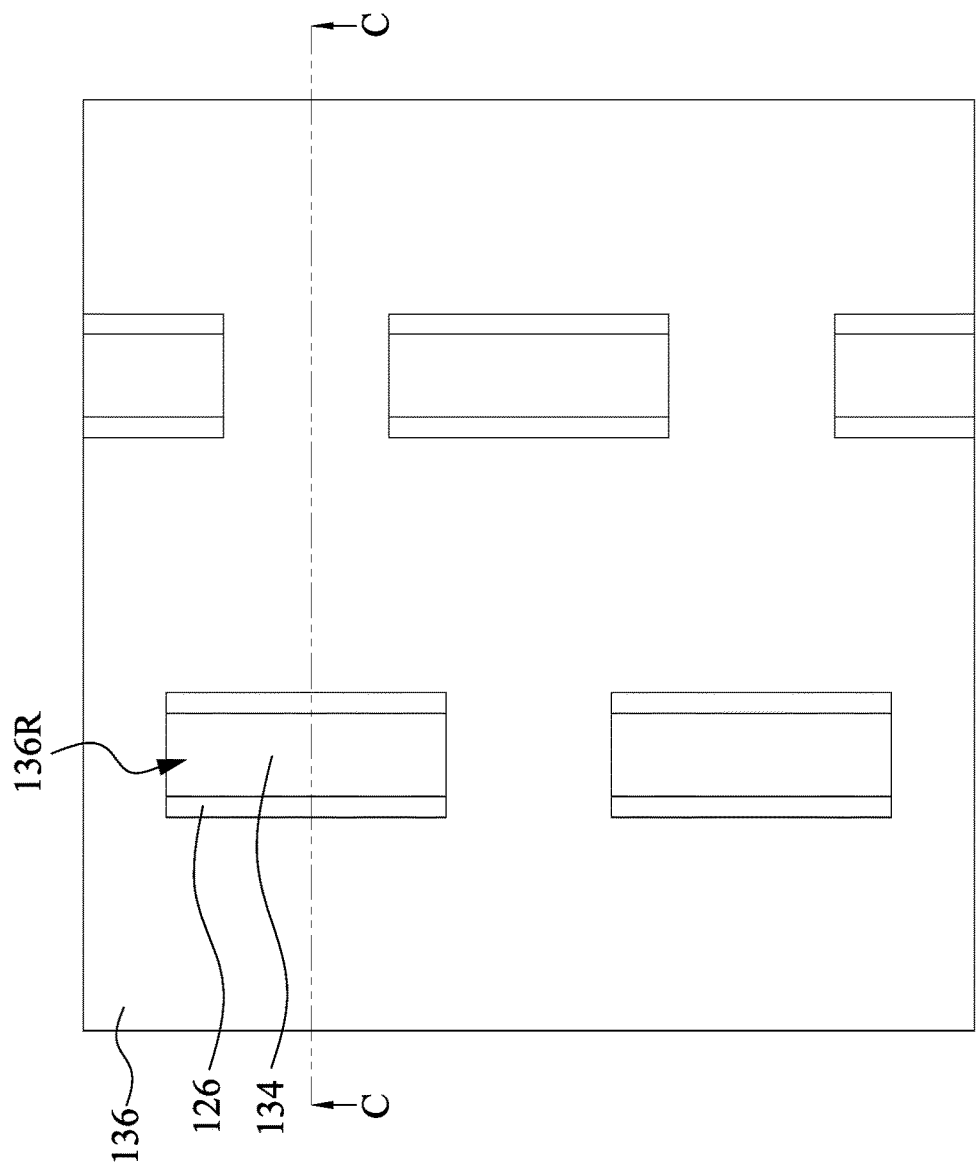
Figure 8C:
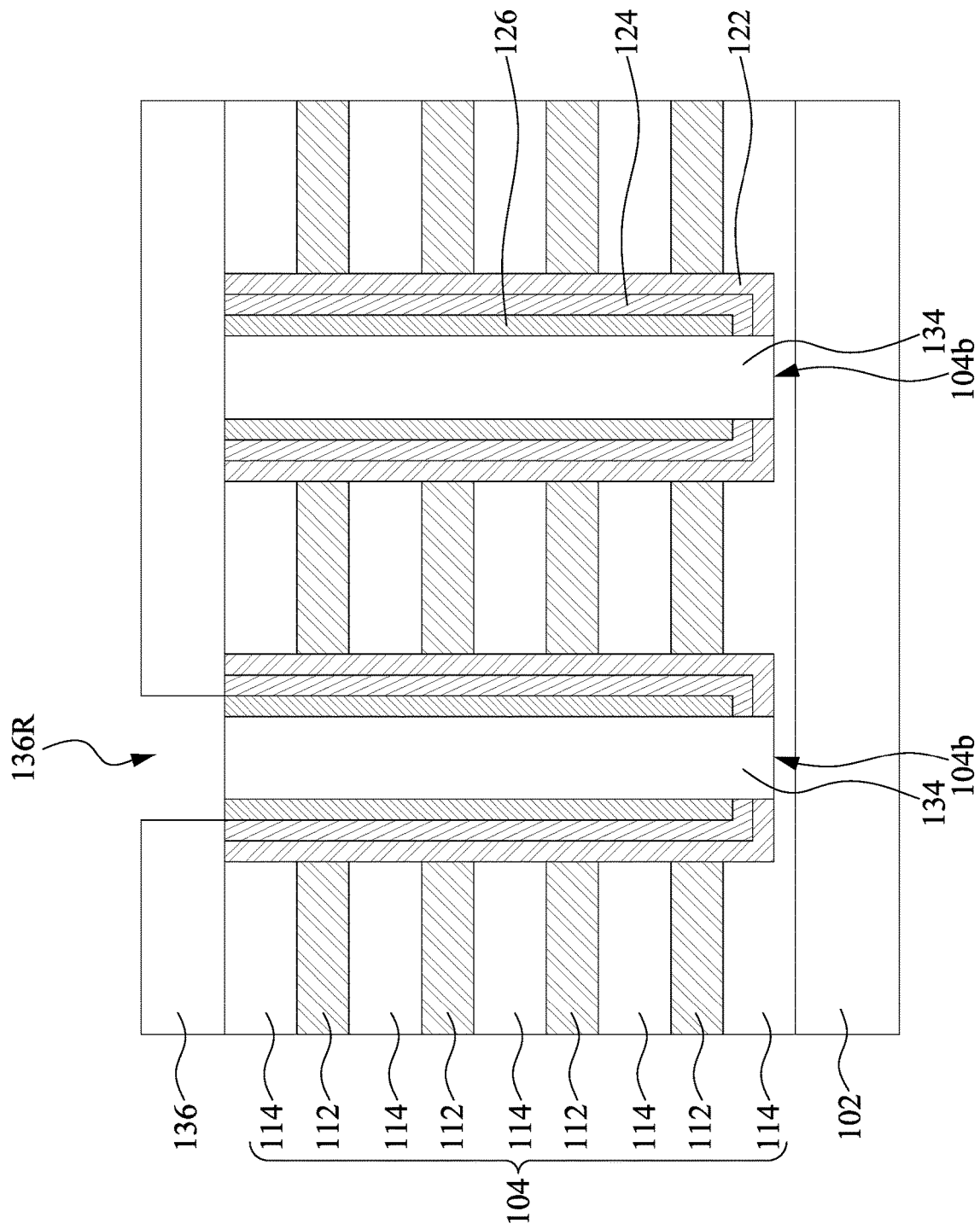

Referring to FIGS. 8A, 8B and 8C, a patterned mask layer 136 is formed over the semiconductor structure shown in FIG. 7. In some embodiments, the patterned mask layer 136 is a photoresist or a hard mask layer, e.g., formed of oxide or nitride. In some embodiments, the patterned mask layer 136 defines a plurality of openings 136R exposing portions of the filling layers 134 through a patterning operation, such as lithography and etching operations. Each of the openings 136R is aligned with one of the filling layers 134 and extends in a direction parallel to the direction in which the filling layers 134 or the trenches 104R extend from a top-view perspective. Portions of the filling layers 134 that are to be retained are covered by the patterned mask layer 136.

Figure 9A:
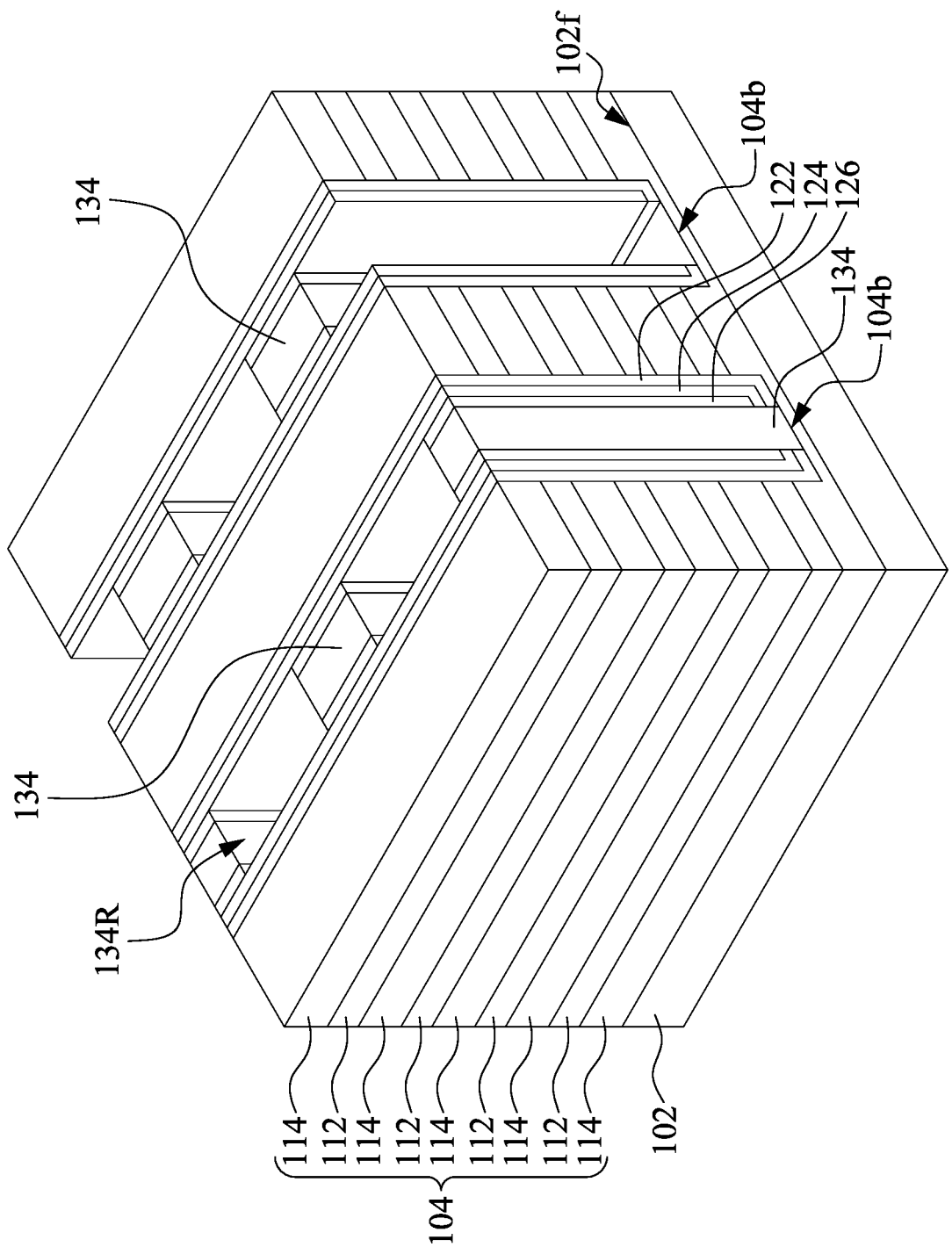
Figure 9B:
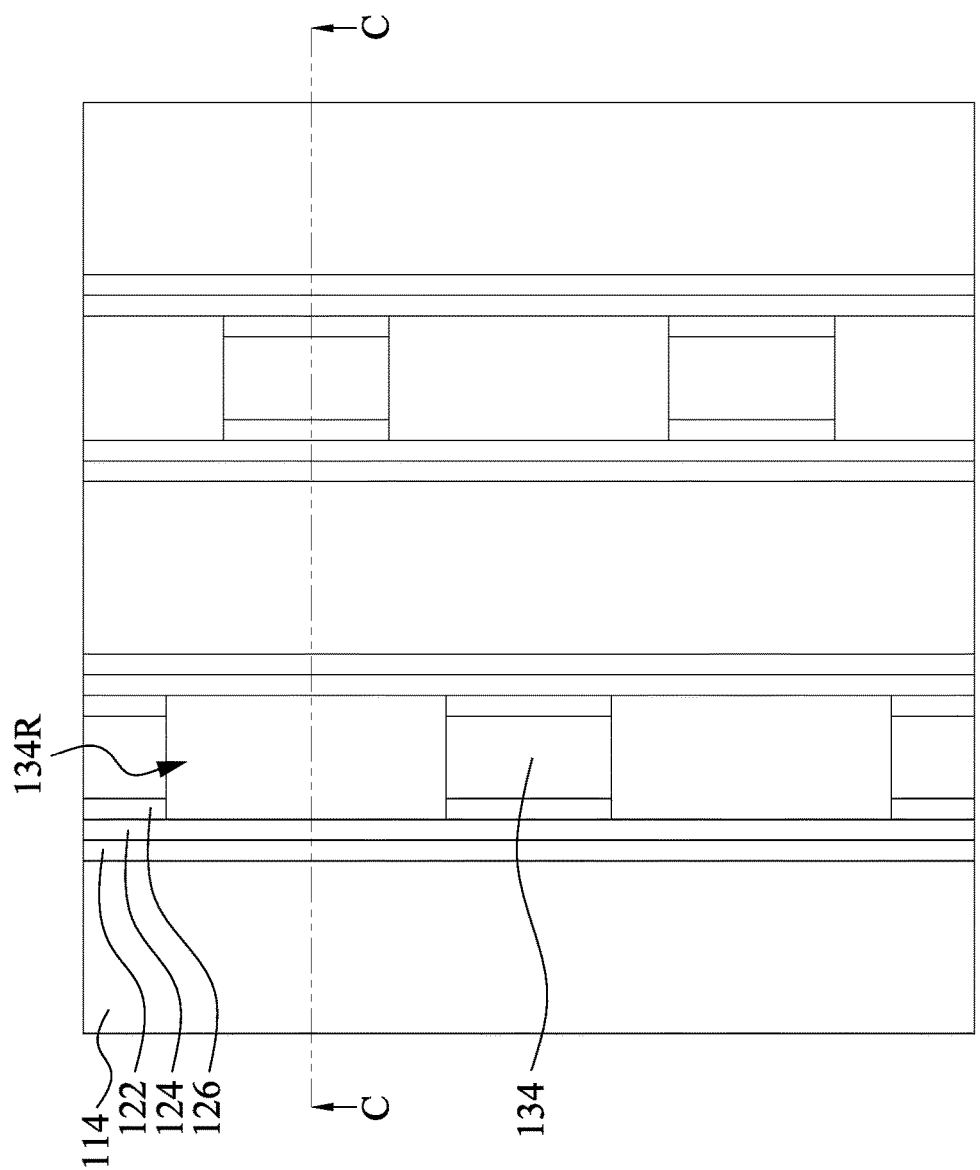

Referring to FIGS. 9A, 9B and 9C, an etching operation is performed to form trenches 134R within the filling layers 134. The etching is performed with the patterned mask layer 136 serving as an etching mask. In some embodiments, the trenches 134R extends through the interconnect structure 104 and remove portions of the filling layers 134 to expose the upper surface 102f of the substrate 102. In some embodiments, the boundaries of the openings 136R are defined by the sidewalls of the channel layer 124 that face the filling layers 134, and therefore the etching operation removes the buffer layer 126 when the trenches 134R are formed. The sidewalls of the channel layer 124 are exposed to the trenches 134R, as illustrated in FIG. 9C. The mask layer 136 may be removed of stripped after the trenches 134R are formed.

In some embodiments, each trench 134R is used for forming components therewithin of a memory cell of the memory array. The un-etched portions of the filling layers 134 within each trench 104R are configured to separate adjacent memory cells. Referring to FIG. 9B, in the un-etched portions of the filling layers 134, the buffer layer 126 is also kept unremoved between the filling layers 134 and the channel layer 124 and is exposed to the trenches 134R. In some embodiments, the trenches 134R in different rows of the trenches 104R are arranged in a staggered manner.

Figure 10A:
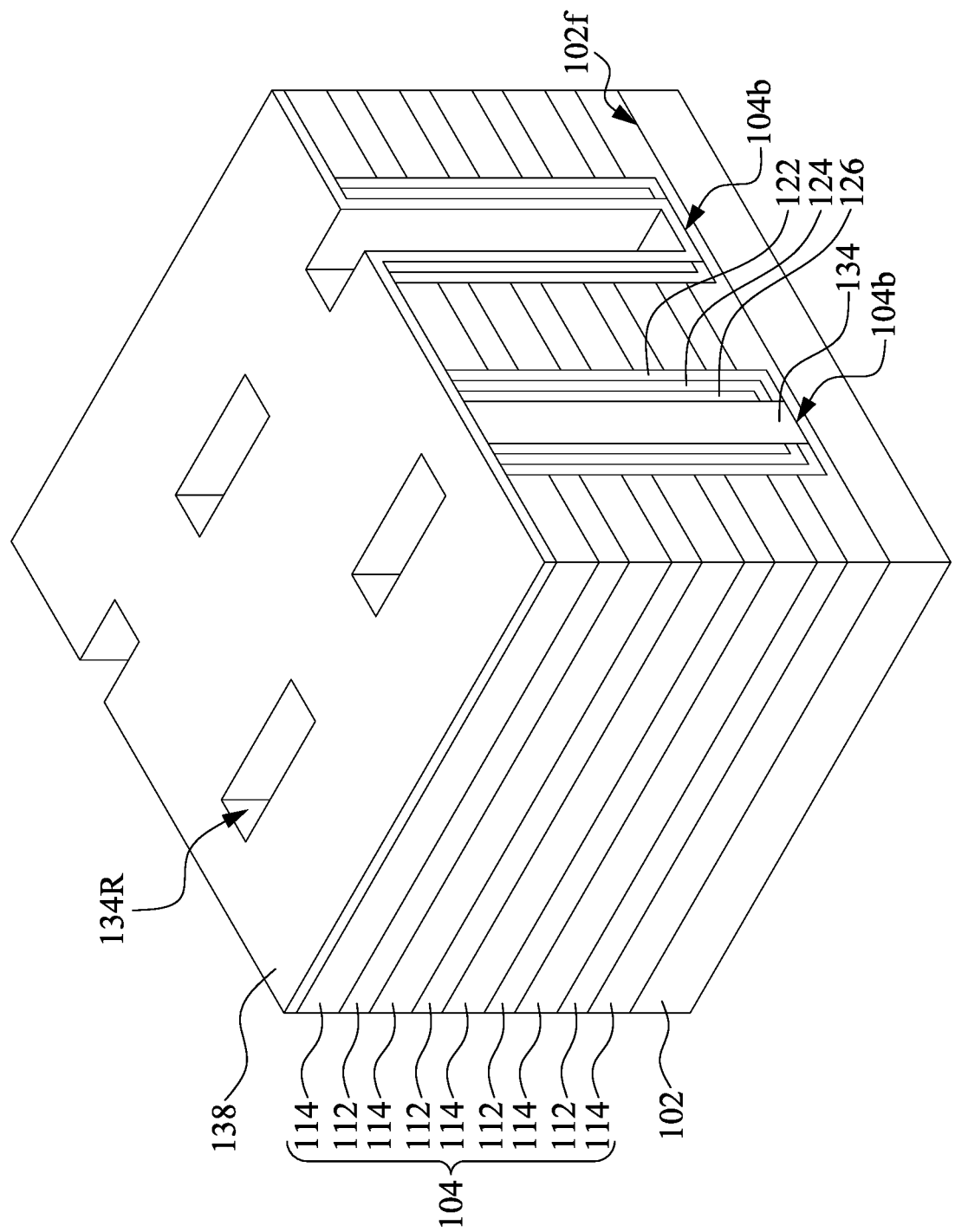
FIGS. 10A, 10B and 10C are a perspective view, a top view and a cross-sectional view, respectively, of an intermediate stage of a method of manufacturing a semiconductor structure, in accordance with some embodiments.
Figure 10B:
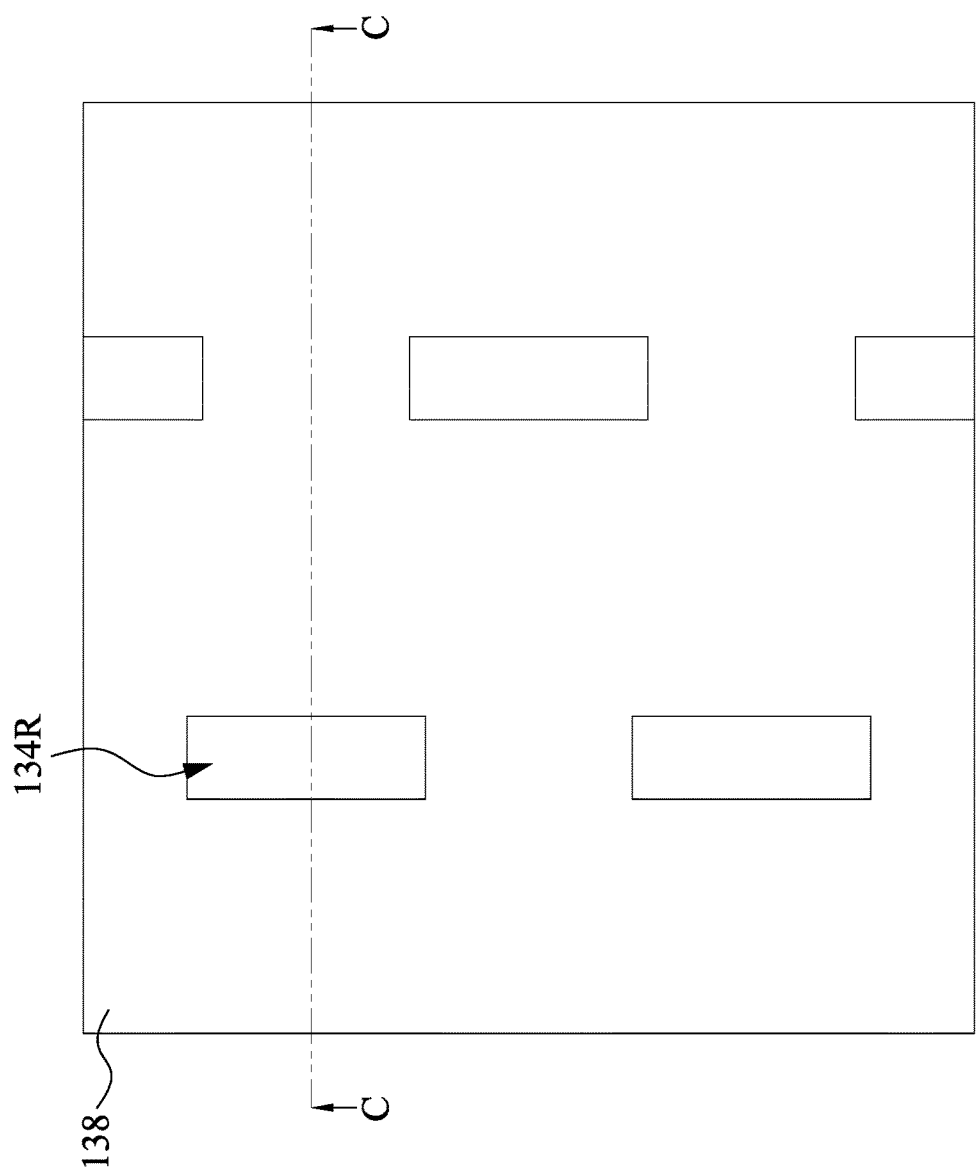
Figure 10C:
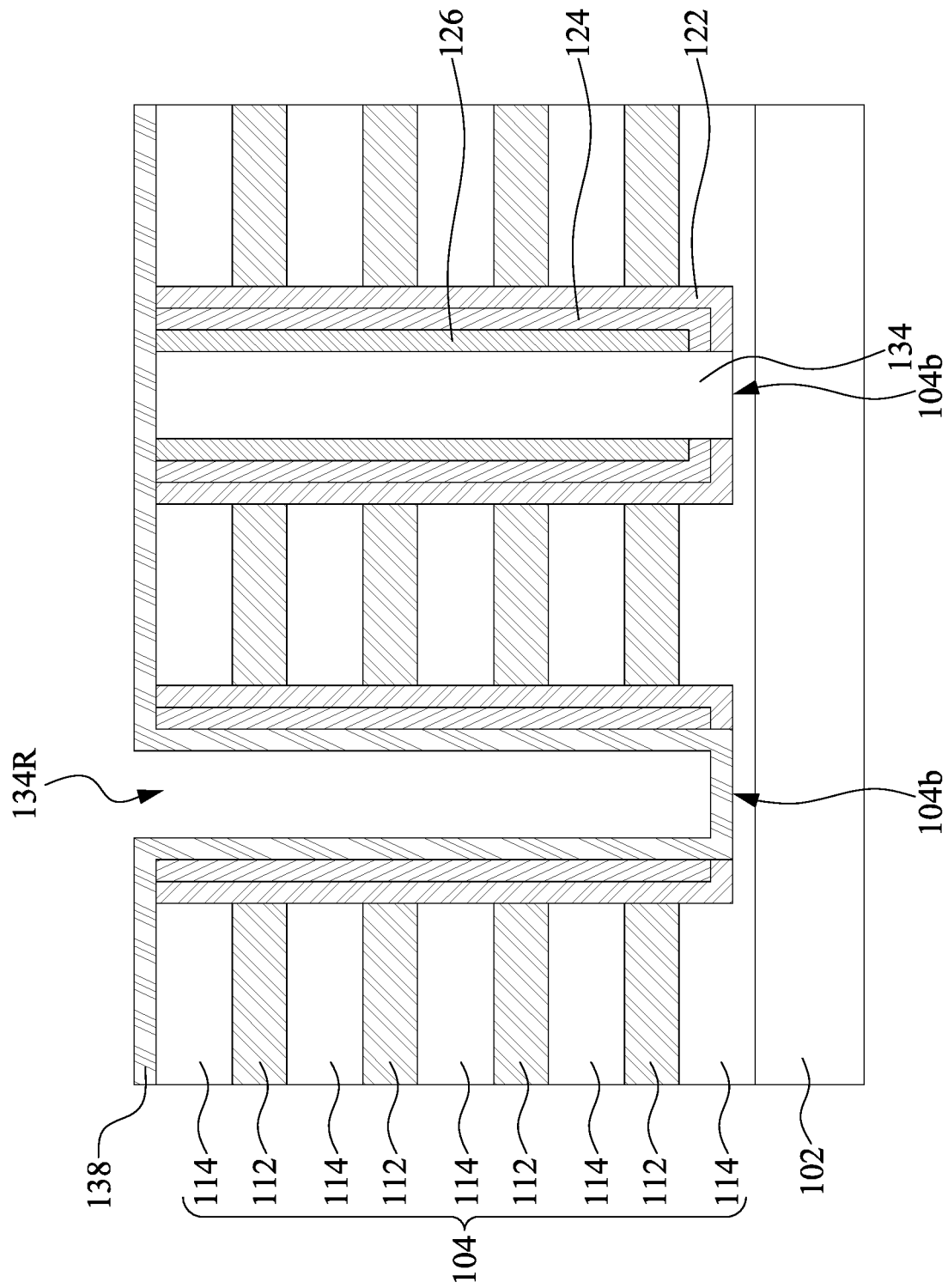

In FIGS. 10A, 10B and 10C, a liner 138 is deposited over the interconnect structure 104 and in the trenches 134R. The liner 138 covers the upper surface of the interconnect structure 104, the upper surface of the charge-trapping layer 122, and the upper surface of the channel layer 124. In some embodiments, the liner 138 covers sidewalls of the channel layer 124 in a conformal manner within the trenches 134R. In some embodiments, the liner 138 is configured as an etch stop layer for protecting the underlying channel layer 124 and the charge-trapping layer 122 during subsequent etching operations. In some embodiments, the liner 138 is formed of a dielectric material, such as silicon oxide, silicon nitride, silicon oxynitride, silicon carbide, or the like. In some embodiments, the liner is formed of a same material as the insulating material 114 or the filling material 134M.

Figure 11A:
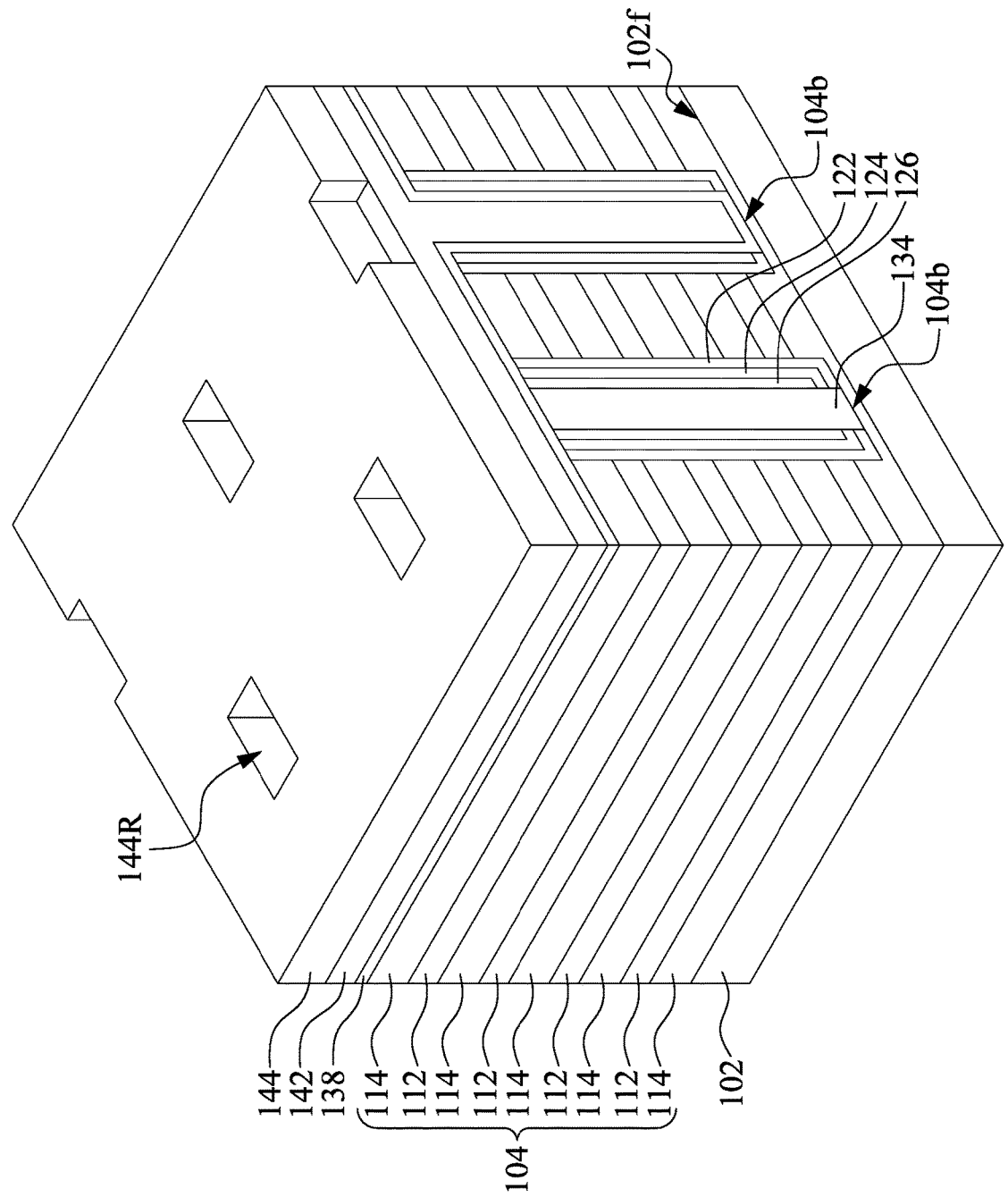
FIGS. 11A, 11B and 11C are a perspective view, a top view and a cross-sectional view, respectively, of an intermediate stage of a method of manufacturing a semiconductor structure, in accordance with some embodiments.
Figure 11B:
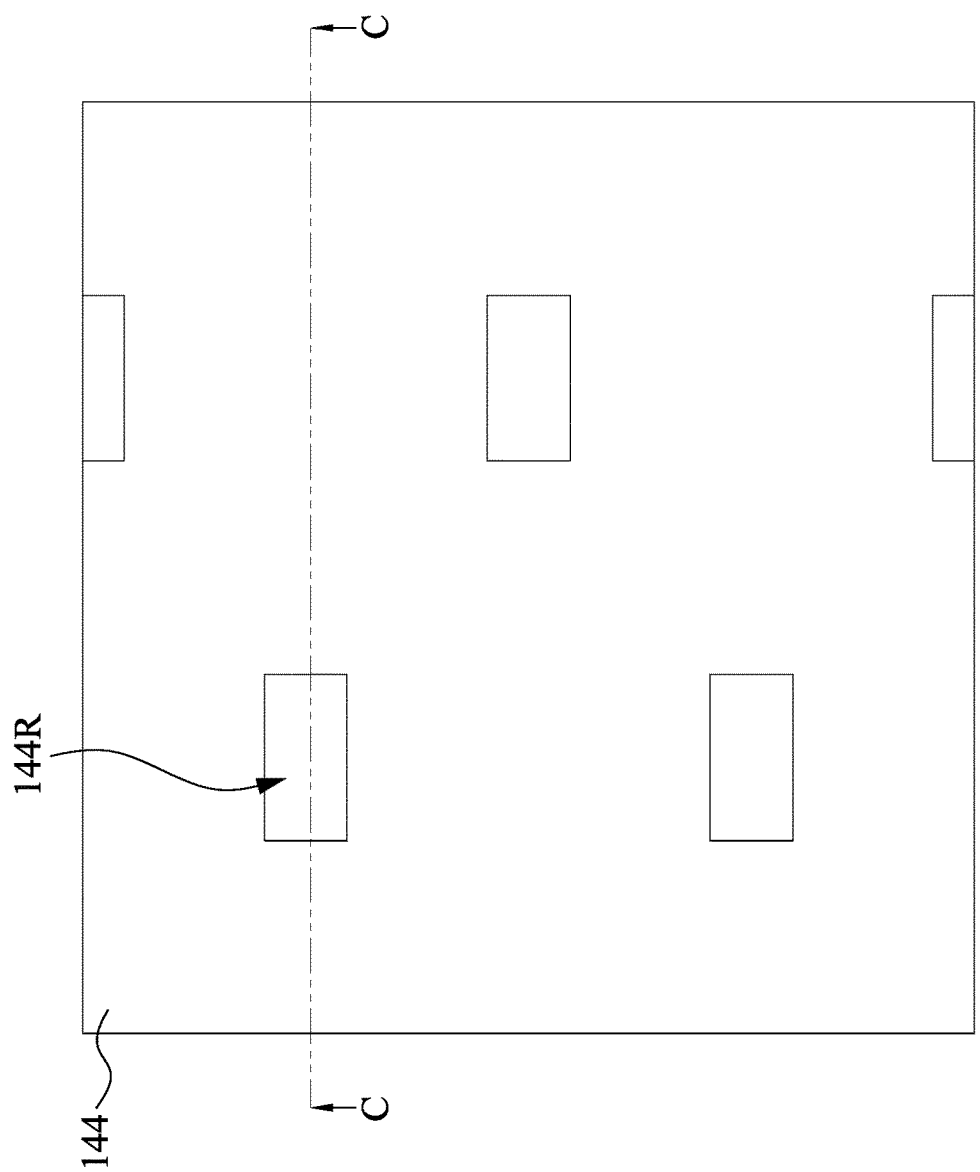
Figure 11C:
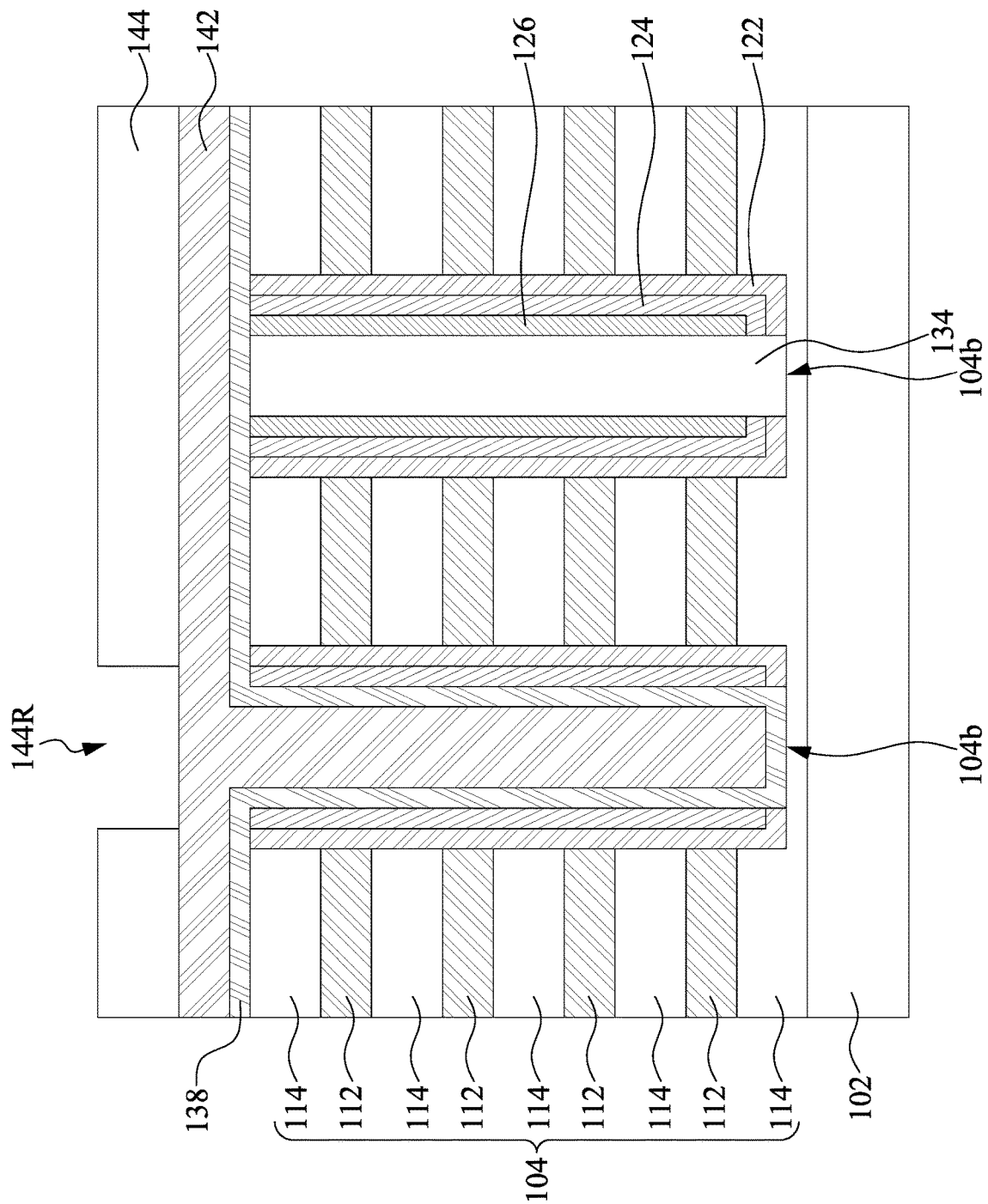

Referring to FIGS. 11A, 11B and 11C, one or more filling layers (filling regions) 142 are deposited over the liner 138 and in the trenches 134R. The trenches 134R is filled by the filling layer 142 accordingly. In some embodiments, the filling layers 142 serve as sacrificial layers and will be removed in subsequent operations. Initially, a filling material of the filling layers 142 is deposited into the trenches 134R and over the upper surface of the liner 138. The filling material of the filling layers 142 may be formed of a dielectric material, such as oxide, nitride, oxynitride, or the like. In some embodiments, the filling material of the filling layers 142 comprises oxide, such as USG, FSG, BPSG, TEOS, SOG, HDP oxide, PETEOS, or the like. In some embodiments, the filing material of the filling layers 142 is formed of a same material as the insulating material 114, the filling layer 134 or the liner 138. The filling material of the filling layer 142 may be deposited using CVD, PVD, ALD, spin-on coating, or other suitable deposition methods.

Subsequently, a planarization operation is performed to remove the excess portions of the filling material of the filling layers 142. The planarization operation may also generate an upper portion of the filling layer 142 with uniform thicknesses over the liner 138. The planarization operation may be performed by mechanical grinding, CMP, chemical etch, plasma etch, or the like.

A patterned mask layer 144 is formed over the filling layer 142. In some embodiments, the patterned mask layer 144 is a photoresist or a hard mask layer, e.g., formed of oxide or nitride. In some embodiments, the patterned mask layer 144 defines a plurality of openings 144R exposing portions of the filling layer 142 through a patterning operation, such as lithography and etching operations. In some embodiments, the etching operations include a dry etch, a wet etch, or a combination thereof, e.g., a reactive ion etch (RIE). Each of the openings 144R is arranged within each memory cell and may extend in a direction perpendicular the direction in which the charge-trapping layer 122 or the filling layer 142 extends from a top-view perspective. Referring to FIGS. 10A and 10B, the filling layer 142 has a shape occupying the trenches 134R. Therefore, the opening 144R exposes and crosses the respective filling layer 142 from a top-view perspective.

Figure 12A:
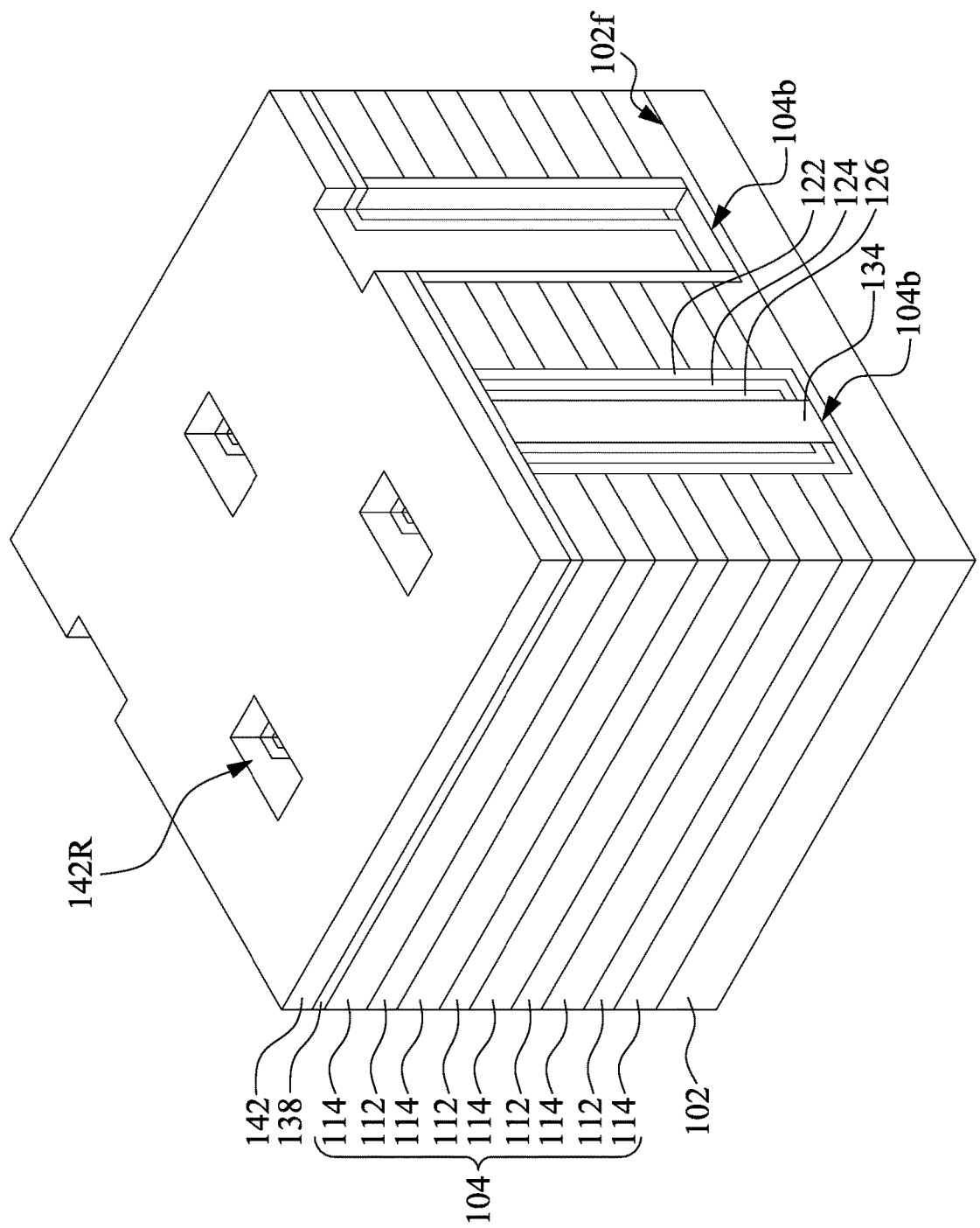
FIGS. 12A, 12B and 12C are a perspective view, a top view and a cross-sectional view, respectively, of an intermediate stage of a method of manufacturing a semiconductor structure, in accordance with some embodiments.
Figure 12B:
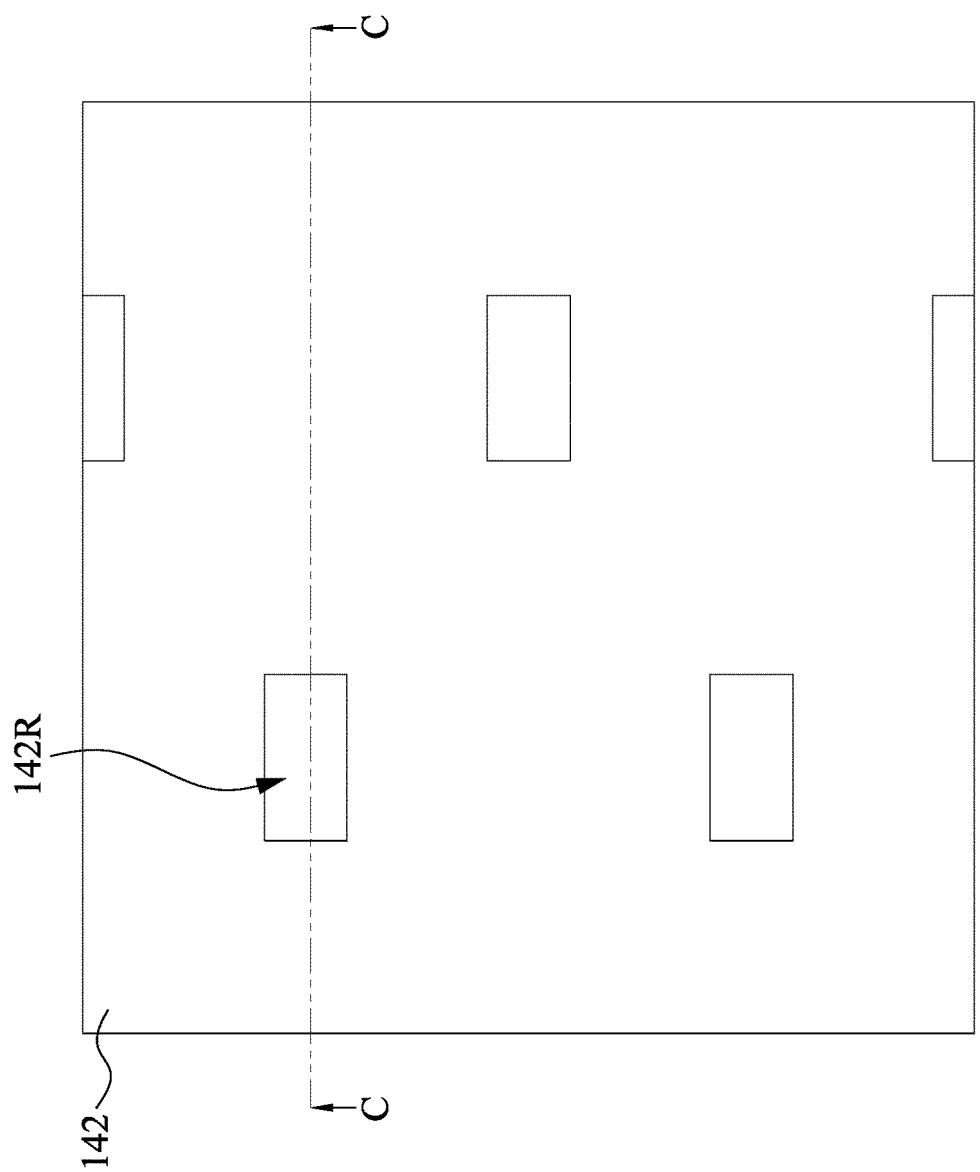
Figure 12C:
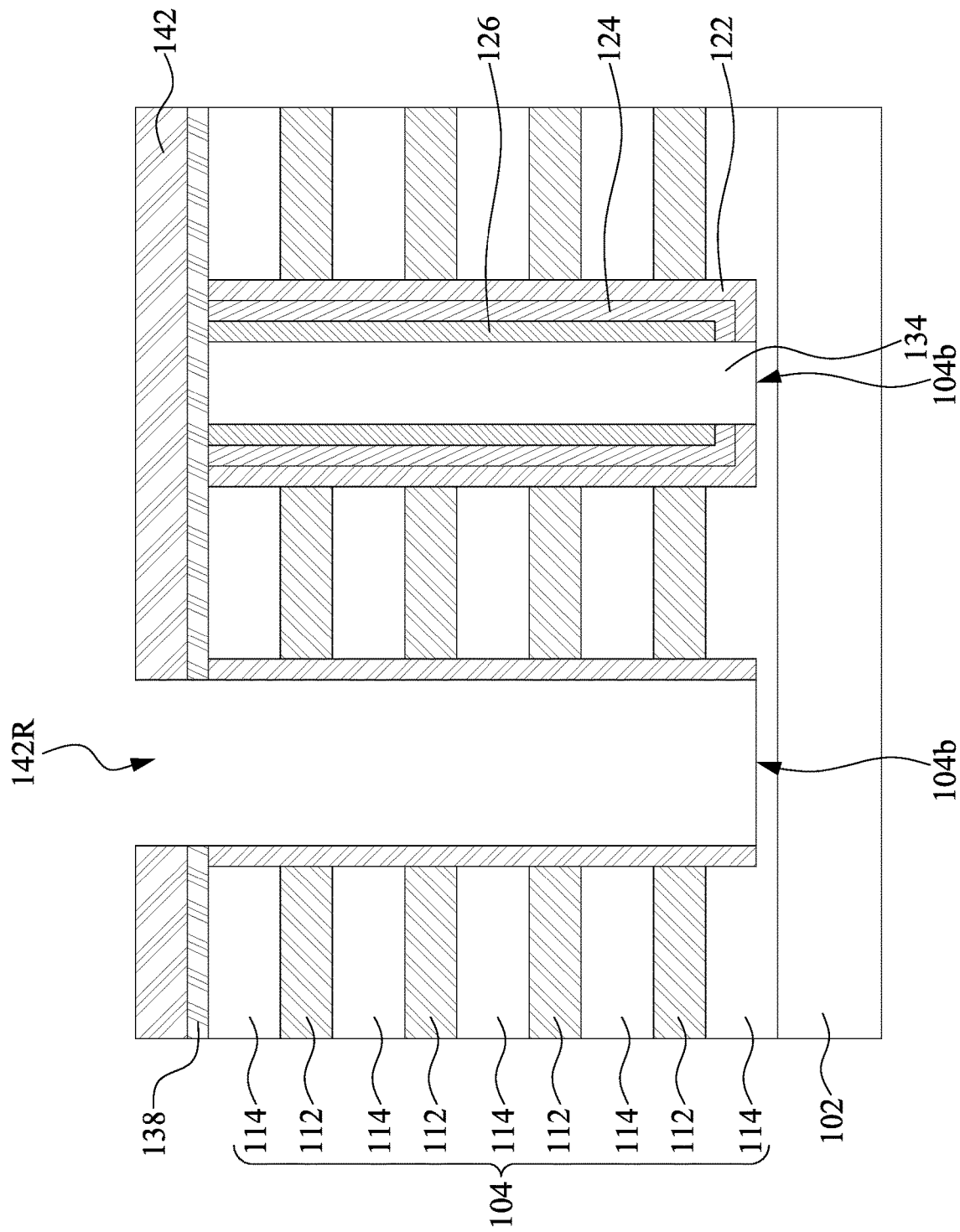

Referring to FIGS. 12A, 12B and 12C, an etching operation is performed to form trenches 142R in the filling layers 142. The etching is performed with the patterned mask layer 144 serving as an etching mask. In some embodiments, the etch extends through the interconnect structure 104 and exposes the upper surface 102f or 104b of the substrate 102. In some embodiments, the boundaries of the openings 144R are aligned with the sidewalls of the charge-trapping layer 122 facing the trenches 142R, and therefore the etching operation removes portions of the channel layer 124 and portions of the liner 138 during the forming of the trenches 142R. The sidewalls of the charge-trapping layer 122 are exposed to the trenches 142R accordingly, as illustrated in FIG. 12C. The patterned mask layer 144 may be removed of stripped after the trenches 142R are formed.

Figure 13A:
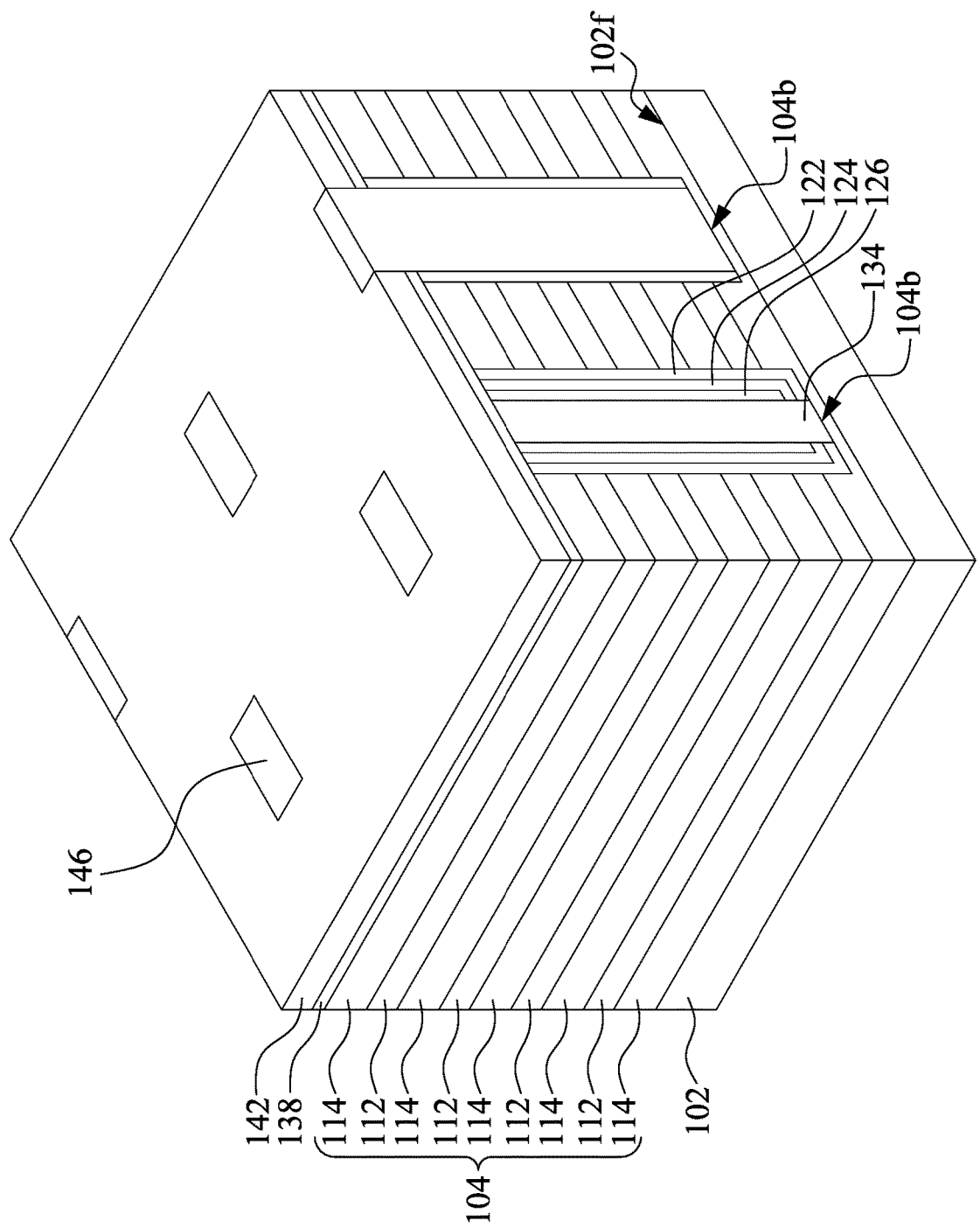
FIGS. 13A, 13B and 13C are a perspective view, a top view and a cross-sectional view, respectively, of an intermediate stage of a method of manufacturing a semiconductor structure, in accordance with some embodiments.
Figure 13B:
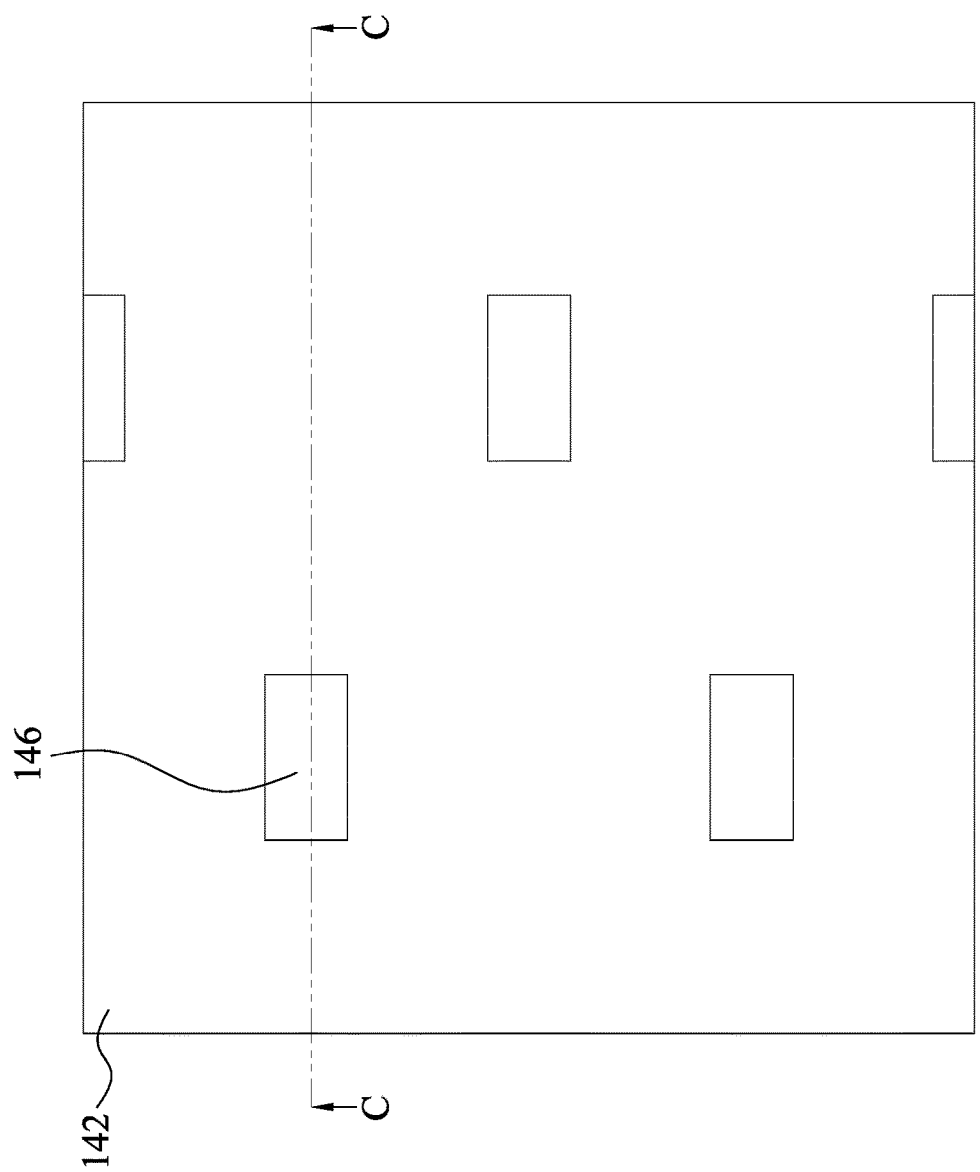
Figure 13C:
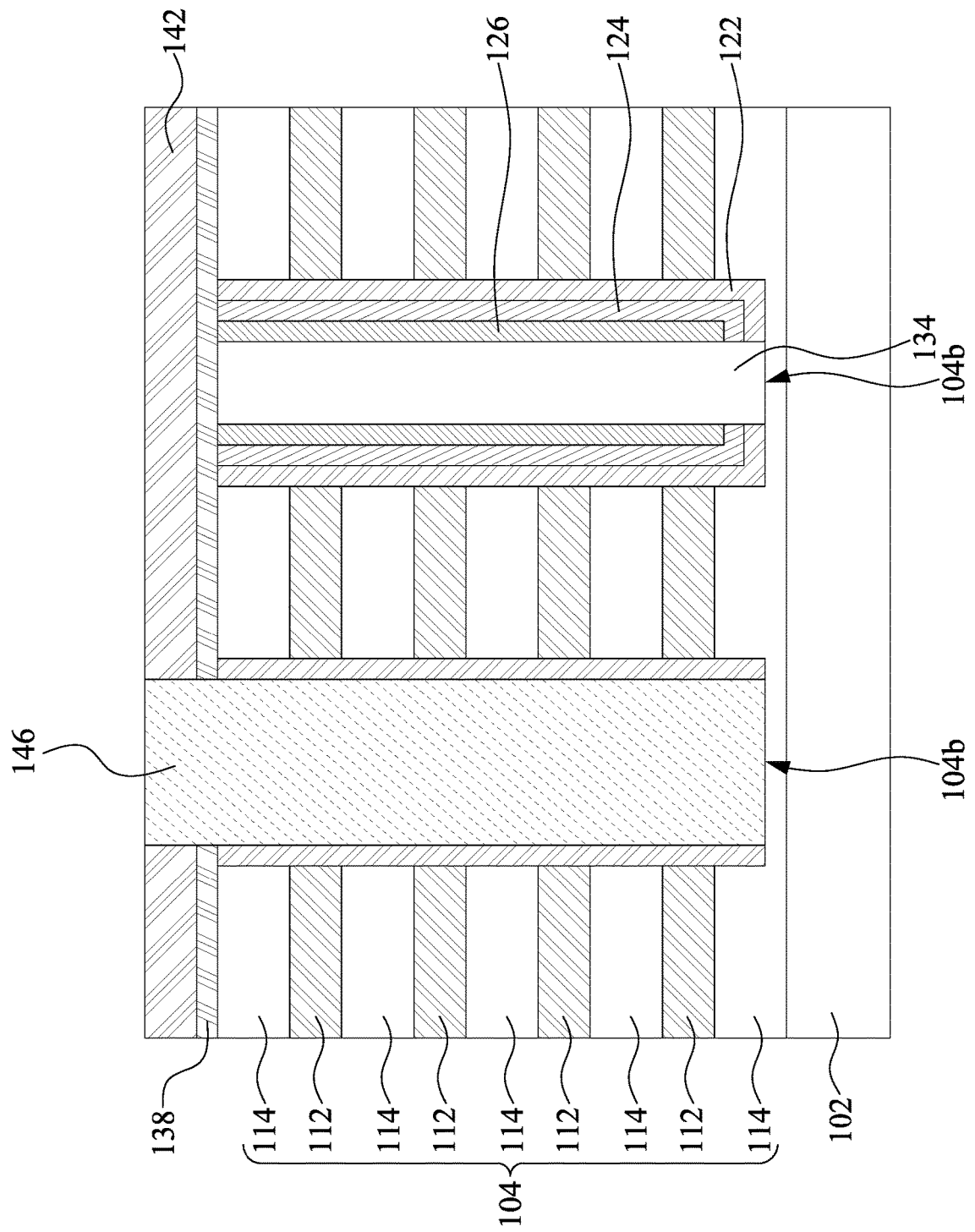

Referring to FIGS. 13A, 13B and 13C, one or more filling layers (filling regions) 146 are deposited in the trenches 142R. In some embodiments, the filling layer 146 serves as a spacer or partition region in a memory cell between two source/drain contacts of a memory cell and electrically isolates these two source/drain contacts. Initially, a filling material of the filling layers 146 is deposited into the trenches 142R and over the upper surface of the filling layers 142. The filling material of the filling layer 146 may be formed of a dielectric material, such as oxide, nitride, oxynitride, or the like. In some embodiments, the filling material of the filling layer 146 comprises oxide, such as USG, FSG, BPSG, TEOS, SOG, HDP oxide, PETEOS, or the like. In some embodiments, the filing material of the filling layer 146 is formed of a same material as the insulating material 114, the filling layers 134 or 142 or the liner 138. The filling material of the filling layer 146 may be deposited using CVD, PVD, ALD, spin-on coating, or other suitable deposition methods.

Subsequently, a planarization operation is performed to remove the excess portions of the filling material of the filling layer 146 over the surface of the filling layer 142. The planarization operation may also generate an upper surface of the filling layer 146 level with the upper surface of the filling layer 142. The planarization operation may be performed by mechanical grinding, CMP, chemical etch, plasma etch, or the like.

Figure 14A:
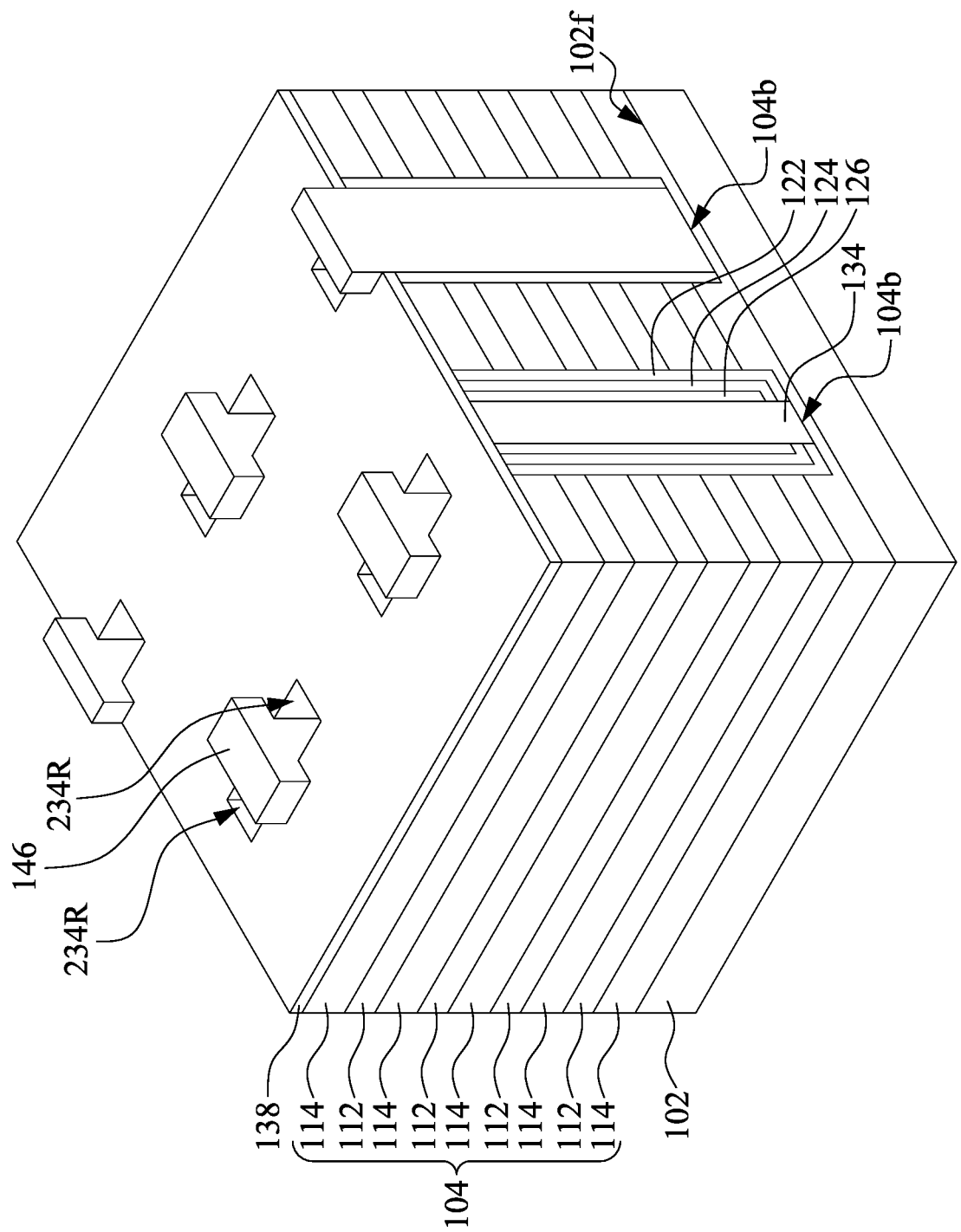
FIGS. 14A, 14B, 14C and 14D are a perspective view, a top view and two cross-sectional views, respectively, of an intermediate stage of a method of manufacturing a semiconductor structure, in accordance with some embodiments.
Figure 14B:
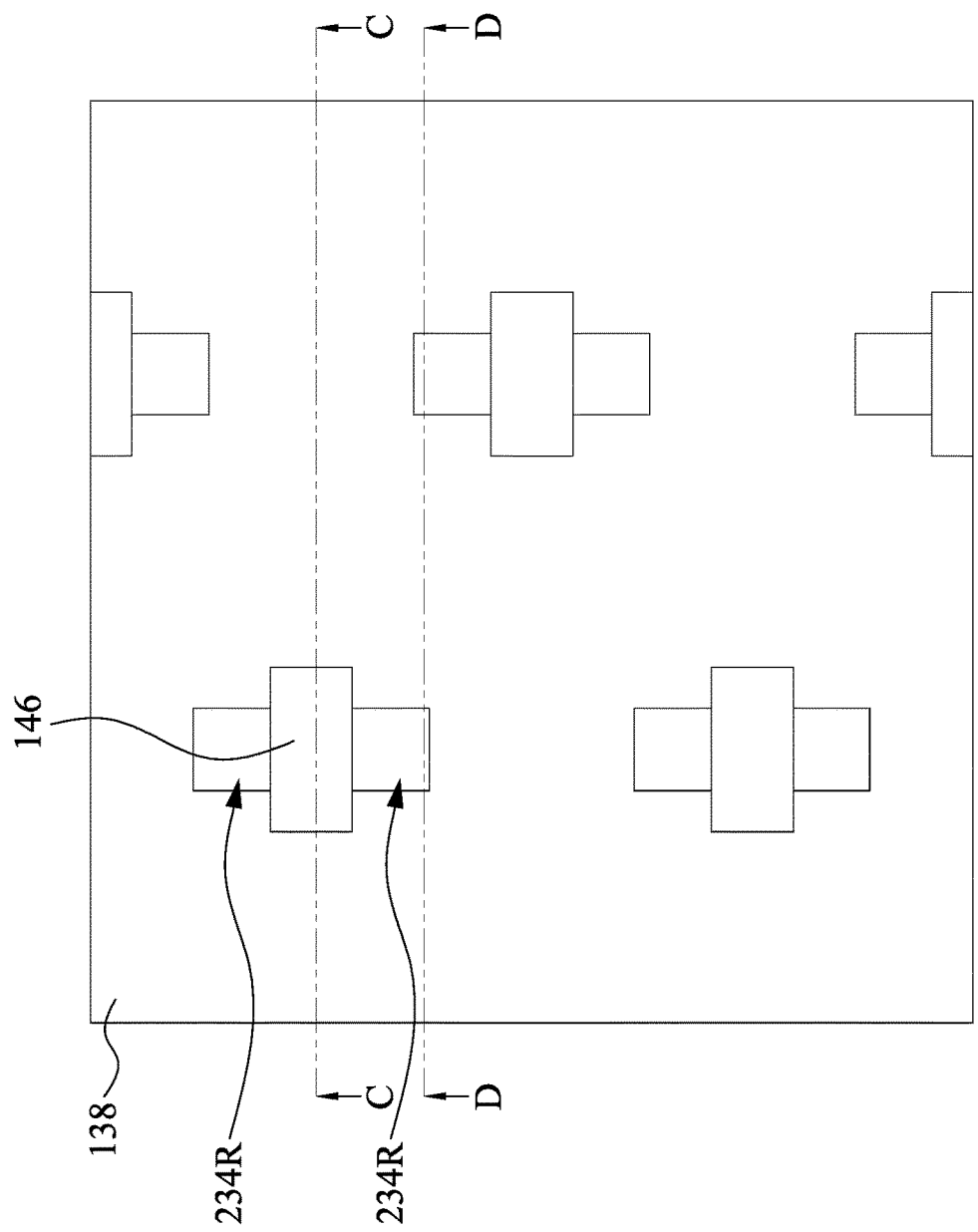
Figure 14C:
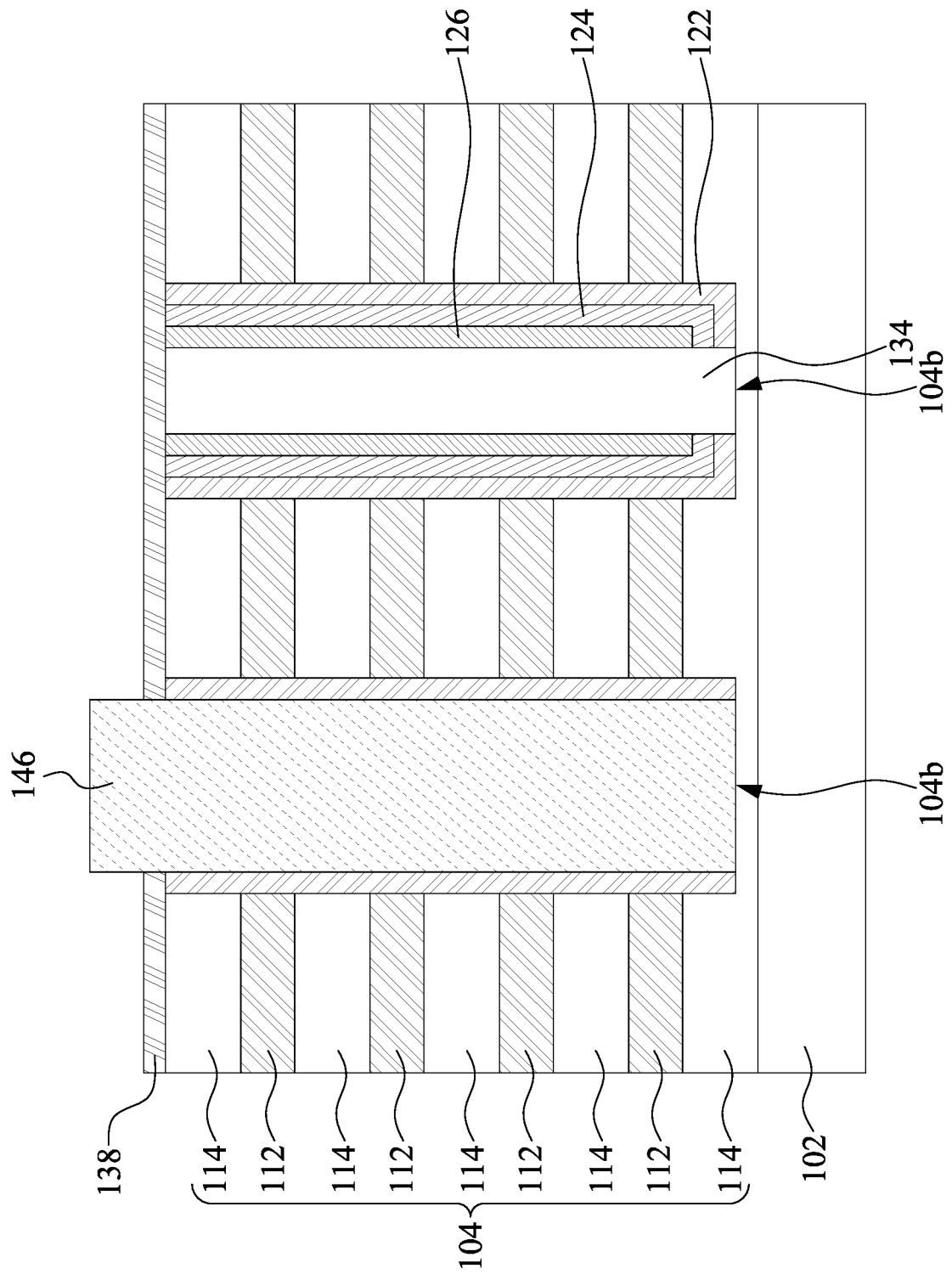
Figure 14D:
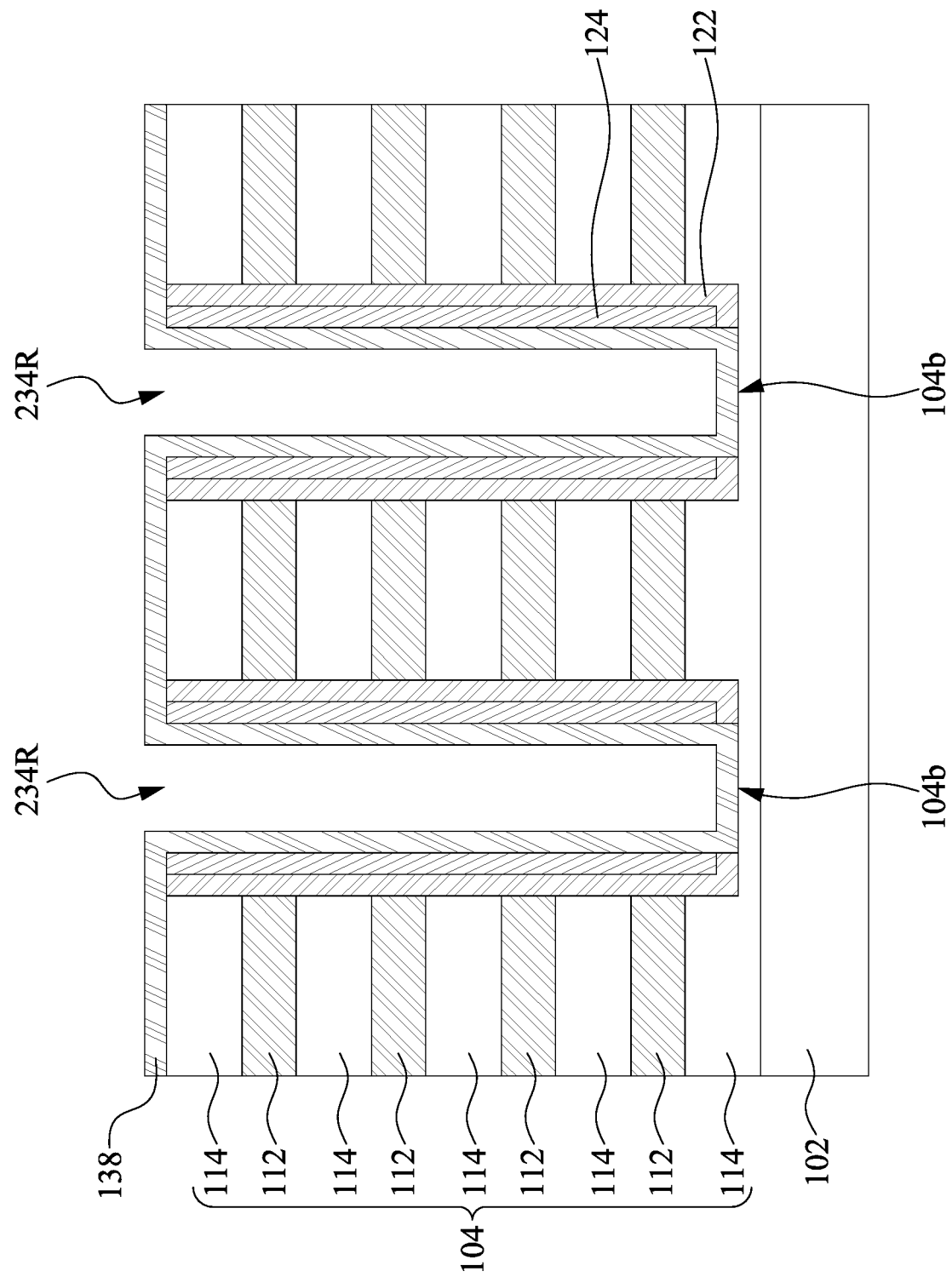
Figure 15A:
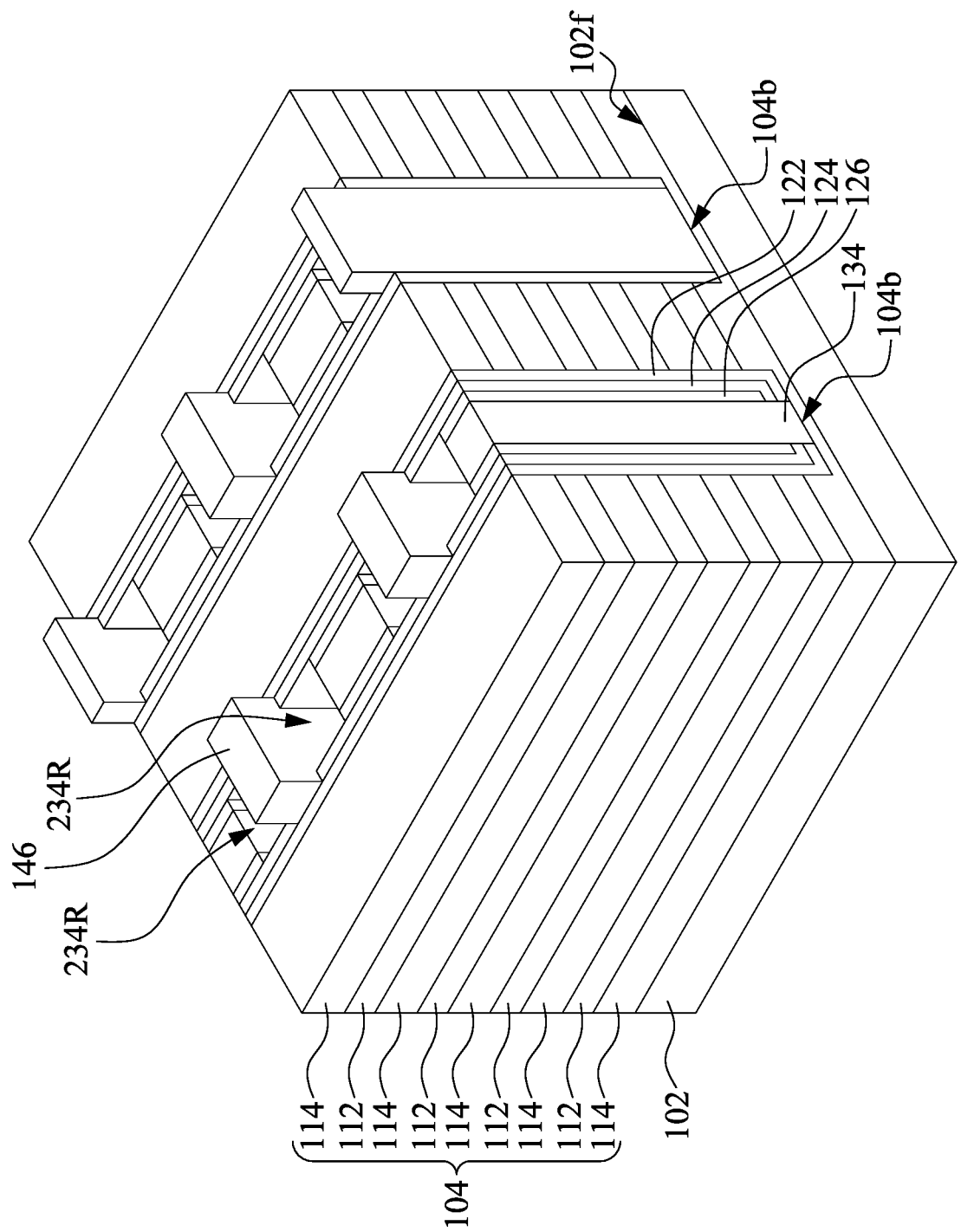
FIGS. 15A, 15B, 15C and 15D are a perspective view, a top view and two cross-sectional views, respectively, of an intermediate stage of a method of manufacturing a semiconductor structure, in accordance with some embodiments.
Figure 15B:
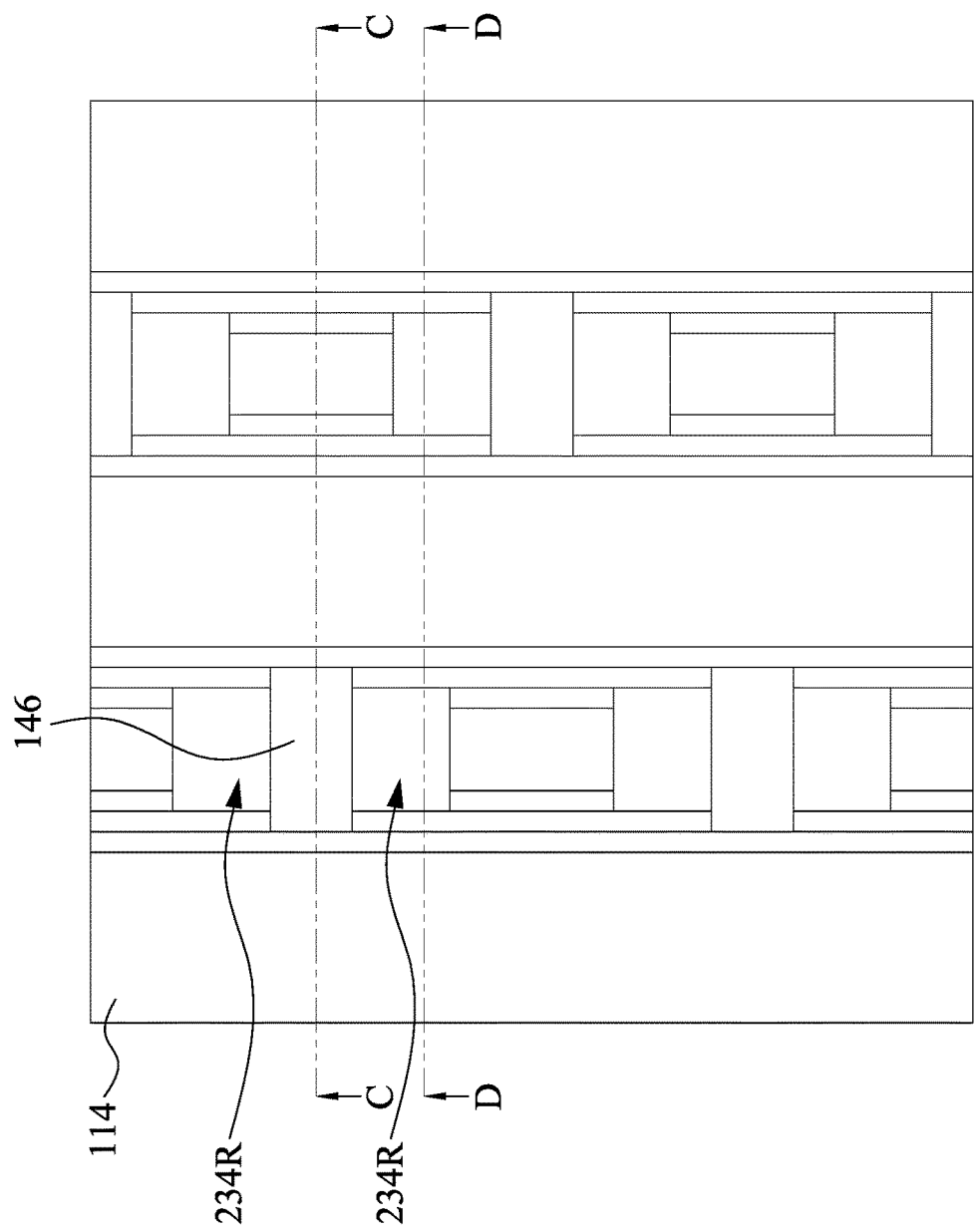
Figure 15C:
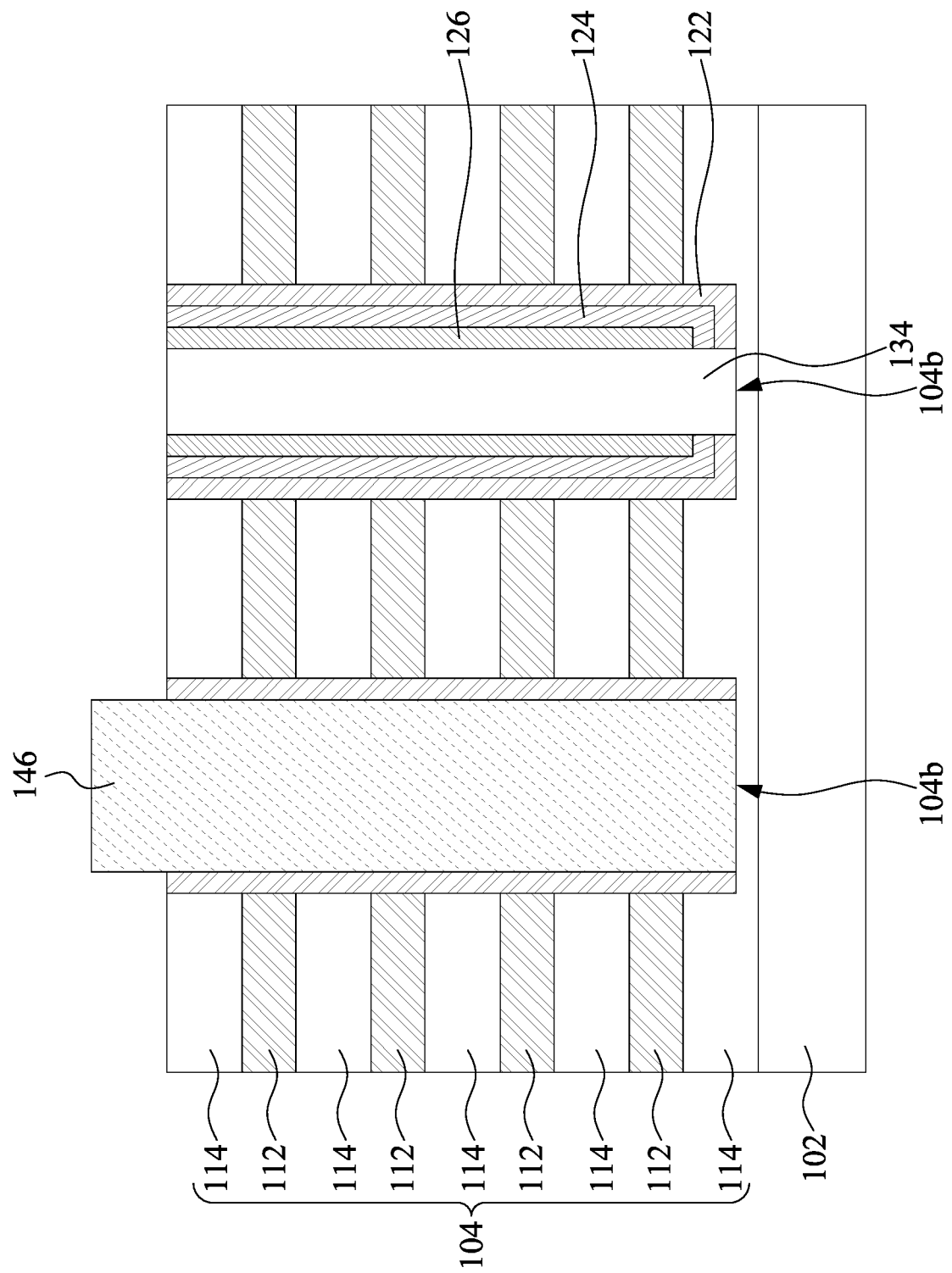
Figure 15D:
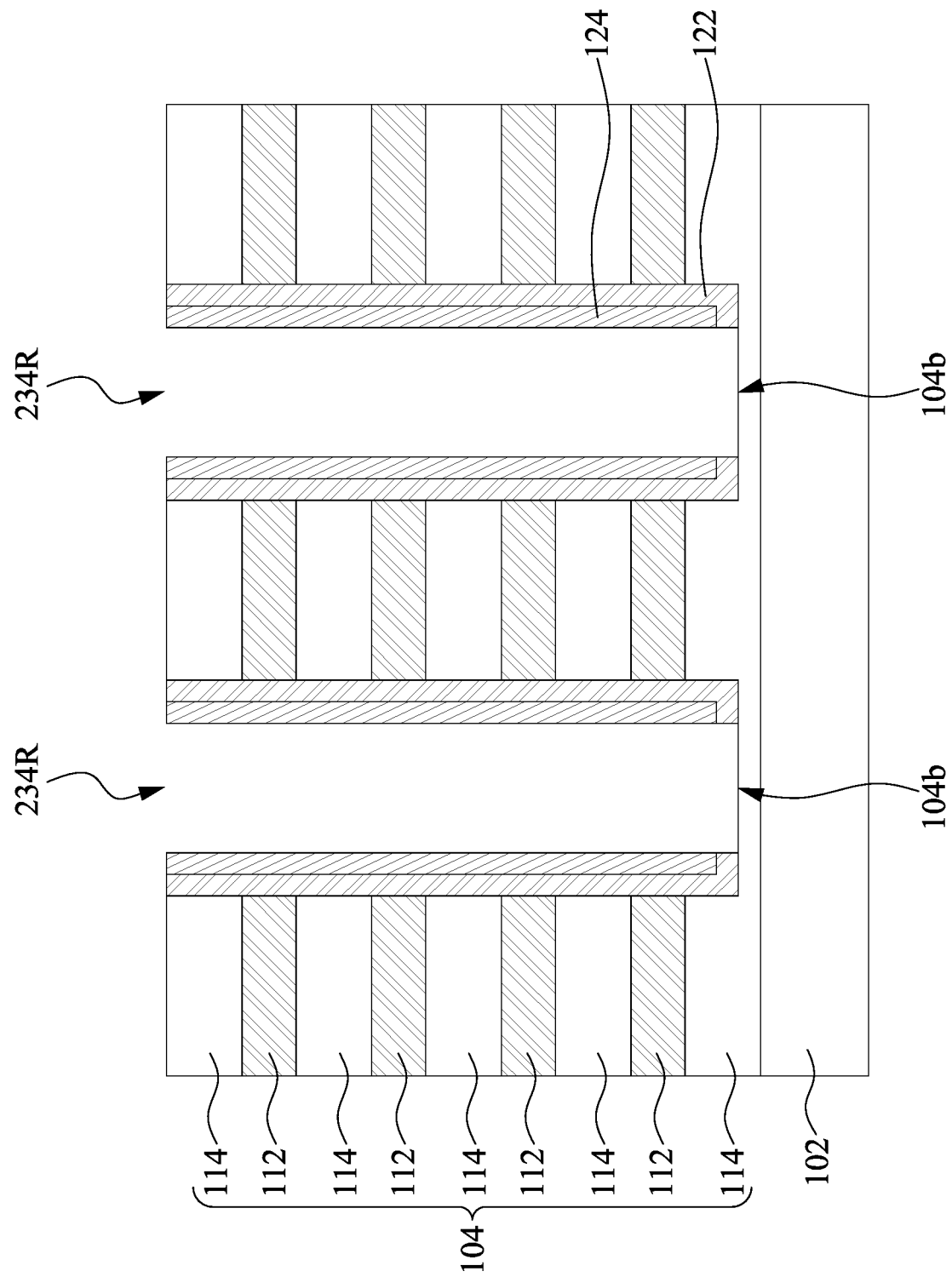

Referring to FIGS. 14A-14D, an etching operation is performed to remove the filling layers 142 for forming trenches 234R. The etching may be performed using the filling layer 146 and the liner 138 as etching masks. In some embodiments, the etching operations include a dry etch, a wet etch, or a combination thereof, e.g., a reactive ion etch (RIE). In some embodiments, the etch removes the remaining portions of the filling layers 142 and exposes the upper surface and sidewalls of the liner 138, as illustrated in FIG. 14D. In some embodiments, the filling layer 146 is kept substantially intact during the etching of the filling layer 142 and thus the upper surface of the filling layer 146 is higher than the upper surface of the liner 138, as illustrated in FIG. 14C. In some other embodiments, portions of the filling layer 146 are etched during the etching of the filling layer 142. In some embodiments, a thickness of the filling layer 146, e.g., a top portion of the filling layer 146, is etched during the etching operation of the filling layer 142.

Referring to FIGS. 15A-15D, an etching operation is performed to remove the liner 138 and to expose the channel layer 124 to the trenches 234R. The etching may be performed using the insulating material 114 of the interconnect structure 104 as an etching mask. In some embodiments, the etching operations include a dry etch, a wet etch, or a combination thereof, e.g., RIE. In some embodiments, referring to FIGS. 14C and 15C, the etch exposes the upper surface of the interconnect structure 104. In some embodiments, referring to FIGS. 14D and 15D, the upper surfaces of the buffer layer 126, the channel layer 124 and the charge-trapping layer 122 are exposed and kept substantially from being damaged during the etch. In some embodiments, referring to FIG. 15D, the thicknesses of the channel layer 124 and the charge-trapping layer 122 are kept substantially the same during the etching operation. In some embodiments, a thickness of the filling layer 146, e.g., the top portion of the filling layer 146, is etched during the etching operation of the liner 138.

In embodiments where the etching operation is performed by a wet etch, the liner 138 is removed by a time-mode etch operation, during which the liner 138 is completely removed. Meanwhile, only a negligible portion of the channel layer 124 or the charge-trapping layer 122 is consumed at their upper surfaces or the upper portions of their sidewalls. As such, the performance of the memory cells will not be adversely impacted due to the etching of the trenches 234R and the removal of the liner 138. In an embodiment, the liner 138 is deposited to a sufficiently low thickness such that the etching time can be relatively short with a precise control of the etching thickness such that the consumed portions of the channel layer 124 and the charge-trapping layer 122 can be well managed. In some embodiments, the liner 138 has a thickness in a range between about 0.5 nm and about 10 nm, between about 1 nm and about 5 nm, or between about 3 nm and about 5 nm.

In some embodiments, referring to FIG. 13A to FIG. 13D, the thickness of the filling layers 142 after planarization, measured between an upper surface of the filling layers 142 and a bottom surface of the filling layers 142 that is within the trench 104R and faces the surface 102f, is substantially the thickness of the interconnect structure 104 and in a range between about 100 nm and about 1000 µm. In some embodiments, a thickness ratio between the filling layers 142 and the liner 138 is between about 10 and about 100. In existing etching approaches in the absence of the liner 138, the removal of the filling layers 142 requires a careful selection of etchant chemistry that would provide sufficient etching selectivity between the filing layers 142 and components of the memory cell, e.g., the charge-trapping layer 122 and the channel layer 124. In addition, a sufficient long etching time, e.g., a period greater than about 60 seconds, may be necessary to ensure complete removal of the filling layers 142 throughout the thickness of the interconnect structure 104. However, such a long etch time would inevitably consume the sidewalls and the upper surfaces of the charge-trapping layer 122 or the channel layer 124, thereby impacting the integrity of the transistor structure. In contrast, by help of the liner 138 serving as an etching mask for the etching operation for the filling layers 142, the filling layers 142 can be removed completely with a greater process window. The selection of etchant candidates for the filling layer 142 or the liner 138 becomes easier than the exiting approaches and the etching time control is less sensitive. In some embodiments, the etchant for removing the filling layers 142 includes chlorine-based and fluorine-based acids, such as $SF_6$, $CF_4$, $NF_3$, or the like. In some embodiments, the etchant for removing the liner 138 includes chlorine-based and fluorine-based acids, such as $CCl_4$, $SF_6$, $CF_4$, $NF_3$, or the like. In some embodiments, the etching time for removing the liner 138 is between about 10 seconds and about 15 seconds.

Figure 16A:
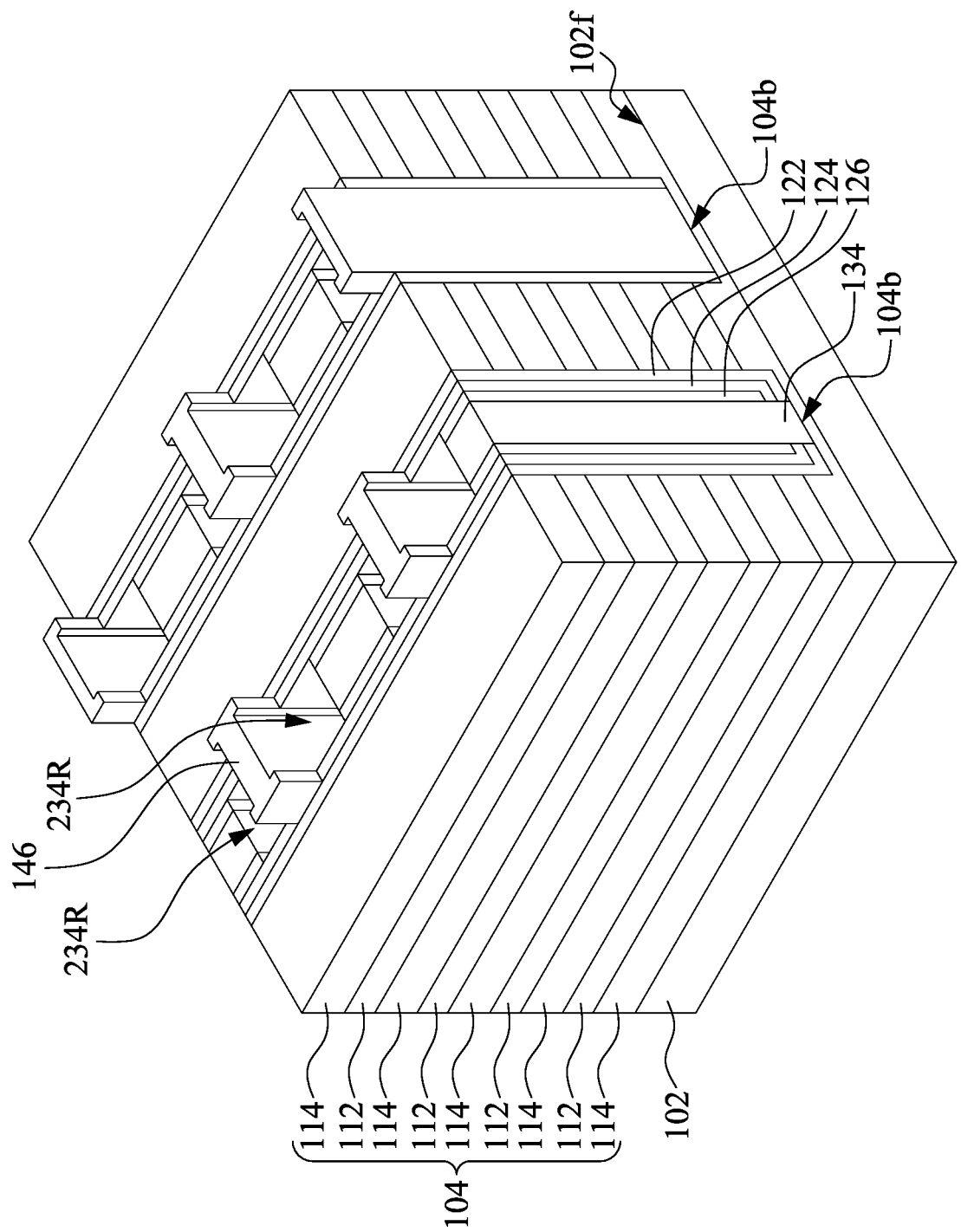
FIGS. 16A, 16B, 16C and 16D are a perspective view, a top view and two cross-sectional views, respectively, of an intermediate stage of a method of manufacturing a semiconductor structure, in accordance with some embodiments.
Figure 16B:
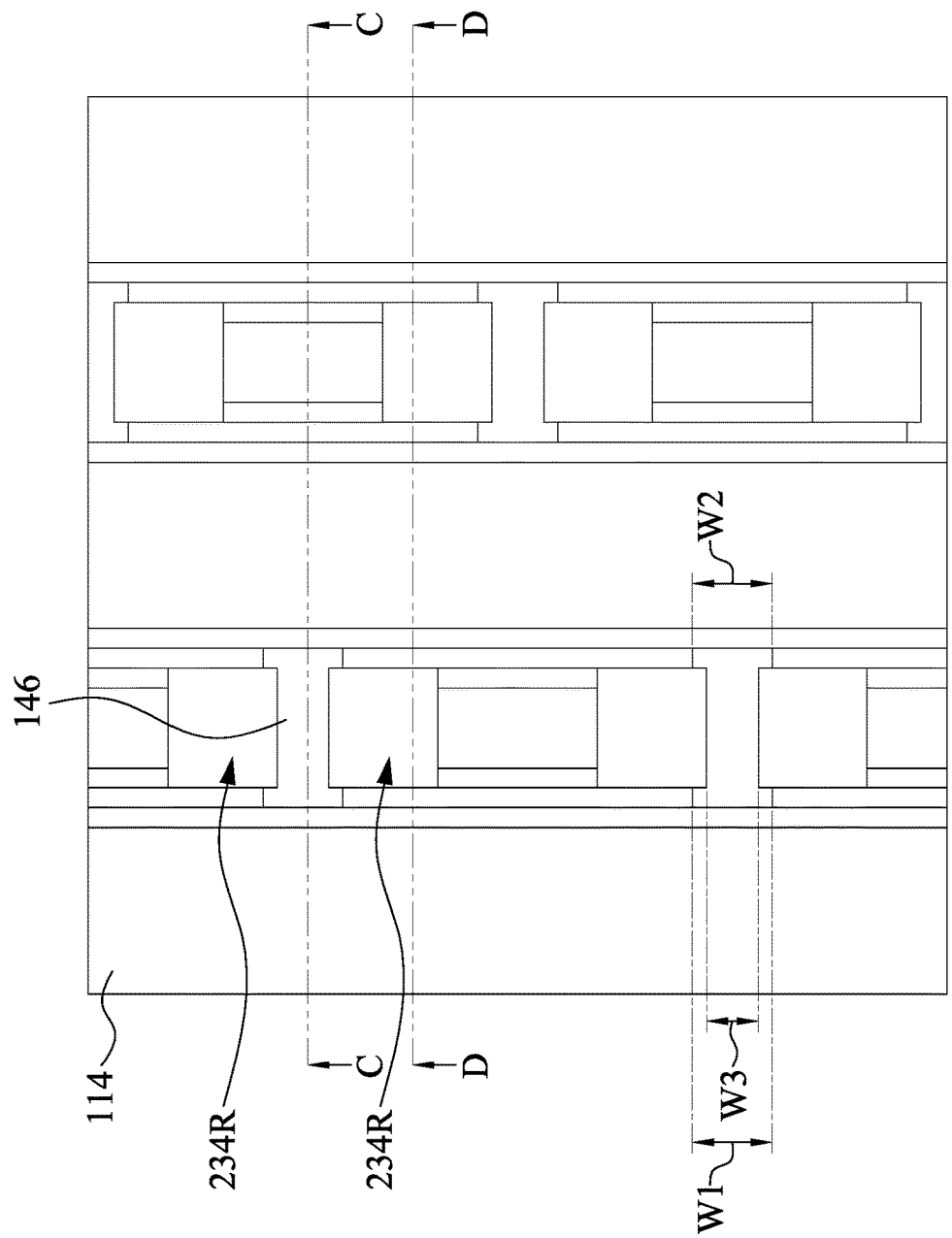
Figure 16C:
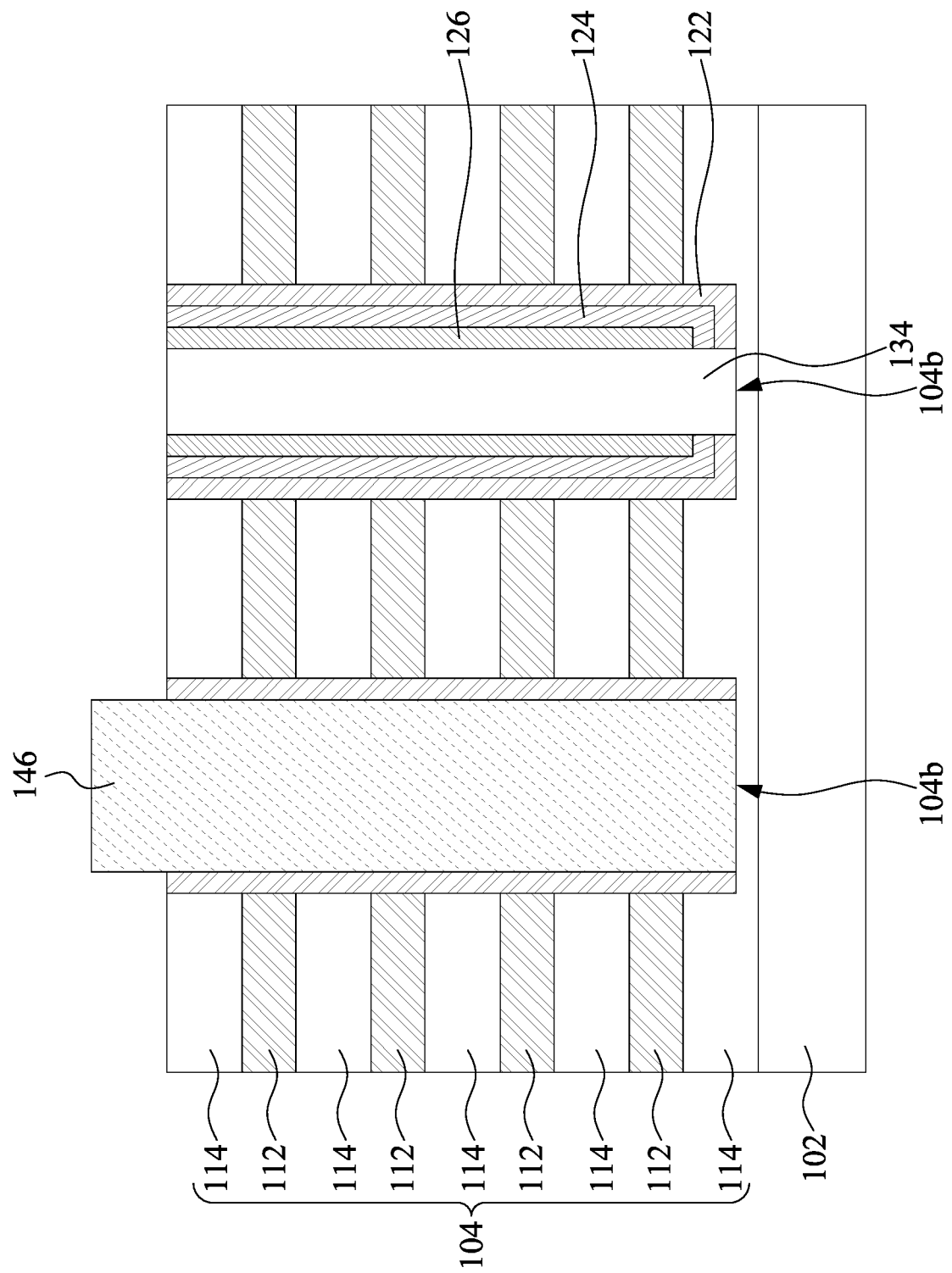
Figure 16D:
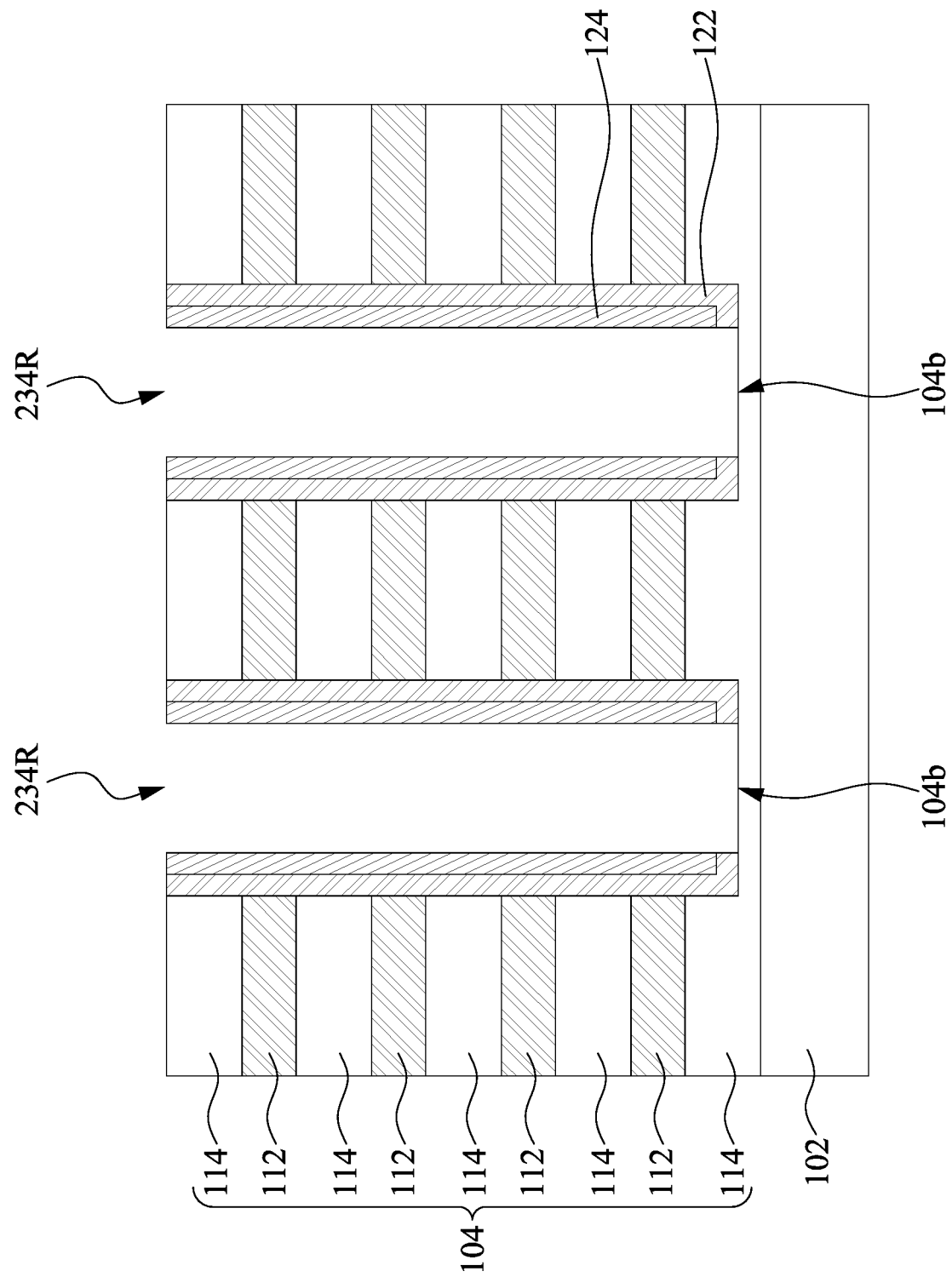

Referring to FIGS. 16A-16D, in some embodiments, following the operation shown in FIGS. 15A-15D, the etching operation of the filling layers 142 further removes a portion of the filling layers 146. The trenches 234 are expanded due to the over-etching during the removal of the liner 138. In some embodiments, the filling layers 146 and 142 include similar materials or the etching selectivity between the filling layers 146 and 142 is insufficient with respect to certain etchant chemistry. As a result, a central portion of each of the filling layers 146 is encroached, as shown in FIGS. 16A and 16B.

Referring to FIG. 16B, the filling layer 146 has a first with W1 on a first side or a second width W2 on a second side and a third width W3 at the central portion between the two sides, in which the width W3 is less than the width W1 or W2. In some embodiments, the filling layers 146 have a dog-bone shape from a top-view perspective. In some embodiments, each of the etched trenches 234R has a quadrilateral shape, such as a square or a rectangular shape from a top-view perspective. In some embodiments, the portions of the charge-trapping layer 122 or the channel layer 124 that are consumed by the etching operation are less than those of the filling layers 146 consumed by the same etching operation.

Figure 17A:
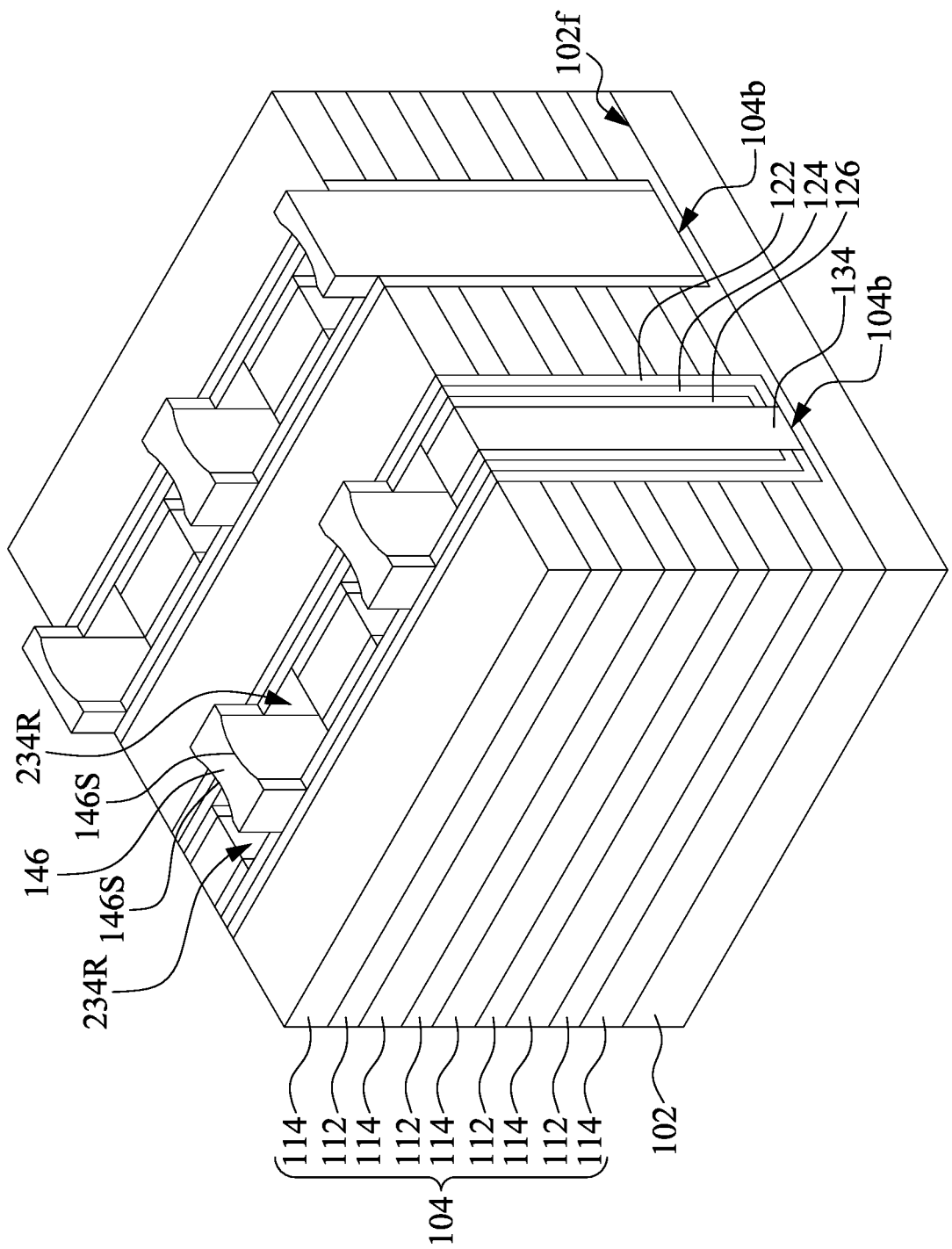
FIGS. 17A, 17B, 17C and 17D are a perspective view, a top view and two cross-sectional views, respectively, of an intermediate stage of a method of manufacturing a semiconductor structure, in accordance with some embodiments.
Figure 17B:
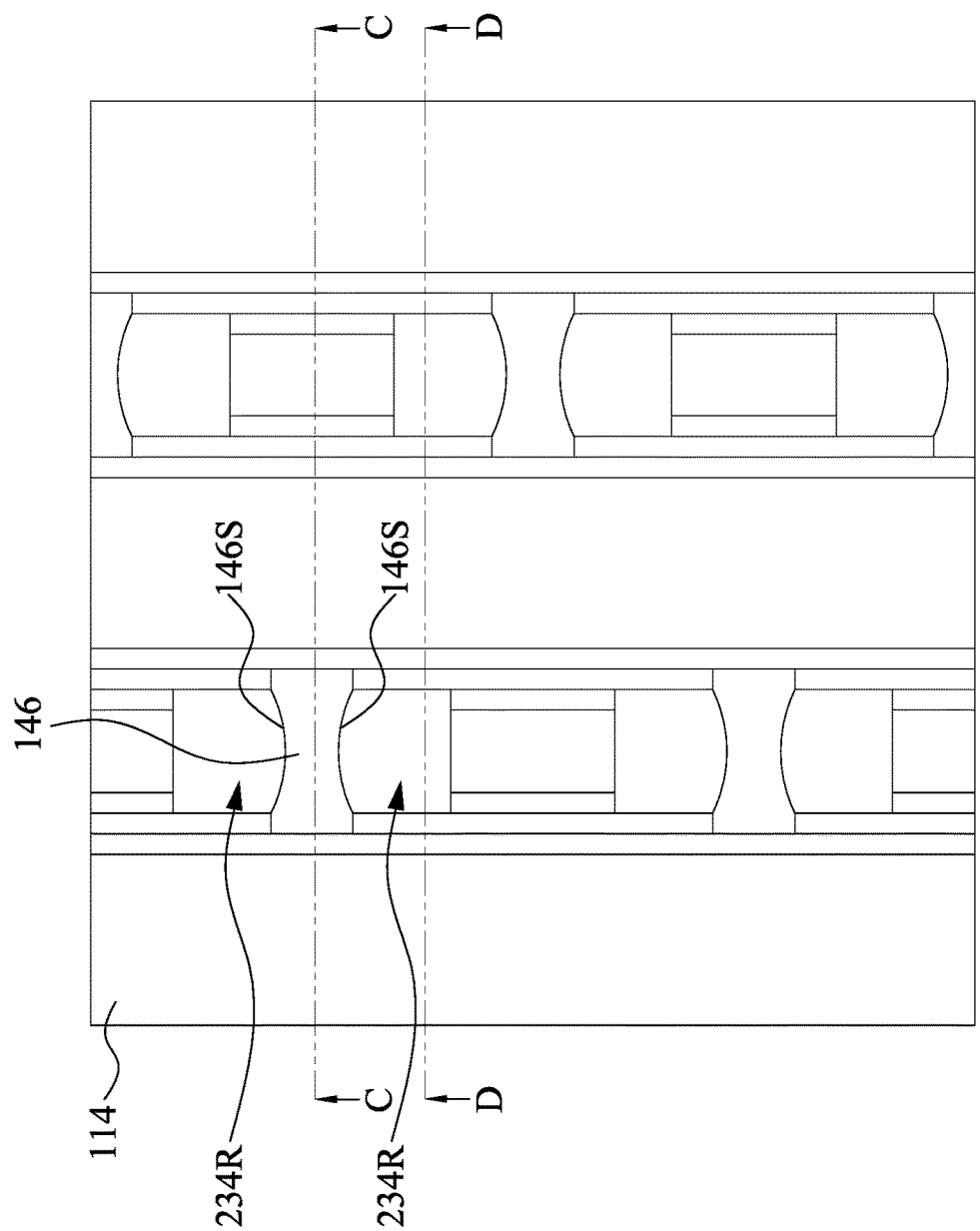
Figure 17C:
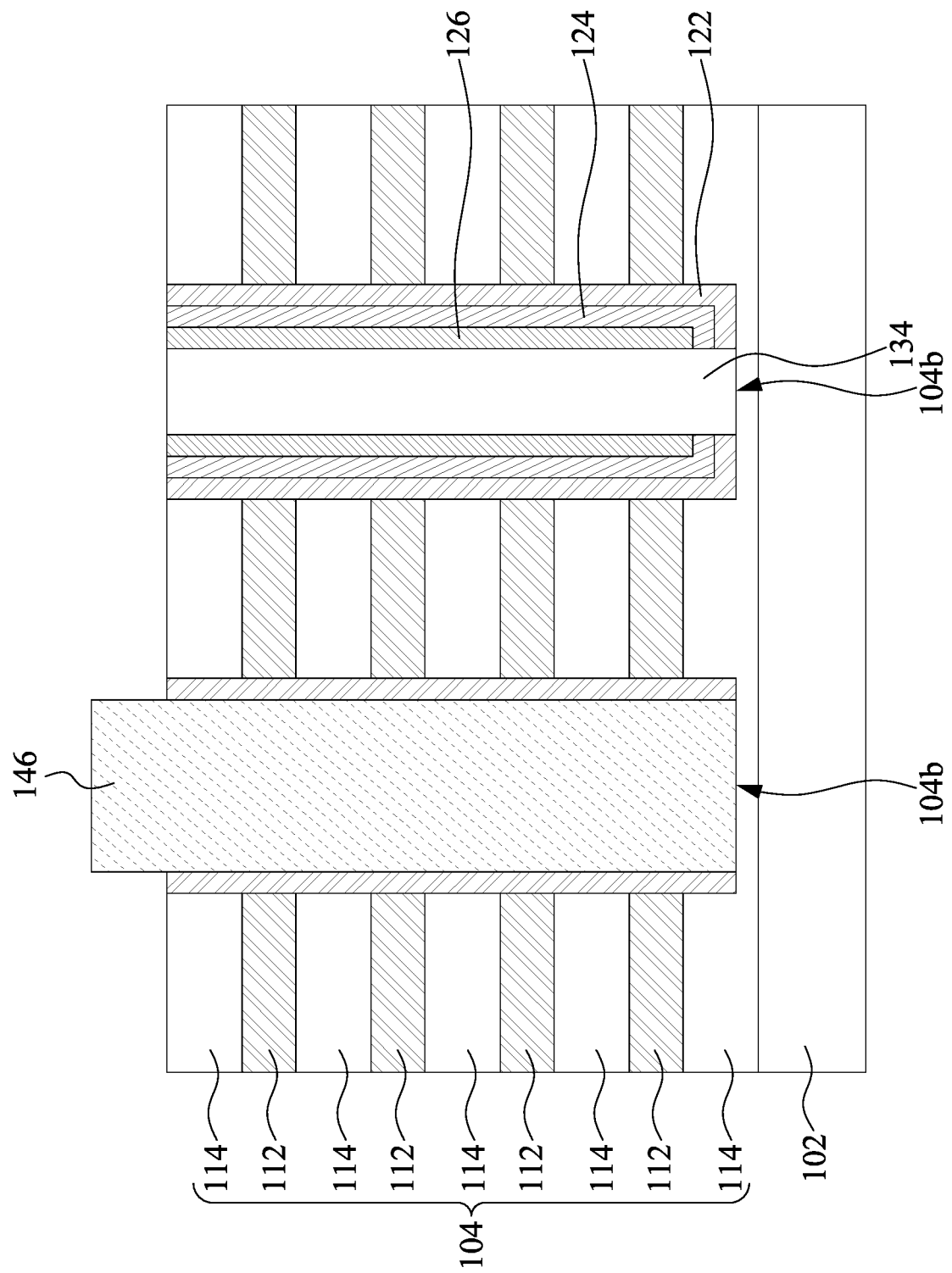
Figure 17D:
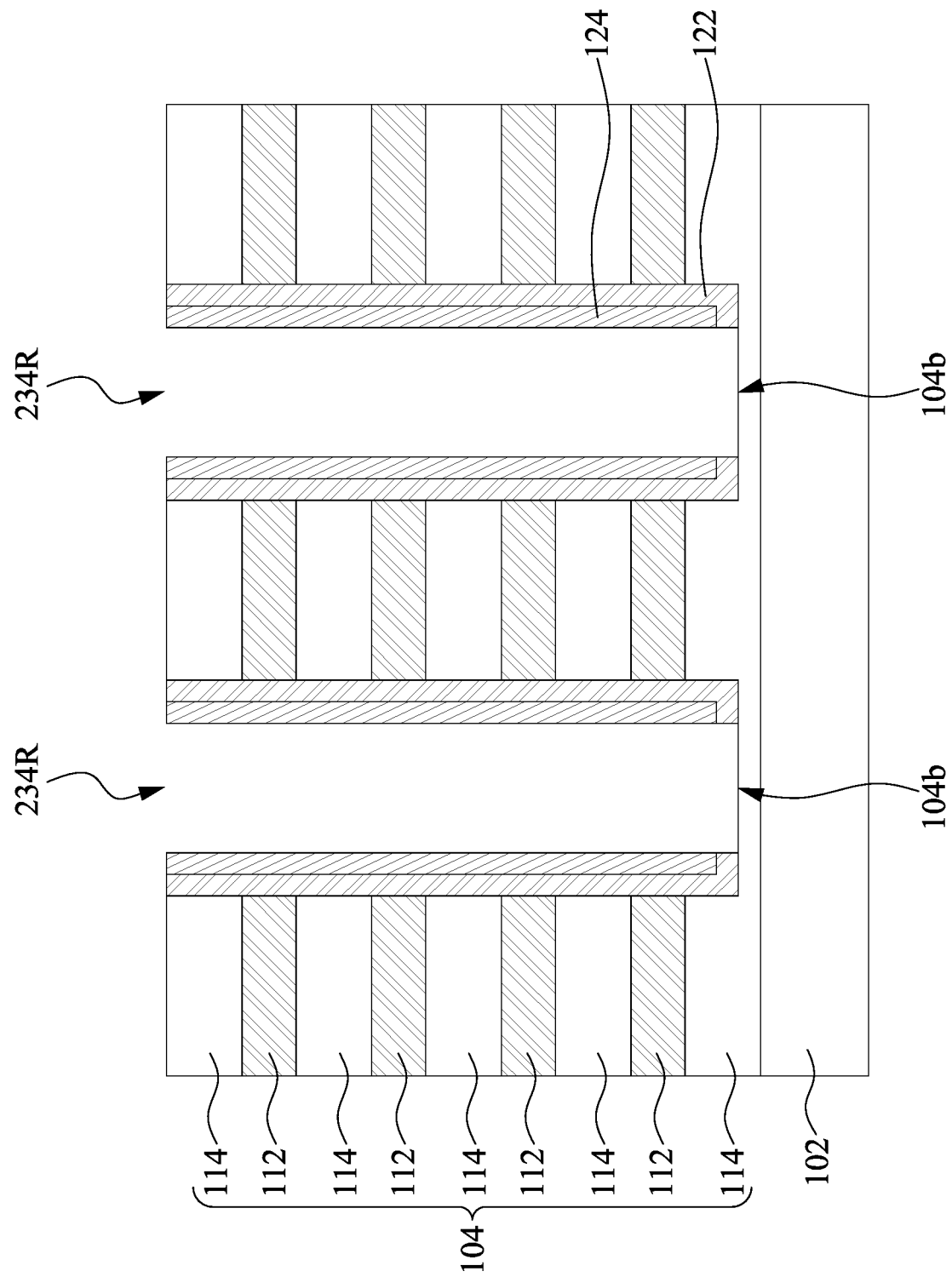

Referring to FIGS. 17A-17D, in alternative embodiments, following the operation shown in FIGS. 15A-15D, the etching operation of the filling layers 142 partially remove the filling layers 146 to form another shape of the sidewall 146S. Referring to FIGS. 16B and 17B, the etched filling layer 146 shown in FIG. 17B has a non-straight sidewall 146S facing the filling layer 134 from a top-view perspective. In some embodiments, the sidewall 146S has a curved shape. In some other embodiments, the sidewall 146S is formed of connected non-parallel segments or has a zig-zag surface.

Referring to FIGS. 18A-18D, source/drain contacts 152 and 154 are formed in the trenches 234R. The memory array in the semiconductor structure includes an array of memory cells 150, where each memory cell includes a pair of source/drain contacts 152 and 154 in contact with the channel layer 124 of the respective memory cell 150. In the present embodiment, each memory cell 150 has two charge-trapping layers 122 and two channel layers 124 on two sides of the filling layer 134. The two sets of charge-trapping layers and channel layers are controlled by the same source/drain contacts 152, 154 and the gate electrode 112. During a programing or erasing operation, charges are programmed to or erased from the charge-trapping layers 122 through proper biasing voltages of the gate electrode 112 and the source/drain contacts 152, 154. A read current is conducted to the channel layers 124 through the source/drain contacts 152, 154 during a read operation.

The source/drain contacts 152 and 154 may include conductive materials, such as doped silicon or metallic materials, such as gold, silver, copper, nickel, tungsten, aluminum, tin, an alloy thereof, or the like. The source/drain contacts 152 and 154 may be formed by a deposition operation, e.g., CVD, PVD, ALD, plating, or other suitable operations. In some embodiments, after the deposition of the conductive materials of the source/drain contacts 152 and 154, a planarization operation is performed to level the source/drain contacts 152 and 154 with the interconnect structure 104. The upper surface of the filling layer 146 is also leveled with the upper surfaces of the source/drain contacts 152 and 154. The planarization operation may be performed by mechanical grinding, CMP, chemical etch, plasma etch, or the like.

Referring to FIGS. 19A-19D, a metal via layer 162 is formed over the semiconductor structure. The metal via layer 162 can be seen as one component layer of the interconnect structure 104 and includes conductive vias 164 and 166 electrically connected to the respective source/drain contacts 152 and 154. Initially, the metal via layer 162 may be formed of a dielectric material, such as oxide, and can include USG, FSG, BPSG, TEOS, SOG, HDP oxide, PETEOS, or the like. In some embodiments, the metal via layer 162 has a same material as the insulating material 114. A patterning operation of performed on the metal via layer 162 to form openings 162R over the source/drain contacts 152, 154. The patterning operation may include lithography and etching operations.

Subsequently, as shown in FIGS. 20A-20D, a conductive material is filled into the openings 162R to form the conductive vias 164, 166. The material, configuration and method of forming for the conductive vias 164, 166 are similar to those of the source/drain contacts 152, 154, and their descriptions are not repeated for brevity.

Referring to FIGS. 21A-21D, a metal line layer 172 is formed over the metal via layer 162. The metal line layer 172 can be seen as another component layer of the interconnect structure 104 and includes conductive lines 174 electrically connected to the conductive vias 164, 166. Biasing signals are transmitted to the source/drain regions of the transistor of each memory cell 150 through the conduction paths formed by conductive lines 174, conductive vias 164, 166 and the source/drain contacts 152, 154.

Initially, the metal line layer 172 may be formed of a dielectric material, such as oxide, and can include USG, FSG, BPSG, TEOS, SOG, HDP oxide, PETEOS, or the like. In some embodiments, the metal line layer 172 has a same material as the insulating material 114. A patterning operation is performed on the metal line layer 172 to form trenches over the conductive vias 164, 166. The patterning operation may include lithography and etching operations. Subsequently, a conductive material is filled into the openings to form the conductive lines 174. The material, configuration and method of forming for the conductive lines 174 are similar to those of the source/drain contacts 152, 154, and their descriptions are not repeated for brevity.

Figure 22:
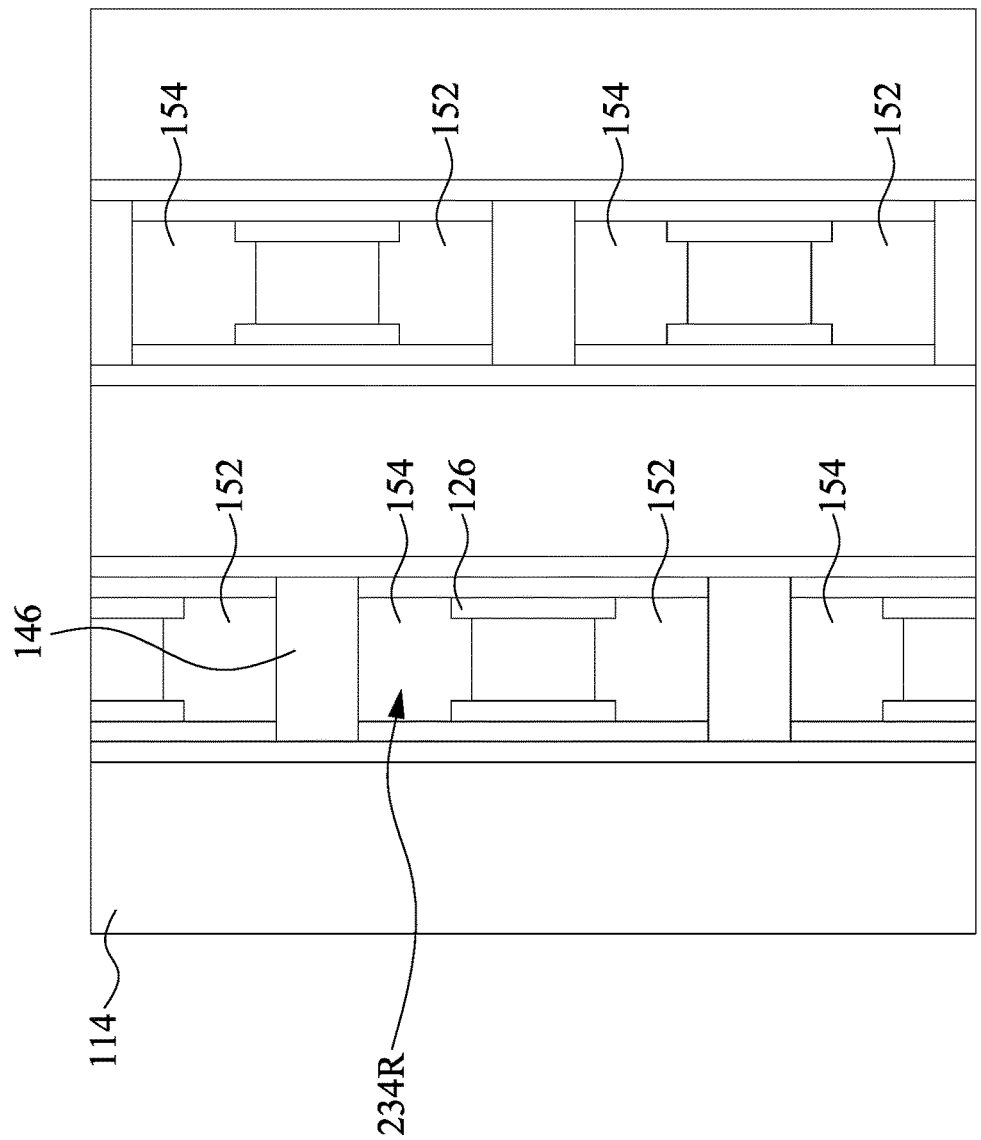
FIG. 22 is a schematic top view of a semiconductor structure, in accordance with some embodiments.

FIG. 22 is a schematic top view of a semiconductor structure, in accordance with some embodiments. The top view shown in FIG. 22 can be seen as a variant of that in FIG. 18B, in which the shapes of the source/drain contacts 152, 154 are formed in the trenches 234R. The trenches 234R formed in the embodiment of FIG. 22 is seen as a variant of the trenches 234R illustrated in FIGS. 15B, 16B, 17B. During the formation of the trenches 234R, portions of the filling layer 134 are etched such that a portion of the sidewalls of the buffer layer 126. Therefore, the etched trenches 234R have a stepped shape on one side and a protrusion toward the filling layer. In this connection, it should be understood that following the deposition operation of the source/drain contacts 152, 154 as discussed in FIGS. 18A-18D, the as-formed source/drain contacts 152, 154 may contact the sidewalls of the buffer layer 126.

Figure 23:
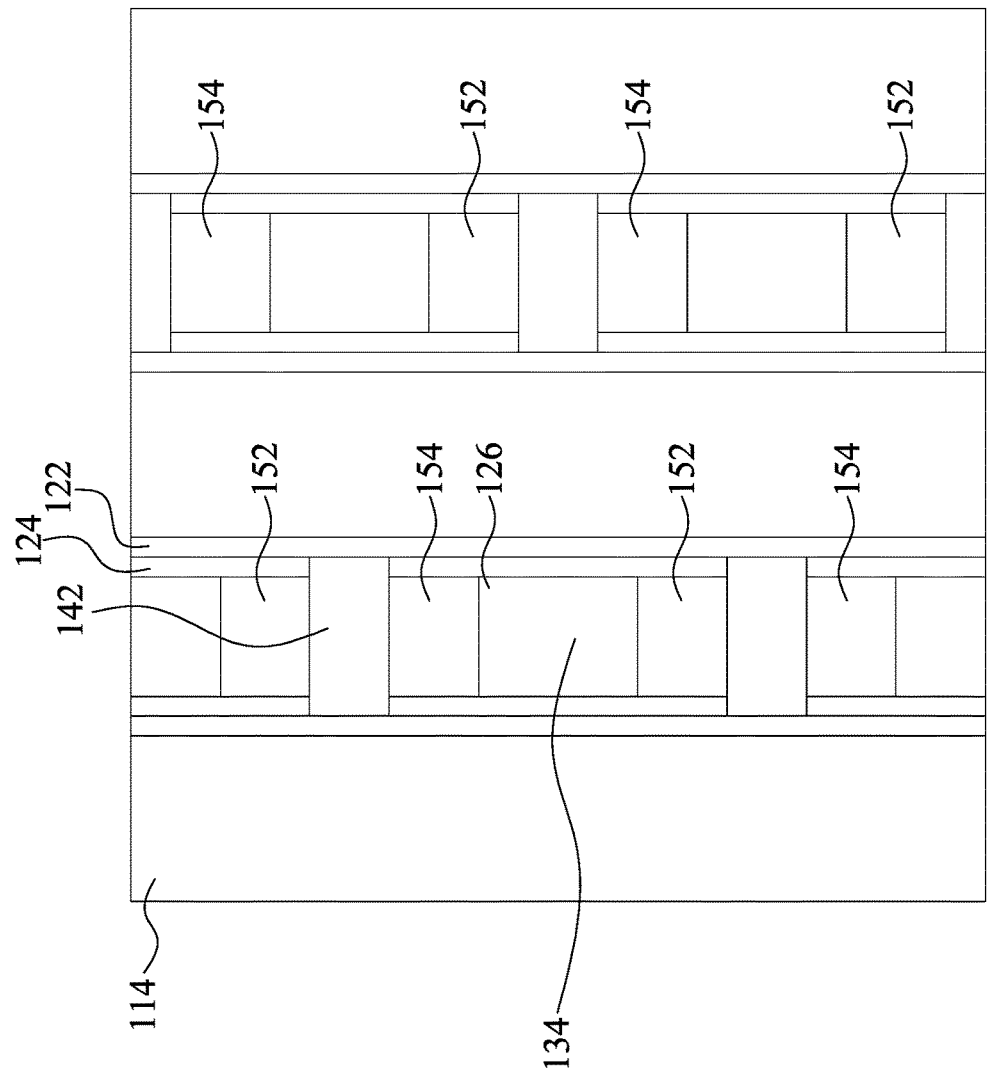
FIG. 23 is a schematic top view of a semiconductor structure, in accordance with some embodiments.

FIG. 23 is a schematic top view of a semiconductor structure, in accordance with some embodiments. The top view shown in FIG. 23 can be seen as a variant of that in FIG. 18B and FIG. 22, in which the buffer layer 126 is absent from the memory cell 150. In some embodiments, the buffer layer 126 is not involved during the formation of the stack of charge-trapping layer 122 and the channel layer 124 as shown in FIG. 4. As such, it shown be understood that across the figures of the method 100, the buffer layer 126 is absent from the semiconductor structure, and thus the filling layer 134 contacts the channel layer 124 (in contrast to FIG. 14B) and the trenches 104R or openings 132R may be formed to align the sidewalls of the channel layer 124 (referring to FIG. 5). The right-hand side filling layers 134 shown in FIG. 8C may thus be formed with their sidewalls defined by the channel layer 124 instead. Further, the sidewalls of the source/drain contacts 152/154 in FIG. 23 are defined by the channel layer 124 instead of the buffer layer 126.

According to an embodiment, a method includes forming a plurality of memory cells, which includes a plurality of first conductive lines over a substrate, charge-trapping layers coupled to the conductive lines, channel layers arranged adjacent to the charge-trapping layers, and a plurality of first filling regions arranged between the channel layers; etching the first filling regions to form first trenches; depositing a liner over upper surfaces of the charge-trapping layers and the channel layers and sidewalls of the first trenches; forming second filling regions in the first trenches; patterning the second filling regions to form second trenches; depositing a partition region in each of the second trenches; and removing the liner to expose the charge-trapping layers and the channel layers.

According to an embodiment, a method includes: forming a first trench in an interconnect structure; depositing a first dielectric layer over a sidewall and a bottom surface of the first trench; depositing a semiconductor layer in the first trench over the first dielectric layer; filling the first trench by a first filling layer; patterning the first filling layer to form a plurality of second trenches; depositing a liner on a sidewall and a bottom surface of each of the second trenches; depositing second filling layers in the respective second trenches; patterning the second filling layers to form a plurality of third trenches; depositing a second dielectric layer in each of the third trenches; and removing the second filling layers and the liner to expose the semiconductor layer and the first dielectric layer.

According to an embodiment, a semiconductor structure includes a plurality of memory cells, where each of the memory cells includes a plurality of first conductive lines over a substrate, two charge-trapping layers coupled to the first conductive lines, two channel layers between the charge-trapping layers, a filling layer between the channel layers, and two source/drain contacts on two sides of the filling layer. The semiconductor structure further includes a plurality of partition regions separating two adjacent memory cells. At least one of the partition regions has two sides facing the channel layers and a central portion between the two sides, wherein a first width, viewed from above, at the central portion less than a second width, viewed from above, of the sides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of memory cells, comprising:
        a plurality of first conductive lines over a substrate;
        charge-trapping layers coupled to the first conductive lines;
        channel layers arranged adjacent to the charge-trapping layers; and
        a plurality of first filling regions arranged between the channel layers;
    etching the first filling regions to form first trenches;
    depositing a liner over upper surfaces of the charge-trapping layers and the channel layers and sidewalls of the first trenches;
    forming second filling regions in the first trenches;
    patterning the second filling regions to form second trenches;
    depositing a partition region in each of the second trenches; and
    removing the liner to expose the charge-trapping layers and the channel layers.

2. The method according to claim 1, wherein the charge-trapping layers comprise an oxide-nitride-oxide (ONO) stack.

3. The method according to claim 1, wherein the channel layers comprise polysilicon.

4. The method according to claim 1, wherein the liner comprises a same material as the partition region.

5. The method according to claim 1, wherein removing the liner to expose the charge-trapping layers and the channel layers comprises etching the liner, wherein the etching of the liner stops on the charge-trapping layers and the channel layers.

6. The method according to claim 5, wherein the etching of the liner partially removes the partition region.

7. The method according to claim 6, wherein through the etching the partition region has a first width, viewed from above, at a central portion less than a second width, viewed from above, on a side of the partition region.

8. The method according to claim 1, wherein etching the first filling regions to form first trenches comprises exposing sidewalls of the channel layers.

9. The method according to claim 1, further comprising:
    removing the second filling regions to form third trenches; and
    depositing second conductive lines in the second trenches subsequent to removing the liner, the second conductive lines serving as source/drain contacts of the respective memory cells.

10. The method according to claim 1, during the forming of the memory cells, further comprising etching third trenches through the first conductive lines, wherein the charge-trapping layers are deposited over sidewalls and a bottom surface of the respective third trenches.

11. The method according to claim 10, wherein etching third trenches comprises removing a portion of bottom portions of the charge-trapping layers and the channel layers to expose the substrate.

12. The method according to claim 10, wherein etching third trenches comprises removing a thickness of the substrate.

13. The method according to claim 1, wherein the removing of the liner partially removes the partition region.

14. A method, comprising:
forming a first trench in an interconnect structure;
depositing a first dielectric layer over a sidewall and a bottom surface of the first trench;
depositing a semiconductor layer in the first trench over the first dielectric layer;
filling the first trench by a first filling layer;
patterning the first filling layer to form a plurality of second trenches;
depositing a liner on a sidewall and a bottom surface of each of the second trenches;
depositing second filling layers in the second trenches;
patterning the second filling layers to form a plurality of third trenches;
depositing a second dielectric layer in each of the third trenches; and
removing the second filling layers and the liner to expose the semiconductor layer and the first dielectric layer.

15. The method according to claim 14, wherein depositing second filling layers comprises depositing a filling material to cover the first dielectric layer and the semiconductor layer and fill the second trenches.

16. The method according to claim 15, wherein depositing the liner comprises causing the liner to cover the first dielectric layer and the semiconductor layer prior to depositing the filling material.

17. The method according to claim 14, wherein removing the second filling layers and the liner comprises removing horizontal portions of the second filling layers to expose the liner prior to removing the liner.

18. The method according to claim 14, wherein removing the liner comprises etching the second dielectric layer.

19. The method according to claim 14, wherein the first dielectric layer comprises an oxide-nitride-oxide (ONO) stack.

20. The method according to claim 14, wherein the semiconductor layer comprises polysilicon.

* * * * *